United States Patent
Reynolds et al.

(10) Patent No.: US 7,902,842 B2
(45) Date of Patent: *Mar. 8, 2011

(54) METHODS AND SYSTEMS FOR SWITCHED CHARGE TRANSFER CAPACITANCE MEASURING USING SHARED COMPONENTS

(75) Inventors: Joseph Kurth Reynolds, Mountain View, CA (US); Kirk Hargreaves, Mountain View, CA (US); David Ely, Cambridge (GB); Paul Routley, Cambridge (GB); Julian Haines, Dublin (IE)

(73) Assignee: Synaptics Incorporated, Santa Clara, CA (US)

( * ) Notice: Subject to any disclaimer, the term of this patent is extended or adjusted under 35 U.S.C. 154(b) by 440 days.

This patent is subject to a terminal disclaimer.

(21) Appl. No.: 11/925,537

(22) Filed: Oct. 26, 2007

(65) Prior Publication Data

US 2008/0116904 A1    May 22, 2008

Related U.S. Application Data

(63) Continuation-in-part of application No. 11/446,323, filed on Jun. 3, 2006, now Pat. No. 7,449,895, said application No. 11/925,537 and a continuation-in-part of application No. 11/446,324, filed on Jun. 3, 2006, now Pat. No. 7,301,350, , said application No. 11/925,537 and a continuation-in-part of application No. 11/833,828, filed on Aug. 3, 2007, now Pat. No. 7,417,441, is a continuation of application No. 11/445,856, filed on Jun. 3, 2006, now Pat. No. 7,262,609.

(60) Provisional application No. 60/687,012, filed on Jun. 3, 2005, provisional application No. 60/687,148, filed on Jun. 3, 2005, provisional application No. 60/687,167, filed on Jun. 3, 2005, provisional application No. 60/687,039, filed on Jun. 3, 2005, provisional application No. 60/687,037, filed on Jun. 3, 2005, provisional application No. 60/774,843, filed on Feb. 16, 2006, provisional application No. 60/687,012, filed on Jun. 3, 2005, provisional application No. 60/687,148, filed on Jun. 3, 2005, provisional application No. 60/687,167, filed on Jun. 3, 2005, provisional application No. 60/687,039, filed on Jun. 3, 2005, provisional application No. 60/687,037, filed on Jun. 3, 2005, provisional application No. 60/774,843, filed on Feb. 16, 2006, provisional application No. 60/784,544, filed on Mar. 21, 2006, provisional application No. 60/687,012, filed on Jun. 3, 2005, provisional application No. 60/687,148, filed on Jun. 3, 2005, provisional application No. 60/687,167, filed on Jun. 3, 2005, provisional application No. 60/687,039, filed on Jun. 3, 2005, provisional application No. 60/687,037, filed on Jun. 3, 2005, provisional application No. 60/774,843, filed on Feb. 16, 2006.

(51) Int. Cl.
*G01R 27/26* (2006.01)

(52) U.S. Cl. .................. 324/678; 324/686; 324/688

(58) Field of Classification Search .................. 324/678, 324/686, 688
See application file for complete search history.

(56) References Cited

U.S. PATENT DOCUMENTS

| | | | |
|---|---|---|---|
| 3,898,425 | A | 8/1975 | Crandell et al. |
| 4,459,541 | A | 7/1984 | Fielden et al. |
| 5,012,124 | A | 4/1991 | Hollaway |
| 5,305,017 | A | 4/1994 | Gerpheide |
| 5,451,940 | A | 9/1995 | Schneider et al. |
| 5,543,591 | A | 8/1996 | Gillespie et al. |
| 5,659,254 | A | 8/1997 | Matsumoto et al. |
| 5,730,165 | A | 3/1998 | Philipp |
| 5,973,417 | A | 10/1999 | Goetz et al. |
| 6,323,846 | B1 | 11/2001 | Westerman et al. |
| 6,452,514 | B1 | 9/2002 | Philipp |
| 6,466,036 | B1 | 10/2002 | Philipp |
| 6,535,200 | B2 * | 3/2003 | Philipp .................. 345/168 |
| 6,536,200 | B1 | 3/2003 | Schwartz |

| | | | |
|---|---|---|---|
| 6,593,755 | B1 | 7/2003 | Rosengren |
| 7,262,609 | B2 * | 8/2007 | Reynolds .................... 324/678 |
| 7,288,946 | B2 * | 10/2007 | Hargreaves et al. .......... 324/678 |
| 7,301,350 | B2 * | 11/2007 | Hargreaves et al. .......... 324/678 |
| 7,323,885 | B2 * | 1/2008 | Gutendorf .................... 324/663 |
| 7,417,441 | B2 * | 8/2008 | Reynolds .................... 324/678 |
| 7,423,437 | B2 * | 9/2008 | Hargreaves et al. .......... 324/678 |
| 7,449,895 | B2 * | 11/2008 | Ely et al. .................... 324/678 |
| 7,453,270 | B2 * | 11/2008 | Hargreaves et al. .......... 324/686 |
| 7,521,941 | B2 * | 4/2009 | Ely et al. .................... 324/678 |
| 2003/0090277 | A1 | 5/2003 | Lechner et al. |
| 2004/0104826 | A1 | 6/2004 | Philipp |
| 2005/0068712 | A1 | 3/2005 | Schulz et al. |
| 2005/0099188 | A1 | 5/2005 | Baxter |
| 2008/0061800 | A1 * | 3/2008 | Reynolds et al. ............. 324/678 |
| 2009/0206852 | A1 * | 8/2009 | Reynolds .................... 324/688 |

FOREIGN PATENT DOCUMENTS

| | | |
|---|---|---|
| DE | 3413849 | 8/1985 |
| EP | 1521090 | 5/2005 |
| EP | 1593988 | 11/2005 |
| FR | 2829317 | 3/2003 |
| JP | 3237594 | 10/1991 |
| WO | 2004059343 A1 | 7/2004 |
| WO | 2004066498 A1 | 8/2004 |
| WO | 2005031375 | 4/2005 |

OTHER PUBLICATIONS

Touch Sensor IC(B6TS). Omron Corporation [retrieved on Aug. 14, 2006]. Retrieved from Internet: <URL:www.omron.co.jp/ecb/products/touch/pdf/en-keisoku.pdf>.

Phillip, Hal; Fingering a Problem; New Electronics; Jan. 24, 2006; pp. 51-52; Retrieved from Internet: <URL:www.newelectronics.co.uk/articles/5676/fingering-a-problem.pdf>.

Cichocki, Andrzej et al.; A Switched Capacitor Interface for Capcaitive Sensors Based on Relaxation Oscillators; IEEE; Oct. 1990; pp. 797-799; vol. 39 No. 5.

Huang, S.M. et al.; Electronic Transducers for Industrial Measurement of Low Value Capacitances; J. Phys. E.: Sci. Instrum. 21; 1988; pp. 242-250.

Phillip, H.; Charge Transfer Sensing: Spread Spectrum Sensor Technology Blazes New Applications; Retrieved from Internet: <URL:www.qprox.com/background/white_paper.php, 1997.

Toth, F.; Design Method. for Low-Cost, High-Perf. Cap. Sensors; Delft Univ. of Tech.;1997; Retrieved from Internet: <URL: www.exalondelff.nl/download/CapacitiveSensors.PDF>.

Yamada, M. et al.; A Switched-Capacitor Interface for Capacitive Pressure Sensors; IEEE; Feb. 1992; pp. 81-86; vol. 31, No. 1.

Johns, D.A.; Analog Integrated Circuit Design; 1997; pp. 542, 543; John Wiley & Sons.

Banks; Low Cost, Low Speed A/D Conversion for Embedded Systems; Byte Craft Limited (retrieved on Jul. 25, 2006); Retrieved from Internet: <URL: www.bytecraft.com/addaconv.html>.

Cao, Y. et al.; High-Accuracy Circuits for On-Chip Capacitance Ratio Testing or Sensor Readout; IEEE Transactions; Sep. 1994; pp. 637-639; vol. 41, No. 9.

Josefsson, O.; Ask the Applications Engineer: Using Sigma-Delta Converters—Part 1; Analog Dialogue 30th Anniversary Reader Bonus; 1997; pp. 29-33.

Norsworthy, S.; Effective Dithering of Sigma-Delta Modulators; AT&T Bell Laboratories; IEEE; 1992; pp. 1304-1307.

Martin, K.; A Voltage-Controlled Switch Capacitor Relaxation Oscillator; IEEE Journ. of Solid-State Circuits; Aug. 1981; pp. 412-414; vol. SC-16, No. 4.

Seguine, D.; Capacitive Key Scan; Cypress MicroSystems; Oct. 2004; version 4.1.

Seguine, D.; Capacitive Switch Scan; Cypress MicroSystems; Apr. 2005; version 4.2.

Quantum Research Group, "Secrets of a Successful QTouch™ Design", Quantum Research Application Note AN-KD02, Rev. 1.03, Oct. 2005, pp. 1-11.

Kremin, Victor et al., "Capacitance Sensing—Waterproof Capacitance Sensing—AN2398", Cypress Perform, Document No. 001-14501 Rev., Dec. 8, 2006, pp. 1-11.

* cited by examiner

*Primary Examiner* — Jeff Natalini

(74) *Attorney, Agent, or Firm* — Ingrassia Fisher & Lorenz, P.C.

(57) ABSTRACT

Methods, systems and devices are described for detecting a measurable capacitance using charge transfer techniques that can be implemented with many standard microcontrollers, and can share components to reduce device complexity and improve performance. In the various implementations of this embodiment, the passive network used to accumulate charge can be shared between multiple measurable capacitances. Likewise, in various implementations a voltage conditioning circuit configured to provide a variable reference voltage can be shared between multiple measurable capacitances. Finally, in various implementations a guarding electrode configured to guard the measurable capacitances can be shared between multiple measurable capacitances. In each of these cases, sharing components can reduce device complexity and improve performance.

25 Claims, 26 Drawing Sheets

| STATE | I/O 1 | I/O 2 | I/O 3 | DESCRIPTION |
|---|---|---|---|---|
| 0 | Z | 0 | 0 | APPLY VOLTAGE TO $C_X$ |
| 1 | 1 | 1 | 1 | CHARGE $C_X$, DISCHARGE $C_D$ |
| 2 | 1 | Z | 1 | SHARE CHARGE ON $C_X$ |
| 3 | Z | Z | 1 | INTERMEDIATE, HIGH IMPEDANCE, TRAP CHARGE ON $C_D$ |
| 4A | 0 | Z | 0 | DELTA, IF DATA=1 CHANGE CHARGE (4A), ELSE DO NOT CHANGE CHARGE (4B) |
| 4B | 1 | Z | 0 | |
| 5 | Z | Z | 0 | TRAP CHARGE ON $C_I$ |
| 6 | Z | Z(READ) | 0 | COMPARE $C_I$ |

FIG. 11

| STATE | $I_1$ | $I_2$ | $I_3$ | $X_1$ | $X_2$ | D | $S_{1H}$ | $S_{1L}$ | $S_{2H}$ | $S_{2L}$ | 1898 | 1899 | DESCRIPTION |
|---|---|---|---|---|---|---|---|---|---|---|---|---|---|
| 1 | 0 | 0 | 0 | Z | Z | 1 | Z | Z | Z | Z | Z | Z | INTERMEDIATE (HIGH Z) |
| 2 | 0 | 0 | 0 | Z | Z | 1 | 1 | 0 | 1 | 0 | $V_{dd}/2$ | $V_{dd}/2$ | SET VOLTAGE AT $C_{l1}$ and $C_{l2}$ TO $V_G$ |
| 3 | 1 | 0 | 0 | Z | Z | 1 | 1 | 0 | 1 | 0 | $V_{dd}/2$ | $V_{dd}/2$ | SHARE TRANS CHARGE |
| 4 | 1 | 0 | 0 | Z | Z | 1 | $F_{1H}(V_{Cl1})$ | $F_{1L}(V_{Cl1})$ | $F_{2H}(V_{Cl2})$ | $F_{2L}(V_{Cl2})$ | $V_{dd}/2$ or Z | $V_{dd}/2$ or Z | SELECTIVE INTERMEDIATE STATE |
| 5 | 1 | 0 | 0 | Z | Z | 0 | $F_{1H}(V_{Cl1})$ | $F_{1L}(V_{Cl1})$ | $F_{2H}(V_{Cl2})$ | $F_{2L}(V_{Cl2})$ | $V_{dd}/2$ or Z | $V_{dd}/2$ or Z | SELECTIVE DELTA CHARGE |
| 6 | 1 | 0 | 0 | Z | Z | 0 | Z | Z | Z | Z | Z | Z | INTERMEDIATE HIGH Z |
| 7 | 1 | 0 | 0 | 1 | 1 | 0 | Z | Z | Z | Z | Z | Z | SET RECEIVING ELECTRODE HIGH |
| 8 | 0 | 0 | 0 | 1 | 1 | 1 | Z | Z | Z | Z | Z | Z | CHARGE |
| 9 | 0 | 0 | 0 | 1 | 1 | 1 | Z(Read $V_{Cl1}$) | Z | Z(Read $V_{Cl2}$) | Z | Z | Z | MEASURE VOLTAGE ON $V_{Cl1}$ AND $V_{Cl2}$ |

FIG. 18C

METHODS AND SYSTEMS FOR SWITCHED CHARGE TRANSFER CAPACITANCE MEASURING USING SHARED COMPONENTS

PRIORITY DATA

This application is also a continuation-in-part application of U.S. patent application Ser. No. 11/446,323, which was filed on Jun. 3, 2006, now U.S. Pat. No. 7,449,895 which claims priority to U.S. Provisional Patent Application Ser. Nos. 60/687,012; 60/687,148; 60/687,167; 60/687,039; and 60/687,037, which were filed on Jun. 3, 2005 and Ser. No. 60/774,843 which was filed on Feb. 16, 2006, and are incorporated herein by reference.

This application is also a continuation-in-part application of U.S. patent application Ser. No. 11/446,324, which was filed on Jun. 3, 2006 now U.S. Pat. No. 7,301,350, which claims priority to U.S. Provisional Patent Application Ser. Nos. 60/687,012; 60/687,148; 60/687,167; 60/687,039; and 60/687,037, which were filed on Jun. 3, 2005 and Ser. No. 60/774,843 which was filed on Feb. 16, 2006, and Ser. No. 60/784,544 which was filed on Mar. 21, 2006, and are incorporated herein by reference.

This application is a continuation-in-part application of U.S. patent application Ser. No. 11/833,828, filed on Aug. 3, 2007 now U.S. Pat. No. 7,417,441 which is a continuation application of U.S. patent application Ser. No. 11/445,856, which was filed on Jun. 3, 2006, and issued on Aug. 28, 2007, as U.S. Pat. No. 7,262,609, which claims priority to U.S. Provisional Patent Application Ser. Nos. 60/687,012; 60/687, 148; 60/687,167; 60/687,039; and 60/687,037, which were filed on Jun. 3, 2005 and Ser. No. 60/774,843 which was filed on Feb. 16, 2006, and are incorporated herein by reference.

TECHNICAL FIELD

The present invention generally relates to capacitance sensing, and more particularly relates to devices, systems and methods capable of detecting a measurable capacitances using shared components.

BACKGROUND

Proximity sensor devices (also commonly called touch pads or touch sensor devices) are widely used in a variety of electronic systems. A proximity sensor device typically includes a sensing region, often demarked by a surface, to determine the presence, location and/or motion of one or more fingers, styli, and/or other objects. The proximity sensor device, together with finger(s) and/or other object(s), can be used to provide an input to the electronic system. For example, proximity sensor devices are used as input devices for larger computing systems, such as those found integral within notebook computers or peripheral to desktop computers. Proximity sensor devices are also used in smaller systems, including: handheld systems such as personal digital assistants (PDAs), remote controls, communication systems such as wireless telephones and text messaging systems. Increasingly, proximity sensor devices are used in media systems, such as CD, DVD, MP3, video or other media recorders or players.

Many electronic devices include a user interface, or UI, and an input device for interacting with the UI (e.g., interface navigation). A typical UI includes a display for showing graphical and/or textual elements or other user feedback to input. The display may range from a vector driven CRT, or a scanned LCD, to individually controlled or backlit icons, and a variety of methods of providing visual user feedback. Other forms of feedback to input may also be used (e.g. audio and tactile) to provide modal information, selection acknowledgement, or action timing/ordering information. The increasing use of these types of UIs has led to a rising demand for proximity sensor devices as pointing devices. In these applications the proximity sensor device can function as a value adjustment device, cursor control device, selection device, scrolling device, graphics/character/handwriting input device, menu navigation device, gaming input device, button input device, keyboard and/or other input device.

Proximity sensor devices and capacitive sensors are commonly used as input devices for computers, personal digital assistants (PDAs), remote controls, media players, video game players, consumer electronics, cellular phones, payphones, point-of-sale terminals, automatic teller machines, kiosks and the like. Many proximity sensors use measurements of capacitance to detect object position or proximity (or motion or presence or any similar positional information). Capacitive sensing techniques are used in user input buttons, slide controls, scroll rings, scroll strips and other types of sensors. One other type of capacitance sensor used in such applications is the button-type sensor, which can be used to provide information about the existence or presence of an input. As discussed above, another type of capacitance sensor used in such applications is the touchpad-type sensor, which can be used to provide information about an input such as the position, motion, and/or similar information along one axis (1-D sensor), two axes (2-D sensor), or more axes. Both the button-type and touchpad-type sensors can also optionally be configured to provide additional information such as some indication of the force, duration, finger count, finger separation, or amount of capacitive coupling associated with the input. Imaging sensors with independent arrays of sensors may be used for multiple inputs for multi-finger position sensing, or for measuring relative motions. A variety of reporting, signaling, and methods of data reduction before transmission, as well as, polled or interrupt control methods may be used. A variety of fabrication and assembly methods may also be used including, flexible and rigid printed circuit boards, transparent conductors and substrates, as well as, methods of creating interconnects and vias. One example of a 2-D touchpad-type sensor that is based on capacitive sensing technologies is described in U.S. Pat. No. 5,880,411, which issued to Gillespie et al. on Mar. 9, 1999. Such sensors can be readily found, for example, in input devices of electronic systems including handheld and notebook-type computers.

A user generally operates a capacitive input device by placing or moving one or more fingers, styli, and/or objects, near a sensing region of one or more sensors located on or in the input device. This creates a capacitive effect upon a carrier signal applied to the sensing region that can be detected and correlated to positional information (such as the position(s) or proximity or motion or presences or similar information) of the stimulus/stimuli with respect to the sensing region. This positional information can in turn be used to select, move, scroll, or manipulate any combination of text, graphics, cursors and highlighters, and/or any other indicator on a display screen. Other visual, auditory, and tactile feedback methods can also be used for highlighting or display. The positional and/or temporal information can also be used to enable the user to interact with an interface, such as to control volume, to adjust brightness, or to achieve any other purpose.

Although capacitance sensors have been widely adopted for several years, sensor designers continue to look for ways to improve the sensors' functionality and effectiveness. In particular, engineers continually strive to improve the performance for the design and implementation of position sensors without increasing costs, pin count, electrode routing, component count, size, or complexity. Moreover, as such sensors become increasingly in demand in various types of electronic devices, a need for a highly-flexible yet low cost and easy to implement sensor design arises. In particular, a need exists for a sensor design scheme that is flexible enough for a variety of implementations and powerful enough to provide accurate capacitance sensing while remaining cost effective.

Accordingly, it is desirable to provide systems and methods for quickly, effectively and efficiently detecting a measurable capacitance. Moreover, it is desirable to create a design scheme that can be readily implemented using readily available components, such as standard ICs, microcontrollers, and discrete components. Other desirable features and characteristics will become apparent from the subsequent detailed description and the appended claims, taken in conjunction with the accompanying drawings and the foregoing technical field and background.

BRIEF SUMMARY

Methods, systems and devices are described for detecting a measurable capacitance using charge transfer techniques that can be implemented with many standard microcontrollers, and can share components to reduce device complexity and improve performance. According to a first embodiment, a charge transfer process is performed two or more times. The charge transfer process comprises applying a pre-determined voltage to the measurable capacitance, and then allowing the measurable capacitance to share charge with a passive network that includes at least one integrating capacitance statically coupled to a plurality of measurable capacitances and configured to accumulate charge received from the plurality of measurable capacitances. The value of the measurable capacitance can then be determined as a function of a representation of a charge on the filter capacitance and the number of times that the charge transfer process was performed. The number of times that the charge transfer process is executed can be pre-established or be based on the representation of the charge reaching some threshold. The representation of the charge on the integrating capacitance can be obtained by a measuring step that quantizes a representation of charge on the integrating capacitance. These steps can be repeated, and the results of the measuring step can be stored and/or filtered as appropriate. In the various implementations of this embodiment, the passive network used to accumulate charge can be shared between multiple measurable capacitances. Likewise, in various implementations a voltage conditioning circuit configured to provide a variable reference voltage can be shared between multiple measurable capacitances. Finally, in various implementations a guarding electrode configured to guard the measurable capacitances can be shared between multiple measurable capacitances. In each of these cases, sharing components can reduce device complexity and improve performance Such a detection scheme may be readily implemented using readily available components, and can be particularly useful in sensing the position of a finger, stylus or other object with respect to a capacitive sensor implementing button function(s), slider function(s), cursor control or user interface navigation function(s), or any other functions.

BRIEF DESCRIPTION OF THE DRAWINGS

Various aspects of the present invention will hereinafter be described in conjunction with the following drawing figures, wherein like numerals denote like elements.

FIG. 11 is a state diagram illustrating operation of a capacitive sensor in accordance with an embodiment of the invention;

FIG. 18C is a timing diagram of a capacitive sensor using sigma delta capacitive detection for transcapacitive measurement in accordance with an embodiment of the invention.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Methods, systems and devices are described for detecting a measurable capacitance using charge transfer techniques that can be implemented with many standard microcontrollers, and can share components to reduce device complexity and improve performance. The methods, systems and devices for detecting measurable capacitances can be utilized in a variety of different applications, including in proximity sensor devices.

Figure 1:
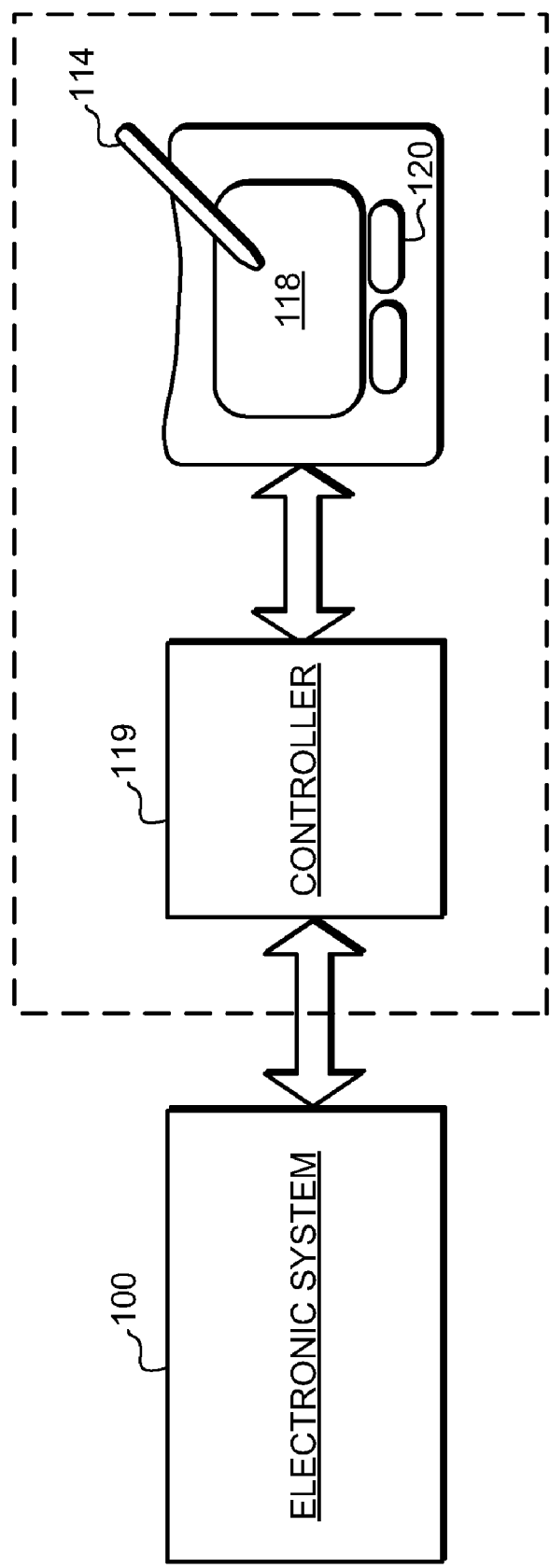
FIG. 1 is a schematic diagram of an exemplary proximity sensor device with an electronic system.

Turning now to the drawing figures, FIG. 1 is a block diagram of an exemplary electronic system 100 that is coupled to a proximity sensor device 116. Electronic system 100 is meant to represent any type of personal computer, portable computer, workstation, personal digital assistant, video game player, communication device (including wireless phones and messaging devices), media device, including recorders and players (including televisions, cable boxes, music players, and video players) or other device capable of accepting input from a user and of processing information. Accordingly, the various embodiments of system 100 may include any type of processor, memory or display. Additionally, the elements of system 100 may communicate via a bus, network or other wired or wireless interconnection. The proximity sensor device 116 can be connected to the system 100 through any type of interface or connection, including I2C, SPI, PS/2, Universal Serial Bus (USB), Bluetooth, RF, IRDA, or any other type of wired or wireless connection to list several non-limiting examples.

Proximity sensor device 116 includes a controller 119 and a sensing region 118. Proximity sensor device 116 is sensitive to the position of a stylus 114, finger and/or other input object within the sensing region 118. "Sensing region" 118 as used herein is intended to broadly encompass any space above, around, in and/or near the proximity sensor device 116 wherein the sensor of the touchpad is able to detect a position of the object. In a conventional embodiment, sensing region 118 extends from the surface of the sensor in one or more directions for a distance into space until signal-to-noise ratios prevent object detection. This distance may be on the order of less than a millimeter, millimeters, centimeters, or more, and may vary significantly with the type of position sensing technology used and the accuracy desired. Spatial and temporal filters may be adapted (e.g. different electrode patterns, or changed threshold) for different distances corresponding to proximity, and touch. Different results (e.g. presence, motion, or location) and effects (e.g. wake up from low power, or cursor motion) can result from changing user input, or from different sensor designs. Accordingly, the planarity, size, shape and exact locations of the particular sensing regions 116 will vary widely from embodiment to embodiment. In some designs portions of the sensing region may be configured to provide visual, aural, or tactile feedback to a user (e.g. through markings, texture, or shape), and may limit the motion of the input, or provide alignment features for it.

In operation, proximity sensor device 116 suitably detects a position of stylus 114, finger or other input object within sensing region 118, and using controller 119, provides electrical or electronic indicia of the position to the electronic system 100. The system 100 appropriately processes the indicia to accept inputs from the user, to move a cursor or other object on a display, or for any other purpose.

The proximity sensor device 116 uses measurements of capacitance to detect the presence of an object or objects. For example, by detecting changes in capacitance caused by the changes in the electric field due to the object. The proximity sensor device 116 detects the presence of the object and delivers positional information to the system 100. The positional information provided by the proximity sensor device 116 can be any suitable indicia of object presence. For example, the proximity sensor device 116 can be implemented to provide "zero-dimensional" 1-bit positional information, "one-dimensional" positional information (e.g. along a sensing region) as a scalar, "two-dimensional" or "three-dimensional" vector positional information (e.g. horizontal/vertical/depth axes, angular/radial axes, or any other combination of axes that span the two or three dimensions) as a combination of values, and the like. Furthermore, the term "positional information" as used herein is intended to broadly encompass absolute and relative position-type information, and also other types of spatial-domain information such as velocity, acceleration, and the like, including measurement of motion in one or more directions of one or more independent input objects. Various forms of positional information may also include time history components and/or a count or relative location of input objects, as in the case of gesture recognition and the like.

The controller 119, sometimes referred to as a proximity sensor processor or touch sensor controller, is coupled to the sensor and the electronic system 100. In general, the controller 119 receives electrical signals from the sensor (although it may also apply them), processes the electrical signals, and communicates with the electronic system. The controller 119 can perform a variety of processes on the signals received from the sensor to implement the proximity sensor device 116. For example, the controller 119 can select or connect individual sensor electrodes, detect presence/proximity, calculate and filter to estimate position or motion information, and report positional information when a threshold is reached, and/or interpret and wait for a valid touch/tap/stroke/character/button/gesture sequence before reporting it to the electronic system 100, or indicating it to the user.

In this specification, the term "controller" is defined to include one or more processing elements that are adapted to perform the recited operations. Thus, the controller 119 can comprise all or part of one or more integrated circuits, firmware code, and/or software code that receive or apply electrical signals from or to the sensor and communicate with the electronic system 100. In some embodiments, the elements that comprise the controller 119 would be located with or near the sensor. In other embodiments, some elements of the controller 119 would be with the sensor and other elements of the controller 119 would reside on or near the electronic system 100. In this embodiment minimal processing could be performed near the sensor, with the majority of the processing performed on the electronic system 100.

Furthermore, the controller 119 can be physically separate from the part of the electronic system that it communicates with, or the controller 119 can be implemented integrally with that part of the electronic system. For example, the controller 119 can reside at least partially on a processor performing other functions for the electronic system aside from implementing the proximity sensor device 116.

Again, as the term is used in this application, the term "electronic system" broadly refers to any type of device that communicates with proximity sensor device 116. The electronic system 100 could thus comprise any type of device or devices in which a touch sensor device can be implemented in or coupled to. The proximity sensor device could be implemented as part of the electronic system 100, or coupled to the electronic system using any suitable technique. As non-limiting examples the electronic system 100 could thus comprise any type of computing device, media player, communication device, or another input device (such as another touch sensor device or keypad). In some cases the electronic system 100 is itself a peripheral to a larger system. For example, the electronic system 100 could be a data input or output device, such as a remote control or display device, that communicates with a computer or media system (e.g., remote control for television) using a suitable wired or wireless technique. It should also be noted that the various elements (processor, memory, etc.) of the electronic system 100 could be implemented as part of an overall system, as part of the touch sensor device, or as a combination thereof. Additionally, the electronic system 100 could be a host or a slave to the proximity sensor device 116.

In the illustrated embodiment the proximity sensor device 116 is implemented with buttons 120. The buttons 120 can be implemented to provide additional input functionality to the proximity sensor device 116. For example, the buttons 120 can be used to facilitate selection of items using the proximity sensor device 116. Of course, this is just one example of how additional input functionality can be added to the proximity sensor device 116, and in other implementations the proximity sensor device 116 could include alternate or additional input devices, such as physical or virtual switches, or additional proximity sensing regions. The additional inputs 120 (e.g. tactile switches) may also be mounted below the surface of the input device 116 such their activation may occur while the input object 114 contacts a dielectric or approaches an electrode defining the sensing area 118. Conversely, the proximity sensor device 116 can be implemented with no additional input devices.

It should be noted that although the various embodiments described herein are referred to as proximity sensor devices, these terms as used herein are intended to encompass not only conventional proximity sensor devices, but also a broad range of equivalent devices that are capable of detecting the position of one or more fingers, pointers, styli and/or other objects. The response to proximity or touch may be different, and the response may also be modal or user configured (e.g. wake on proximity, indicate function on hover, operate on contact). Such devices may include, without limitation, touch screens, touch pads, touch tablets, biometric authentication devices, handwriting or character recognition devices, and the like.

Figure 2:
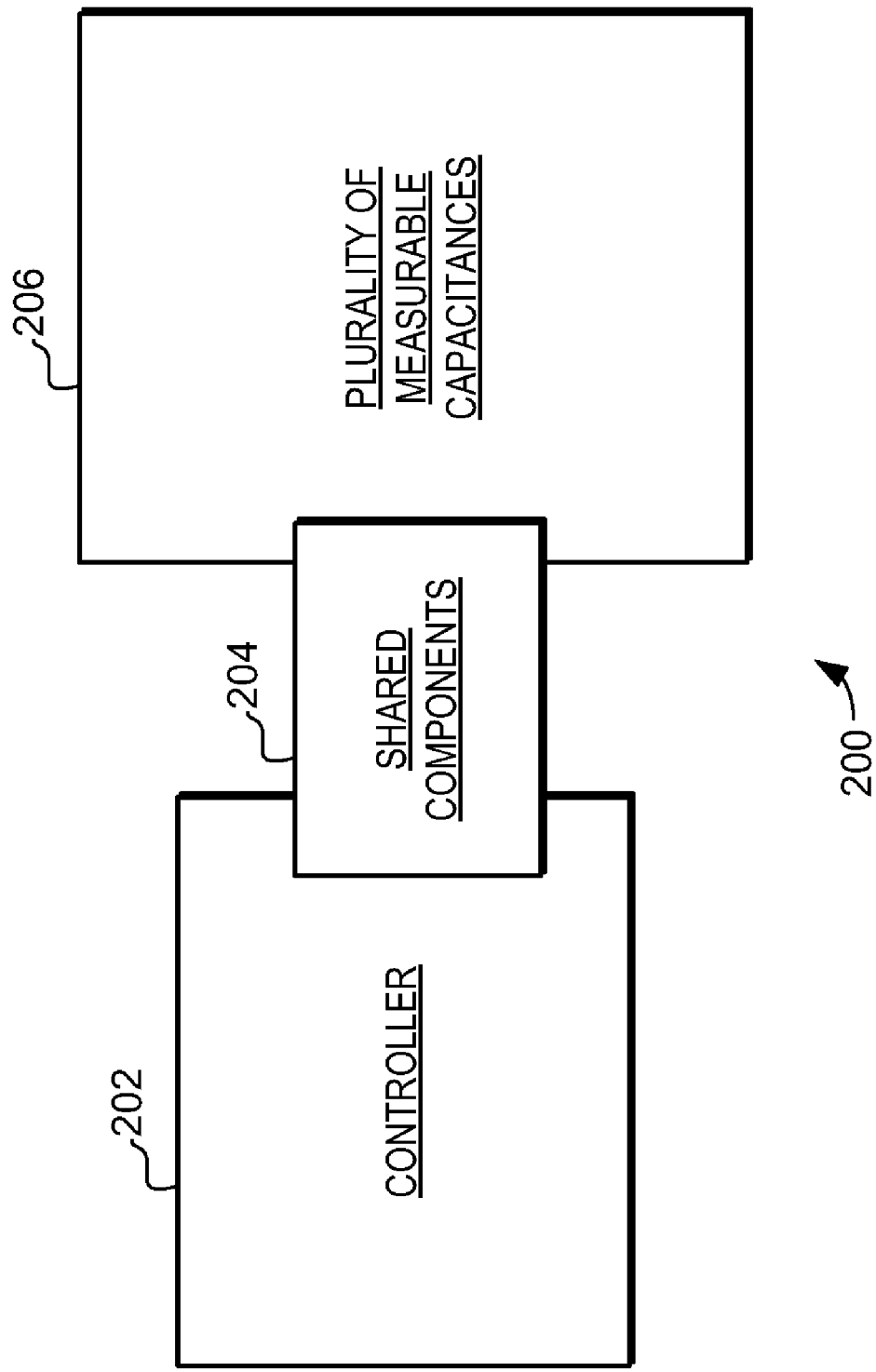
FIG. 2 is a schematic diagram of an exemplary proximity sensor device showing component sharing.

The various embodiments of the invention provide methods and devices for measuring measurable capacitances that can be utilized in proximity sensor devices. The methods and devices utilize charge transfer techniques that can be implemented with many standard microcontrollers, and can share components to reduce device complexity and improve performance. Turning now to FIG. 2, a block diagram of an exemplary capacitive measuring system 200 that can be utilized in a proximity sensor device is illustrated. The capacitive measuring system 200 includes a controller 202, shared components 204 and a plurality of measurable capacitances 206. According to a first embodiment, the controller 202 is adapted to perform a charge transfer process to measure each of the plurality of capacitances. The charge transfer process comprises repeatedly applying a pre-determined voltage to the measurable capacitance, and then allowing the measurable capacitance to share charge with a passive network that includes at least one integrating capacitance statically coupled to a plurality of measurable capacitances and configured to accumulate charge received from the plurality of measurable capacitances over repeated cycles. The value of the measurable capacitance can then be determined as a function of a representation of a charge on the filter capacitance and the number of times that the charge transfer process was performed.

According to a second embodiment, the controller 202 is adapted to repeatedly apply a voltage to each measurable capacitance in the plurality of measurable capacitances 206, and the measurable capacitance is allowed to share charge with a passive network such that the passive network accumulates charge on at least one integrating capacitance over repeated cycles. If the charge on the passive network is past a threshold value, then the charge on the passive network is changed by a quantized amount and the process is repeated. The results of the charge threshold detection are a quantized measurement of the accumulated charge, which can be filtered to yield a measure of the measurable capacitance. It should be noted that the plurality of measurable capacitances can include both absolute capacitances (e.g., capacitance measured from a sensing node to a local ground) and transcapacitances (e.g., capacitance measured between a driving node and a sensing node).

In the various implementations of these two embodiments, a variety of components in the capacitive measuring system 200 can be shared among the plurality of measurable capacitances 206. For example, the shared components 204 can include the passive network used to accumulate charge. Likewise, in various implementations the shared components 204 can include a voltage conditioning circuit configured to provide a variable reference voltage. Additionally, in various implementations the shared components 204 can include a guarding electrode configured to guard the measurable capacitances. In each of these cases, sharing of shared components 204 can reduce device complexity (e.g. size or component count) and improve performance (e.g. matching).

Figure 3A:
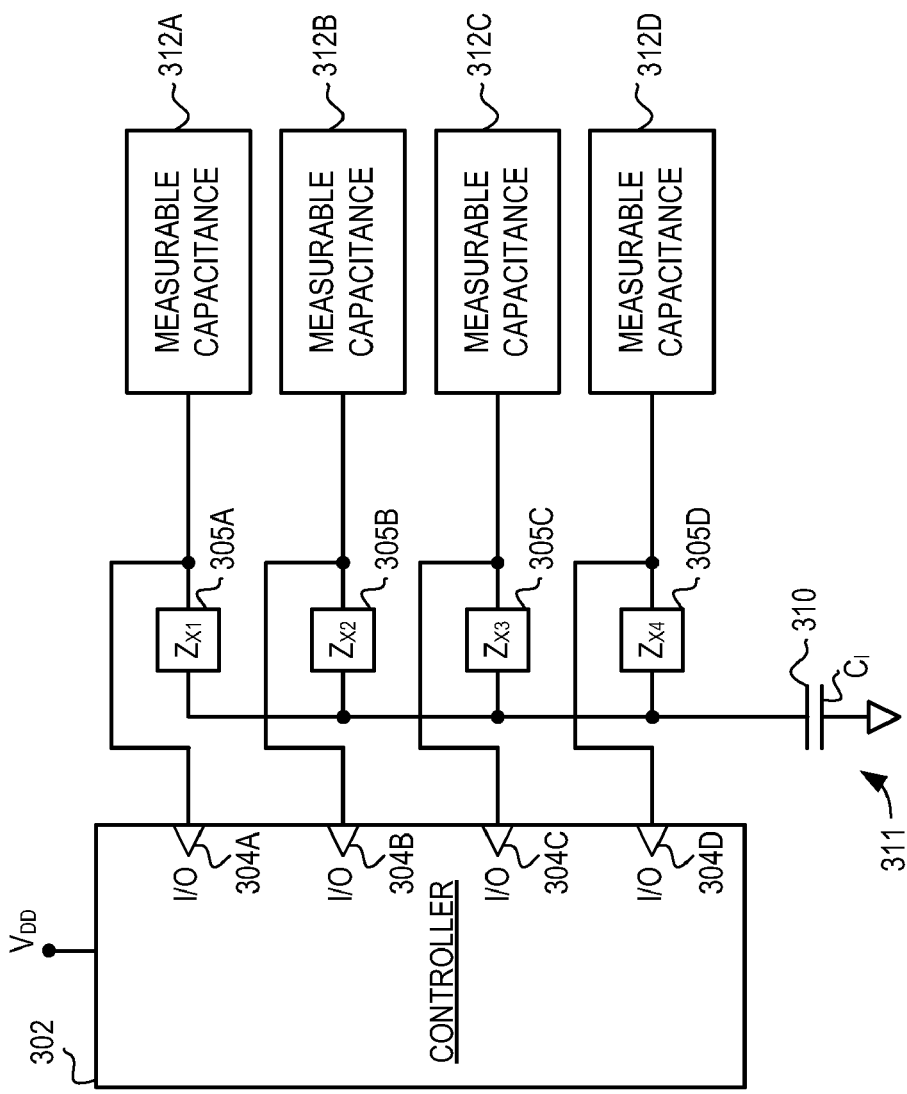
FIGS. 3A-3C are schematic views of capacitive sensors using charge transfer in accordance with an embodiment of the invention sharing an integrating capacitance.

Turning now to FIG. 3A, a first embodiment of a capacitive sensor 300 is illustrated. The capacitive sensor 300 is adapted to perform a charge transfer process to measure each of a plurality of measurable capacitances 312. The charge transfer process comprises applying a pre-determined voltage to the measurable capacitance 312, and then allowing the measurable capacitance to share charge with a shared passive network 311 that includes at least one integrating capacitance 310, with the integrating capacitance 310 statically coupled to a plurality of measurable capacitances 312 and configured to accumulate charge received from the plurality of measurable capacitances 312. The value of each measurable capacitance 312A-D can then be determined as a function of a representation of a charge on the integrating capacitance 310 and the number of times that the charge transfer process was performed. The number of times that the charge transfer process is executed can be pre-established or be based on the representation of the charge reaching some threshold. The representation of the charge on the integrating capacitance can be obtained by a measuring step that quantizes a representation of charge on the integrating capacitance. These steps can be repeated, and the results of the measuring step can be stored and/or filtered as appropriate, and used for object detection in a proximity sensor device.

In the illustrated embodiment, the integrating capacitance 310 is shared between four sensing channels, where each of the four sensing channels corresponds to one of the measurable capacitances 312A-D. Each I/O 304A-D is coupled to a measurable capacitance 312A-D and to a corresponding passive impedance 305A-D. A shared passive network 311 is coupled to each of the passive impedances 305A-D, with the shared passive network 311 including a shared integrating capacitance 310. It should be noted that the integrating capacitance 310 is statically coupled to the measurable capacitances 312, without a switch or other active element between them. Instead, the passive impedances 305 serve to couple measurable capacitances 312 to the integrating capacitance 310, and also serve to selectively (share) transfer charge from the measured capacitances to the integrating capacitor over longer timescales while reducing the leakage of charge due to the application of the charging voltage to the measured capacitances over a shorter time scale. The integrating capacitance 310 is typically a relatively large capacitance. By using a shared integrating capacitance 310, statically coupled to multiple sensing channels, the capacitive sensor 300 facilitates a reduction in device complexity and cost.

It should also be noted that the capacitive sensor 300 requires only a single I/O 304A-D on controller 302 for each measurable capacitance 312A-D. By using only one I/O 304 for each measurable capacitance, this embodiment allows for an even more efficient implementation of a capacitance sensor in terms of I/O usage, and thus is especially useful for large, multi-sensing-channel implementations. For example, a proximity sensor with 20 sensing electrodes could be implemented using 20 I/O's on a controller. In this illustrated embodiment, a single I/O 304 is used to apply the pre-determined voltage to its respective measurable capacitance 312 (e.g. I/O 304A is associated with measurable capacitance 312A, and I/O 304B is associated with measurable capacitance 312B, etc.), to read the voltage on the shared integrating capacitance 310, and also to reset the charge on the shared integrating capacitance 310.

Thus in this one embodiment, the capacitive sensor 300 measures the plurality of measurable capacitances 312A-D sequentially and one at a time. During the sequential operation, the controller 302 applies a charging pulse of a predetermined voltage to a measurable capacitance 312 through the corresponding I/O 304 while other voltage applying I/Os are left in a high impedance state. Between charging pulses, the I/Os 304A-D are set to a high impedance state such that the charged measurable capacitance 312 is allowed to share charge with the shared integrating capacitance 310 through its corresponding passive impedance 305. This process is repeated, such that charge from multiple charging processes is accumulated on the shared integrating capacitance.

A representation of the accumulated charge (e.g. a voltage) on the integrating capacitance 310 is then measured using one of the I/Os 304A-D in this simple embodiment. This representation provides a measurement of the measurable capacitance 312 that can be used in an object proximity sensor. It should also be noted that in this specific embodiment, the voltage at the integrating capacitance 310 cannot be measured directly, as that node is not coupled directly to an I/O 304 of the controller 302. However, the voltage at an I/O 304 can be used as the representation of the accumulated charge on integrating capacitance 310 and thus can be used to determine the capacitance of the measurable capacitance 312.

For example, in one embodiment the voltage at one or more I/Os 304 can be compared to a threshold voltage $V_{TH}$. The accumulated charge on the integrating capacitance may be affected by the current leakage through the passive impedance during the charging pulse, and this may be compensated for by applying opposing charging pulses (which are not shared) or by estimating the effect and accounting for it by calculation. Further, in some embodiments where the charging voltage is applied by the I/O 304 for a short time (relative to the time constant of the passive impedance and the integrating capacitor) and at certain times (e.g. after the shared charge has almost completely accumulated through the passive impedance) the voltage at the I/O 304 is essentially equivalent to the voltage on the integrating capacitance 310, such that no difference in measurements exist and needs to be accounted for.

As another example alternative, measurable capacitance 312 may be charged or discharged for a pre-set number of performances of the charge transfer process, with the voltage on integrating capacitance 310 being measured as a quantized multi-bit value after the pre-set number of performances rather than as a single-bit value by comparison with a threshold.

At the end of a charging cycle (e.g. after the voltage at an I/O 304 exceeds the threshold voltage $V_{TH}$), one or more of the I/Os 304 applies a suitable reset voltage to reset the charge on the integrating capacitance 310. For example, an I/O 304 will repeat the process of initially applying pulses of logic "high" values to provide a positive charge to measurable capacitance that is then shared with integrating capacitance 310, and then at the end of those processes the same I/O resets the integrating capacitance 310 by driving a logic "low" or "ground" for a period of time sufficient to discharge integrating capacitance 310 through the passive impedance 305 to a known reset voltage. It should be noted that when the integrating capacitance 310 is reset through a single passive impedance 305, a relatively long reset period must be used. When many applying I/Os 304 are available it then usually makes sense for them to either be shared during the resetting process, or to use an additional shared reset I/O such as 316 in FIG. 3C to reset the shared integrating capacitance for more than one of the measured capacitances 312.

It should be noted that while the shared integrating capacitance 310 is illustrated in FIG. 3A as comprising one capacitor, in other embodiments it can be implemented with multiple capacitors that are shared between the various channels. Furthermore, it should be noted that while the illustrated embodiment shows separate passive impedances 305 for each channel, that in some embodiments the shared passive network 311 will also include impedances that are shared between channels.

Figure 3B:
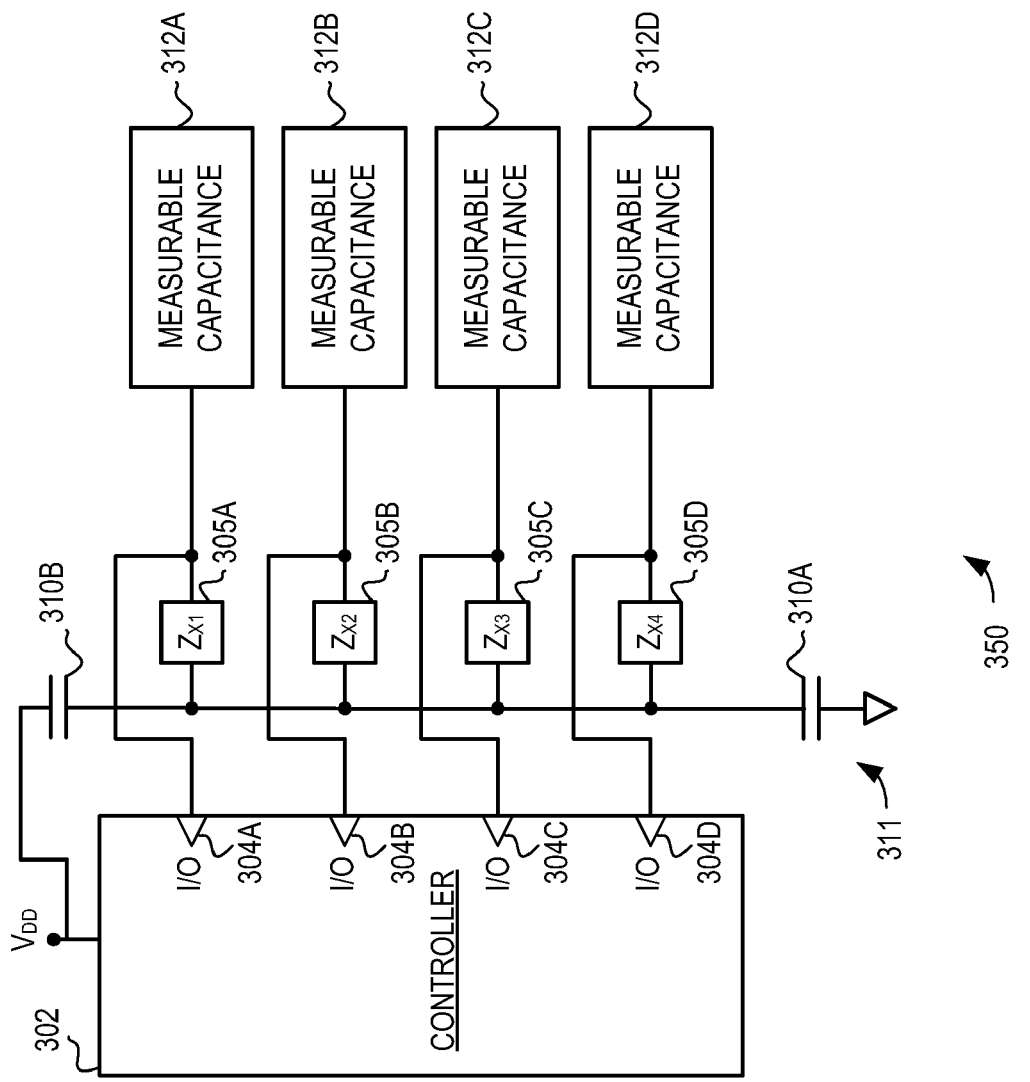

Turning now to FIG. 3B, a variation on the embodiment of FIG. 3 is illustrated where a capacitive sensor 350 utilizes an integrating capacitance that comprises two capacitances 310A and 310B. In this embodiment, the integrating capacitances 310A and 310B are coupled to a power supply voltage in such a way that a conditioned voltage can be provided. This conditioned voltage can be used in addition to, or in conjunction with, the conditioned voltage provided by a stand-alone voltage conditioning element, as will be described in greater detail with reference to FIG. 4.

Figure 3C:
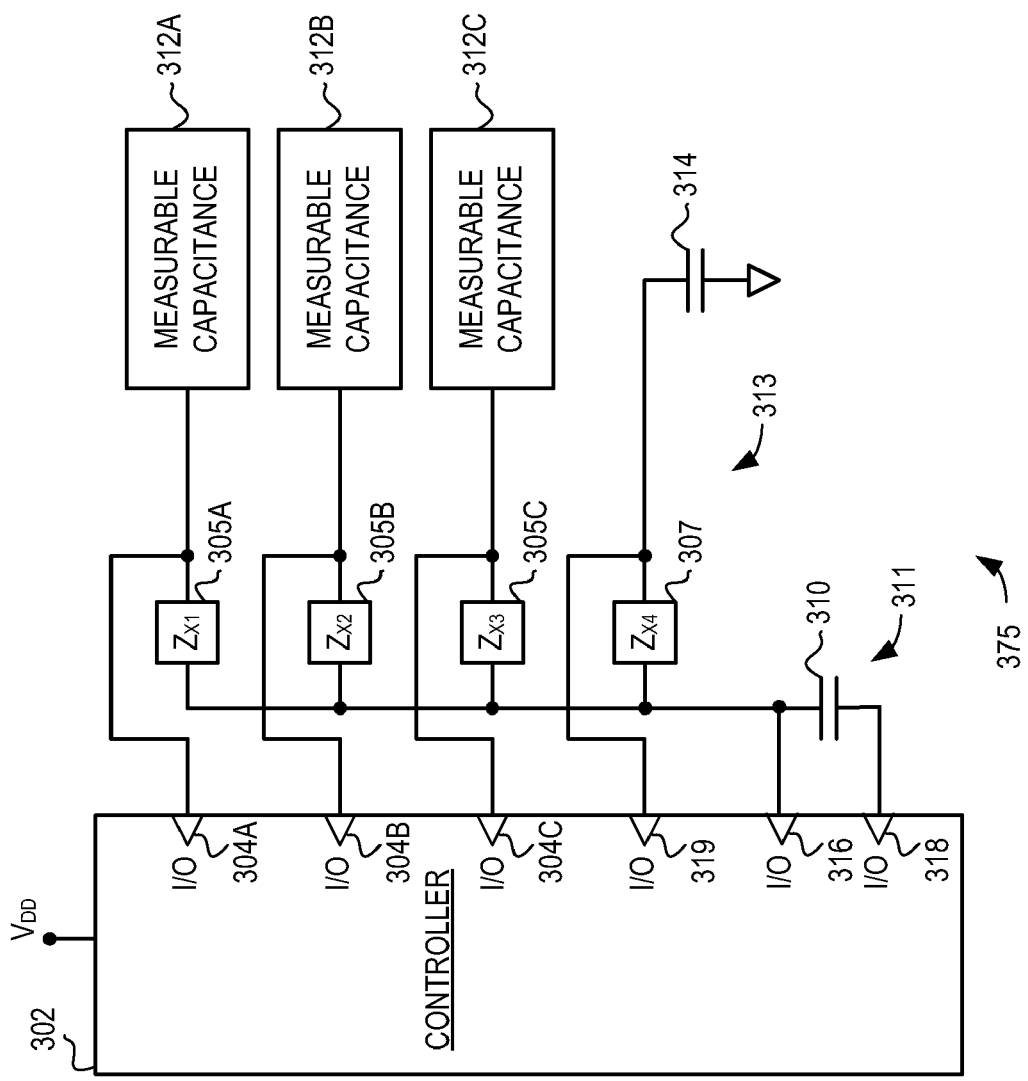

Note also that a variety of alternate embodiments are possible. In addition to the combination of integrating capacitances 310 illustrated in FIG. 3B for voltage conditioning, it is also possible to reduce the time constant for resetting the integrating capacitance by using multiple I/Os. For example, by using more than one of the voltage applying I/Os to reset the integrating capacitance each through their respective passive impedance as described above or by using one or more I/Os directly connected to the integrating capacitance. Turning directly to FIG. 3C, a capacitive sensor 375 is illustrated that facilitates such a reset. Capacitive sensor 375 also includes a shared reference channel 313 that includes an impedance $Z_{X4}$ and a capacitor 314 coupled to the I/O 319. Additionally, the capacitive sensor 375 includes shared I/O 318 for low side comparison of the integrating capacitor voltage. The reference channel may be used to compensate for variations in operating conditions (e.g. power supply voltage, threshold voltage, printed circuit board dielectric, etc.). In an alternate embodiment the reference channel capacitance 314 may comprise an element of a charge changing circuit where reference channel 313 can change a charge on an integrating capacitance by a quantized amount of charge. Such a charge changing circuit might be used for offsetting the measurement of a capacitance to increase dynamic range, or for a sigma-delta capacitance measurement technique.

The reset may be provided by a shared reset I/O 316. The shared reset I/O 316 is connected between the isolating passive impedances 305A-C and the integrating capacitance 310 to provide a rapid reset for more than one of the sensing channels. To perform a reset in one embodiment, the shared reset I/O 316 is driven to a predetermined reset voltage (e.g. ground) while the other side of the integrating capacitance is also driven to a predetermined voltage (e.g. I/O 318 could be omitted and/or that node directly coupled to ground), setting the charge from the integrating capacitance 310 to a known value (e.g. zero). The reset I/O 316 connected between the isolating impedances and the integrating capacitance could also be used to measure the voltage (and charge) on the integrating capacitance. In both cases the reset I/O 316 is shared between the multiple measurable capacitances.

In another embodiment the shared I/O 318 coupled to the opposite node of the integrating capacitance 310 from I/O 316 facilitates a charge measurement technique that provides improved resistance to noise. Specifically, during charge transfer the I/O 318 is driven to Vdd, and thus functions in a similar manner to capacitive sensor 300 in FIG. 3A, but referenced to a different power supply voltage during charge transfer. Then, when the charge on the integrating capacitance 310 is to be measured, two of the I/Os (e.g., I/O 304A and I/O 304B) can be driven to $V_{DD}$ while the other two (e.g., I/O 304C and I/O 319) are driven to ground. This creates a voltage divider that puts a conditioned voltage of ½ $V_{DD}$ at the top of integrating capacitance 310. The voltage at shared I/O 318 can then be measured relative to the conditioned voltage, providing an accurate measurement of the charge on the integrating capacitance 310 relative to a threshold voltage that varies with ½ $V_{DD}$. Additionally, driving the I/Os during measurement this way prevents noise from the measurable capacitances 312A-C from propagating to the integrating capacitance 310, thus reducing the effects of that noise on the measurement. Note that in this other embodiment I/O 316 need not be used (or can remain a high impedance input).

In yet another embodiment both I/Os 316 and 318 may be used for both resetting and quantizing a measurement of charge on the integrating capacitance 310. The I/O 318 may be grounded during the charge transfer process, while 316 floats at high impedance. Then the I/O 316 may be driven to a stable voltage (e.g. Vdd) while the charge on the integrating capacitance is quantized (e.g. by measuring the voltage on I/O 318 relative to a CMOS threshold) to facilitate determining one or more of the measurable capacitances 312A-C.

Figure 4A:
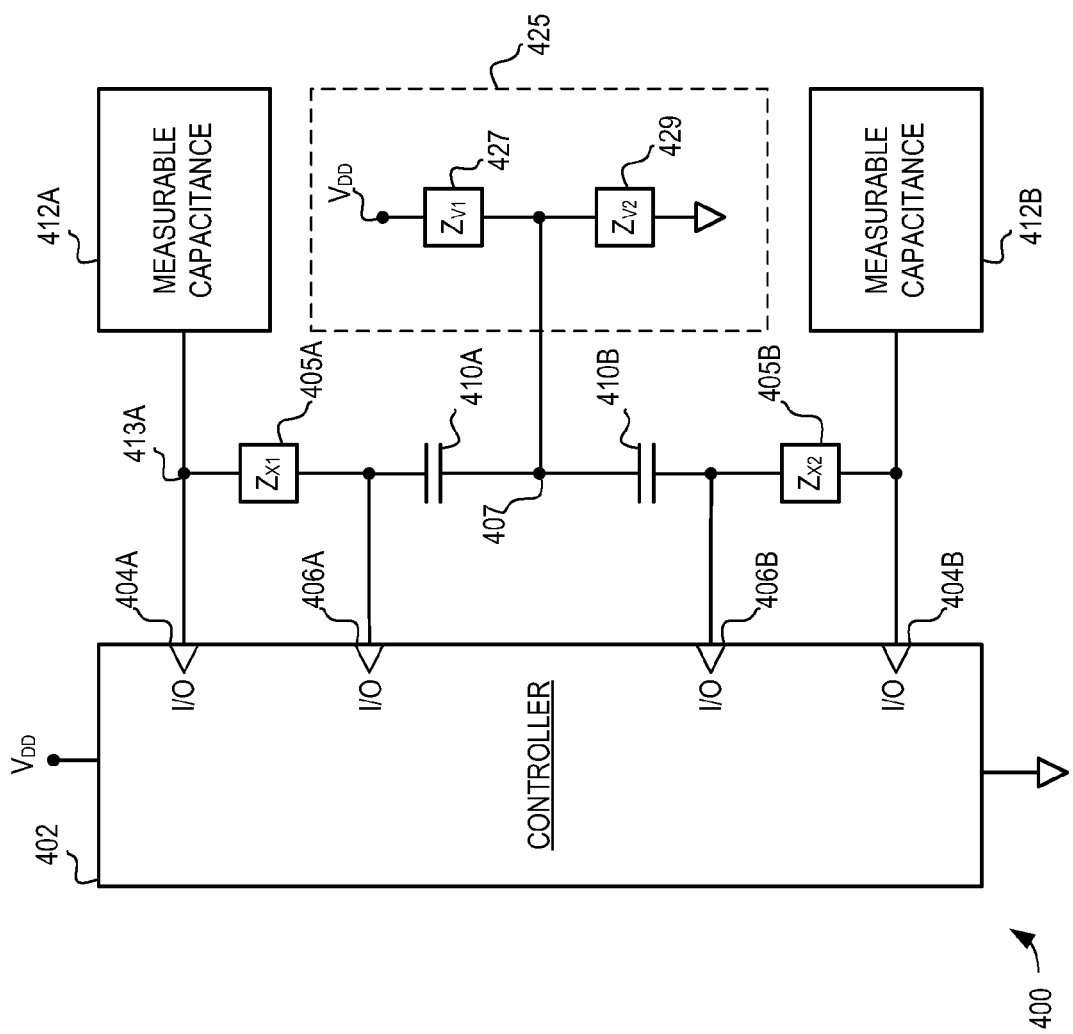
FIGS. 4A-B are schematic views of a capacitive sensors using charge transfer in accordance with an embodiment of the invention a sharing voltage conditioning circuit.

The embodiments illustrated in FIGS. 3A, 3B, and 3C are some examples of how shared components can be used in a capacitance sensor. Turning now to FIG. 4A, a second embodiment capacitive sensor 400 is illustrated. In this embodiment the capacitive sensor 400 shares a voltage conditioning circuit 425 that is adapted to provide a variable reference voltage. For example, a variable reference voltage that varies with a threshold voltage of the controller 402. This embodiment does not, however, share an integrating capacitance, and instead uses a plurality of integrating capacitances 410A&B with a shared voltage conditioning circuit 425 allowing multiple measurable capacitances (e.g. 412A&B) to be measured concurrently. This is distinct from the sensor 350 in FIG. 3B where multiple capacitors 310A and 310B make up the integrating capacitance 310 which also provides voltage conditioning without additional circuitry.

Like the embodiment illustrated in FIGS. 3A-C, the capacitive sensor 400 is adapted to perform a charge transfer process to measure each of a plurality of measurable capacitances 412. The charge transfer process comprises applying a pre-determined voltage to the measurable capacitance 412, and then allowing the measurable capacitance to share charge with a passive network that includes at least one integrating capacitance 410, with the integrating capacitance 410 statically coupled to a plurality of measurable capacitances 412 and configured to accumulate charge received from the plurality of measurable capacitances 412. The value of each measurable capacitance 412A-B can then be determined as a function of a representation of a charge on the corresponding integrating capacitance 410 and the number of times that the charge transfer process was performed. The number of times that the charge transfer process is executed can be pre-established or be based on the representation of the charge reaching some threshold. The representation of the charge on the integrating capacitance can be obtained by a measuring step that quantizes a representation of charge on the integrating capacitance. These steps can be repeated, and the results of the measuring step can be stored and/or filtered as appropriate, and used for object detection in a proximity sensor device.

In the illustrated embodiment of FIG. 4A, a voltage conditioning circuit 425 is shared between the two measurable capacitances 412A-B. Specifically, the voltage conditioning circuit 425 includes a first impedance 427 and a second impedance 429 coupled as a voltage divider between $V_{DD}$ and ground. As such, the voltage conditioning circuit 425 provides a variable reference voltage to node 407. Specifically, the voltage conditioning circuit 425 provides a voltage that varies with a threshold voltage of the controller 402.

The voltage conditioning circuit 425 is coupled to the side of integrating capacitances 410 opposite the measurable capacitances 412, and to either or both power supply rails (coupling to +$V_{DD}$ and ground) associated with the implementation of capacitance sensor 400. With the configuration shown in FIG. 4, fluctuations in the supply rails (also "power supply voltage ripple") induce similar fluctuations in the voltage at node 407, and therefore can be used to compensate for fluctuations in measurement thresholds associated with controller 402 induced by the same supply voltage ripple. Specifically, providing a conditioned voltage to the integrating capacitor that varies ratiometrically with the power supply (and with the threshold voltage) compensates for fluctuations in the controller thresholds which have the same ratiometric response. That is, if the voltage reference of the integrating capacitance moves by a similar voltage and at a similar time with the thresholds used to measure the voltage on the integrating capacitance then the variation in the power supply voltage can be compensated for and its effect on the measurement of the capacitance reduced.

The exemplary compensation circuit 425 includes two impedances 427 and 429 configured in an impedance divider arrangement between the two supply voltages of +$V_{DD}$ and ground. An impedance divider is composed of two passive impedances in series, where each passive impedance is coupled to at least two nodes. One of these nodes is common to both impedances ("a common node" to which both impedances connect.) The common node serves as the output of the impedance divider. The output of the impedance divider is a function of the voltages and/or currents applied at the "unshared" nodes (the nodes of the two impedances that are not the common node) over time. A simple example of an impedance divider is a voltage divider composed of two capacitances or two resistances. More complex impedance dividers may have unmatched capacitances, resistances, or inductances in series or in parallel and voltages on them may be controlled or measured by an I/O. An impedance may also have any combination of capacitive, resistive, and inductive characteristics.

For compensation circuit 425 shown in FIG. 4A, the impedance divider can be a voltage divider formed from two resistances or two capacitances coupled to $+V_{DD}$ and ground. The impedance divider of circuit 425 has a "common node" coupled to the integrating capacitances 410A-B at node 407. Resistive versions of impedances 427 and 429 can comprise resistors to form a resistive divider network, and capacitive versions of impedances 427 and 429 can comprise capacitors to form a capacitive divider network. Alternately, a capacitive divider may be supplemented by a resistive biasing element included in one of the impedances to form an impedance divider network which provides voltage conditioning over an appropriate frequency range. By selecting appropriate values for impedances 427 and 429, the bias on the integrating capacitances 410 can tuned to vary in the same way as the threshold(s) of the I/Os measuring the voltage on them. Thus, variations in supply voltage will be automatically compensated by the compensation and voltage conditioning circuit 425. This is because such a voltage divider provides a voltage that reflects the fluctuations in power supply voltage without significant lag similar to that of the I/O thresholds.

In another example, a conditioned voltage can be provided by a resistance in series with a capacitance (low impedance compared to the total coupled integrating capacitance and the series passive impedances) and an I/O that charges the capacitance and measures its voltage through a resistor to control it to the voltage threshold of the reference I/O. In this case, when the threshold of the reference I/O tracks that of the other measurement I/Os, the conditioned voltage will track the other measurement I/Os. This allows the voltage on the integrating capacitance to be changed so that other measurement I/Os don't spend much time near threshold where they can consume significantly more power.

Figure 4B:
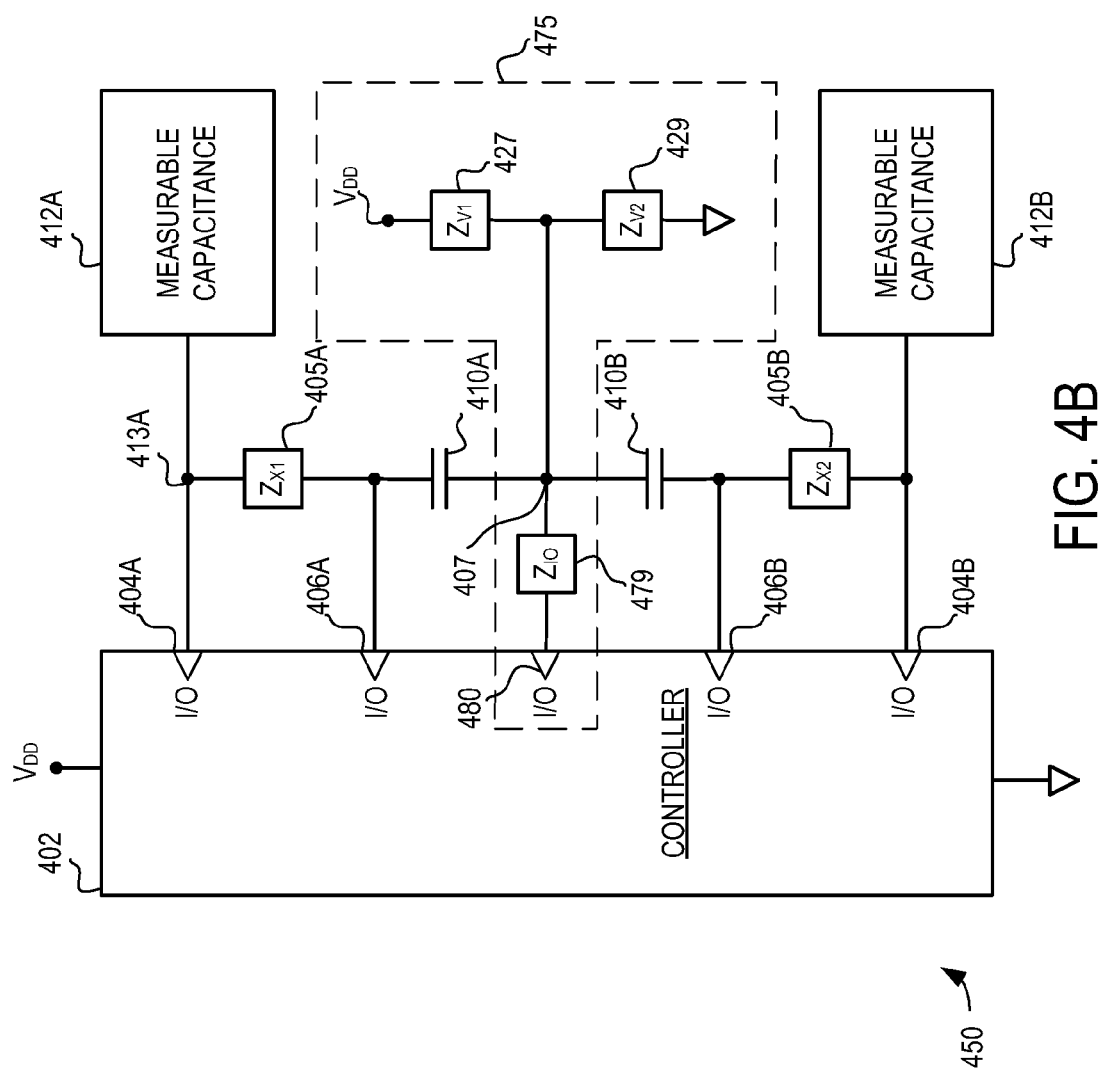

Turning now to FIG. 4B, another embodiment of a capacitive sensor 450 is illustrated. Like the sensor 400, the capacitive sensor 450 includes a voltage conditioning circuit 475 that shared between the two measurable capacitances 412A-B. The voltage conditioning circuit 475 includes a first impedance 427 and a second impedance 429 coupled as a voltage divider between $V_{DD}$ and ground. The voltage conditioning circuit also includes I/O 480 coupled to node 407 through an I/O impedance 479. The voltage conditioning circuit 475 provides a variable reference voltage to node 407. Specifically, the voltage conditioning circuit 475 provides a voltage that varies with a threshold voltage of the controller 402

Additionally, the I/O 480 and I/O impedance 479 allows the compensated voltage that is applied to node 407 to be dynamically changed responsive to a change in the output of I/O 480. For example, if the first impedance 427, the second impedance 429, and the I/O impedance 479 all have the same value, then the compensated voltage provided to node 407 will be approximately $\frac{2}{3} V_{DD}$ when I/O 480 is driven high, and will be approximately $\frac{1}{3} V_{DD}$ when I/O 480 is driven low. This can be useful in applications where I/O thresholds may change, such as in devices that use Schmidt triggers that have different upper and lower thresholds.

The example voltage conditioning circuits illustrated in FIGS. 4A and 4B are two examples of the type of voltage conditioning circuit that can be shared between measurable capacitances in a capacitive sensor. It should also be noted that while the voltage conditioning circuit is illustrated as being shared between two measurable capacitances 412A-B, that this concept can be expanded to share the voltage conditioning circuit between more measurable capacitances to further enhance device component usage efficiency.

Figure 5:
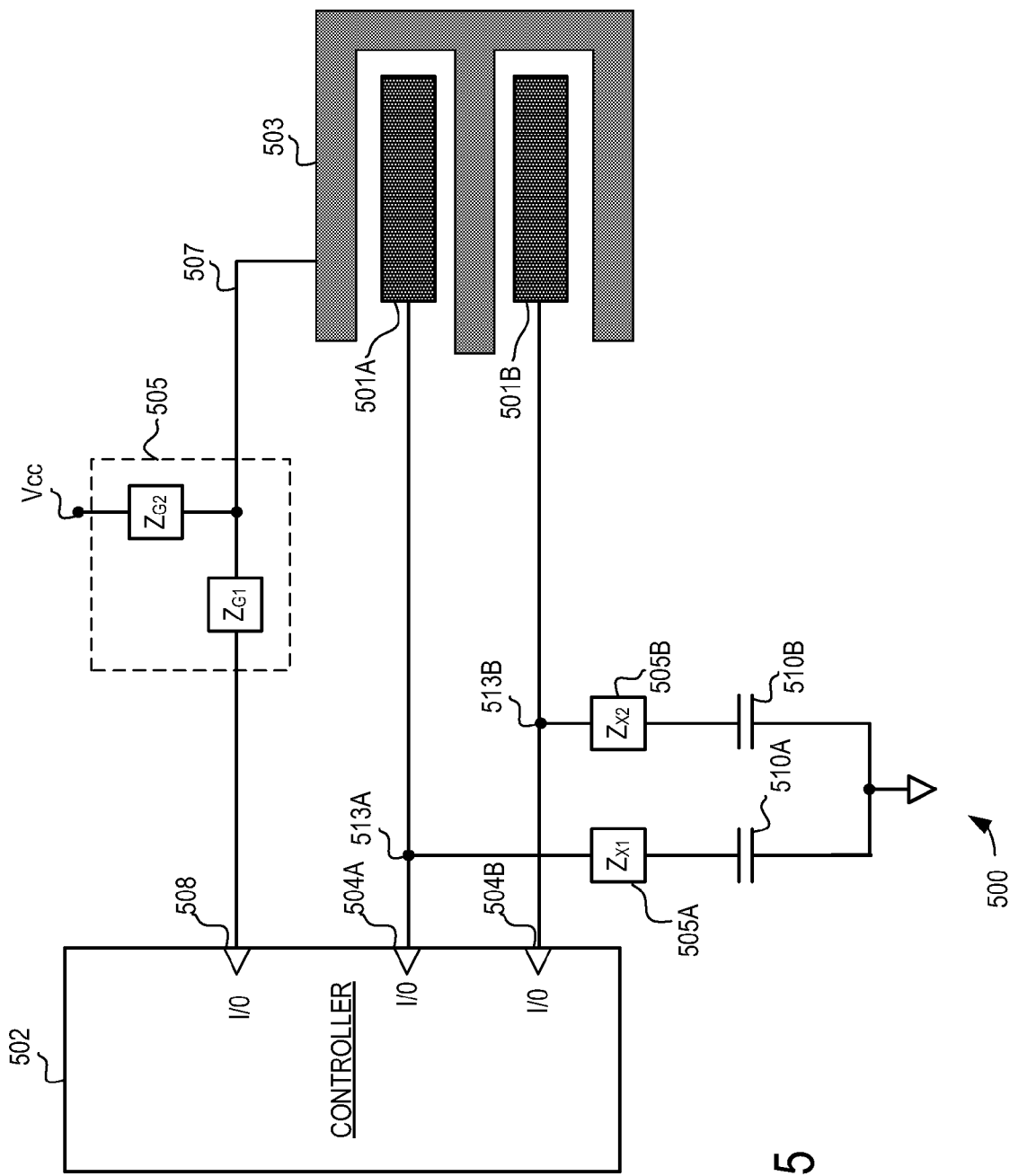
FIG. 5 is a schematic view of a capacitive sensor using charge transfer in accordance with an embodiment of the invention sharing a guarding electrode.

Again, the embodiment illustrated in FIGS. 4A-B is just one example of how shared components can be used in a capacitance sensor. Turning now to FIG. 5, a third embodiment capacitive sensor 500 is illustrated. In this embodiment the capacitive sensor 500 shares a guarding electrode 503 that is providing a guard signal during at least a portion of the time in which voltage is applied to sensing electrodes 501 and during at least a portion of the time in which the electrodes share charge with an integrating capacitance in a passive network. This embodiment does not, however, share an integrating capacitance, and instead uses a plurality of integrating capacitances 510.

Like the embodiment illustrated in FIGS. 3-4, the capacitive sensor 500 is adapted to perform a charge transfer process to measure each of a plurality of measurable capacitances, where the measurable capacitances are defined, at least in part, by a plurality of sensor electrodes 501A-B and an object, such as a finger or stylus (not shown), proximate to the sensor electrodes 501A-B. The charge transfer process comprises applying a pre-determined voltage to the electrodes 501 via I/Os 504, and then allowing the electrodes 501 to share charge with a passive network that includes at least one integrating capacitance 510A-B corresponding to the sensor electrodes, with each integrating capacitance 510 statically coupled to an associated electrode 501 through node 513 and impedance 505, where the integrating capacitances are configured to accumulate charge received from the plurality of measurable capacitances 501. The value of a measurable capacitance at each electrode 501 can then be determined as a function of a representation of a charge on the corresponding integrating capacitance 510 and the number of times that the charge transfer process was performed. The number of times that the charge transfer process is executed can be pre-established or instead can be based on the representation of the charge reaching some threshold. The representation of the charge on the integrating capacitance can be obtained by a measuring step that quantizes a representation of charge on the integrating capacitance. These steps can be repeated, and the results of the measuring step can be stored and/or filtered as appropriate, and used for object detection in a proximity sensor device.

This embodiment also includes a shared guarding electrode 503 that serves to shield the sensor electrodes 501 from unintended electrical coupling. For example, unwanted electrical coupling can occur between pairs of sensors, between the sensors and external sources (e.g. grounded, stationary relative to ground, or varying with respect to ground), and between sensors and internal sources (e.g. I/Os for LED control or communications). Such unwanted coupling can cause both offsets and variations in the measured capacitances not related to the desired input, as well as, sensitivity variations with changing environmental conditions. Some fraction of the fields causing the unwanted coupling can be shorted out by a low impedance guard placed near or between the sensors to reduce these effects. The effect of the guard on the measured capacitances and sensitivity can also be reduced to the extent that it follows the voltage on the sensor (and minimizes charge transfer), which distinguishes it from a simple (e.g. ground) shield. In the embodiment shown in FIG. 5, individual sensing electrodes 501A-B are used to capacitively detect the presence of an object and thus provide their respective measurable capacitances. During operation, a guarding signal is provided on the guarding electrode 503 using a low impedance path 507. The guarding signal helps to shield the sensor electrodes 501 from unintended coupling with the environment and helps to reduce the net charge transferred from the guarding electrode 503 onto integrating capacitances 510A-B during the course of the charge transfer processes. During a portion of the applying of the pre-determined voltage, the guard signal can apply a voltage to the guarding electrode 503 approximately equal to the voltage applied to the predetermined voltage. Then, before the charge sharing between the active sensing electrode (e.g. 501A-B) with its associated integrating capacitance (e.g. 510A-B) ends, the voltage of the guard signal may be changed to be approximately equal to the voltage on the associated integrating capacitance (e.g. 510A-B). If a constant voltage is chosen to approximate the voltage on the associated integrating capacitance (an approximation since the voltage on the integrating capacitance changes during and between repetitions of the charge transfer process), the voltage applied to the guarding electrode 503 may be changed to a voltage between the appropriate threshold voltage ($V_{TH}$) and the voltage on the associated integrating capacitance 510 after reset. The absolute values of the voltages of the guard signal are less important than the voltage swing (i.e. change in voltage) of the guard signal. For example, an offset between the guarding electrode voltage and the sensing electrode voltage would not affect the usefulness of the guard, since for charge transfer through a capacitance, the voltage swing (i.e. change in voltage) is important and the absolute voltage values are not.

These guarding voltages of the guard signal may be generated in any manner, such as by tying the guarding electrode 503 to a guarding voltage generator circuit of any sort. In the exemplary embodiment shown in FIG. 5, an impedance divider circuit 505 suitably produces at least two different values of voltages depending upon the signal applied by I/O 508 of controller 502 and the types and values chosen for the components comprising impedance divider circuit 505. Specifically, an impedance divider 505 composed of a resistive voltage divider can be used. With such a voltage divider, if the signal from I/O 508 is $+V_{DD}$ or if the I/O 508 is held at high impedance, the guarding voltage is $+V_{DD}$. Alternatively, if the signal from I/O 508 is ground, the guarding voltage is a predetermined fraction of $V_{DD}$ such as $(+V_{DD})/2$. Thus, the guarding signal can be made to comprise a first and second reference voltage that can be selected using the I/O 508. Alternatively, the guarding signal can switch between a reference voltage and an open circuit condition.

As another example, the guarding voltage of the guard signal is changed between the application of the charging pulses that apply the pre-determined voltage and the subsequent sharing period. The guarding voltage swing of the guard signal can also change between repetitions of the charge transfer process, such as between a reset and the last measurement used in a determination of the measurable capacitance. Alternate embodiments could implement impedance divider circuits with one or more resistances, inductances, or capacitances for ease of design, ease of production, more effective guard signals, and the like. Digital-to-analog converters, pulse-width modulators, and the like can also be used to generate the guarding signal, or active buffers (voltage followers) may be used to lower their impedance. The various charge transfer sensing techniques described herein, coupled with the ease of multi-channel integration, provide for highly efficient application of shared guard signals.

It should be noted that while the embodiments illustrated in FIGS. 3-5 each illustrate a different type of component sharing, that in other embodiments the different types of component sharing can be combined. For example, in some embodiments both the passive network and the voltage conditioning circuit may be shared, while in other embodiments all three types of components may be shared. Furthermore, the various types of sharing can be implemented to share components over different combinations of sensing channels. For example, the passive network and integrating capacitances can be implemented to be shared between four channels, while a voltage conditioning circuit is implemented to be shared over twenty channels, and while the guarding electrode is implemented to be shared over all electrodes. Similarly, an I/O used to reset or reference the integrating capacitor might be shared between multiple sensors or even used in different ways at different times as in FIG. 14 discussed below. Thus, different levels of sharing can be implemented for the different components in the same sensing device. Again, these are just some example of the types of ways in which component sharing can be provided.

Figure 6:
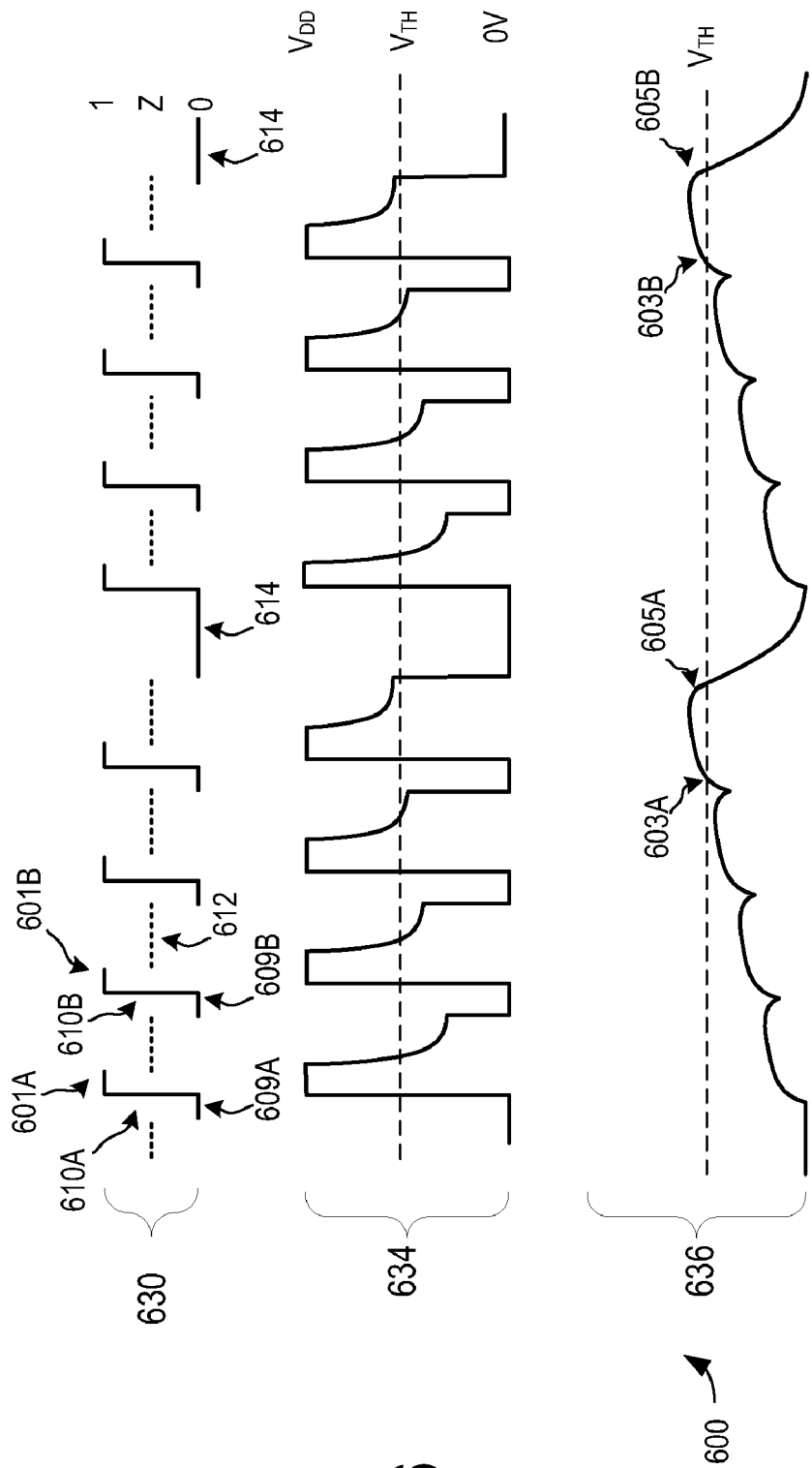
FIGS. 6 and 7 are graphical views of charge transfer timing schemes in accordance with an embodiment of the invention.

More detailed examples of how a charge transfer process can be performed to measure capacitance with the embodiments illustrated in FIGS. 3, 4 and 5 will now be given. Turning now to FIG. 6, an exemplary timing scheme 600 illustrates the voltages associated with the measurable capacitances and integrating capacitances. Specifically, FIG. 6 includes a trace 630 which shows an exemplary set of charging voltage pulses 610 that can be provided to a measurable capacitance using a corresponding I/O (e.g. I/O 304A for measurable capacitance 312A in FIG. 3). The charging voltage pulses 610 include both logic low (0) output portions 609 and logic high (1) output portions 601. The logic high output portions apply the pre-determined voltage to the measurable capacitance. The logic high portions 601 of charging voltage pulses 610 are generally selected to have a period shorter than the response time of the RC circuit that includes passive impedance and integrating capacitance such that any charge leakage to the integrating capacitance during the applying of the pre-determined voltage will be negligible, although applying an opposing voltage can compensate for this leakage.

Logic low output portions 609 provide an "opposing" voltage that precedes the logic high output portions 601 that apply the pre-determined voltage. The "opposing" voltage has a magnitude opposite that of the pre-determined voltage and helps compensate for current leaking through the passive impedance during the charge transfer process by "current cancelling" without reducing the signal created by the shared charge. The durations of the logic output portions 609 are suitably chosen so the amount of parasitic charge removed by driving the opposing voltage is mostly equal to the amount of parasitic charge added by applying the pre-determined voltage. The opposing voltage might be only applied during some of the repetitions of the sharing during a cycle, and might be dependent on the elements used to determine the measurable capacitance (e.g. number of repetitions, accumulated charge on integrating capacitance, etc.).

Between the applications of the charging voltage pulses 610, the measurable capacitance is allowed to share charge with the integrating capacitance by holding the associated I/O to a high impedance state (Z) 612. The embodiment of timing chart 600 shows the pre-determined voltage being applied by logic highs, such that the measurable capacitance charges during the applying of the pre-determined voltage and discharges through the passive impedance to the integrating capacitance during charge sharing. The exemplary voltage trace 634 shows the resulting voltage at the measurable capacitance, and exemplary voltage trace 636 shows the resulting voltage at the integrating capacitor. Specifically, voltage trace 634 illustrates how each opposing voltage portion 609 of a charging pulse 610 drives the voltage on measurable capacitance to the opposing voltage, how each pre-determined voltage portion 601 of a charging pulse drives the voltage on measurable capacitance to the pre-determined voltage (which is shown as $+V_{DD}$ in FIG. 6). Traces 634 and

636 also show how charge sharing between the measurable capacitance and the integrating capacitance brings the voltages on the integrating capacitor (trace 636) close to the voltage on the measurable capacitance (trace 634) after sharing on each cycle.

Voltage trace 636 exhibits slight drops and rises in response to the driving of the opposing voltage and the pre-determined voltage in "current cancelling." Voltage trace 636 also shows the gradual increase in voltage at the integrating capacitance as the integrating capacitance accumulates charge shared by the measurable capacitance over repeated charge transfer processes.

Voltage traces 634 and 636 both show how the measurable capacitance is charged relatively quickly with each application of the pre-determined voltage through the associated I/O, while the relatively longer time constant of the measurable capacitance and passive impedance that forms the passive network causes a relatively slower sharing with the integrating capacitance. At the same time other measurable capacitances may be isolated from the application by the low impedance of the integrating capacitance and longer time constant of it with the passive impedance. Where the reset of the integrating capacitance 614 between measurement cycles takes place by driving through the same passive impedance the time constant is also longer since the integrating capacitance is larger.

Several different methods can be used to determine the measurable capacitance from the voltage at the integrating capacitance. In one method, the voltage at the integrating capacitance is compared to an appropriate threshold voltage ($V_{TH}$) to provide a single bit analog-to-digital (A/D) conversion of the voltage on the integrating capacitance. It should again be noted that the voltage at the integrating capacitance does not have to be measured directly. Instead, the voltage at the measurable capacitance may be used as a representation of the charge on integrating capacitance when there is no I/O directly coupled to the integrating capacitance (See FIGS. 3 and 5 for two examples). This voltage comparison can be performed by a comparator function implemented in the I/O of the controller. In this case, the threshold $V_{TH}$ can be the predetermined threshold of the digital input buffer (such as a CMOS or TTL threshold). Thus, an I/O can be used to compare the voltage at the integrating capacitance to the threshold voltage and thus obtain a representation of the charge on integrating capacitance. In one embodiment, this threshold voltage is roughly equivalent to the midpoint between the high and low logic values.

The embodiment shown in FIG. 6 uses a comparator-type method, where the charge transfer process of applying charging pulses to the measurable capacitance and allowing charge sharing by the measurable capacitance with the integrating capacitance repeats until the voltage at the integrating capacitance is detected to exceed the threshold voltage $V_{TH}$. The I/O of the controller has input functionality, and can be read to measure the voltage by comparing it with an input threshold. This measuring and ascertaining of the voltage on the integrating capacitance can occur for some each or a specified portion of the charge transfer process.

After the voltage at the integrating capacitance exceeds the threshold (indicated by points 603A-B on trace 636), reset signals 614 can be applied to the integrating capacitance to reset the charge on the integrating capacitance. Although sometimes only a few performances of the charge transfer process are needed to cross the threshold, typically a hundred or more performances (thousands) of the charge transfer process are involved. Trace 636 shows the threshold being passed after only four performances of the charge transfer process for convenience of explanation not as a typical case. By ascertaining the number of charge transfer processes performed until the voltage on the integrating capacitance exceeds the threshold voltage $V_{TH}$, a value of the measurable capacitance can be effectively determined. That is, the number of charge/share repetitions performed for a measurable capacitance to produce a known amount of accumulated charge on the integrating capacitance can be effectively correlated to the actual capacitance of measurable capacitance.

This comparator-type method can also be implemented with any combination of circuitry internal and/or external to the controller as appropriate. Many variations of this comparator-type method also exist and are contemplated. For example, multiple thresholds can be provided using a multitude of reference voltages for one or more comparators, using a specialized input of the controller, or using an input of the controller having hysteresis (e.g. a Schmitt trigger type input). If multiple thresholds are used, the charge transfer process can also change as different thresholds are reached. For example, the charge transfer process can be configured to transfer relatively larger amounts of charge (e.g. by multiple charging and sharing cycles) to reach coarser thresholds if the thresholds are not evenly spaced, or first thresholds if there is a multitude of thresholds that all must be crossed. The number of performances (or repetitions) of each type of charge transfer process needed to cross the last threshold crossed can be used to determine the value of the measurable capacitance, and additional information concerning the crossing of other thresholds can also be used to refine the determination.

In other embodiments, alternative methods of determining the value of the measurable capacitance are used. For example, in one embodiment, a direct multi-bit measurement of the voltage on the integrating capacitance is taken and used to determine the capacitance of the measurable capacitance. For example, the controller can include a high resolution analog-to-digital function that allows more accurate measurement of the voltage at an I/O. In such embodiments, the charge transfer process can execute for a pre-set number of times, after which a multi-bit value of the voltage is measured. After the pre-set number of repetitions and the measurement, the charge on the integrating capacitance can be reset for the next cycle of executions of the charge transfer processes.

Other variations on these methods are possible. For example, multi-bit measurements can be taken at multiple times in a set of charge transfer processes performed between resets. As another example, the number of executions of the charge transfer process does not have to be pre-set, such that both the number of charge transfer processes performed and the voltage at the integrating capacitance are tracked to produce a value of the measurable capacitance.

Other methods can be used to determine the measurable capacitance from the voltage (which is a function of the accumulated charge) on the integrating capacitance. For example, a dual slope method entails performing the charge transfer process for a pre-set number of times, and then drawing charge from the integrating capacitance using a current source or a discharge circuit with a known time response, such as a first order response. The time needed for the charge on integrating capacitance to fall to a known value such as zero can be monitored and quantized to produce a single or a multi-bit measurement of the representation of the charge on the integrating capacitance. This measurement can be used along with the pre-set number in determining the value of measurable capacitance. With such methods, the integrating capacitance may be left at the known value after measurement, such that no separate reset signal needs to be applied.

Other changes could be made to the basic structures and operations described above. For example, while the timing scheme shown in FIG. 6 assumes a "positive" transfer of charge from measurable capacitance to the integrating capacitance, whereas equivalent embodiments could be based upon sharing of charge in the opposite direction. That is, charge could be placed on integrating capacitance during reset, and this charge then removed and drawn through the passive impedance to the measurable capacitance during sharing.

Figure 7:
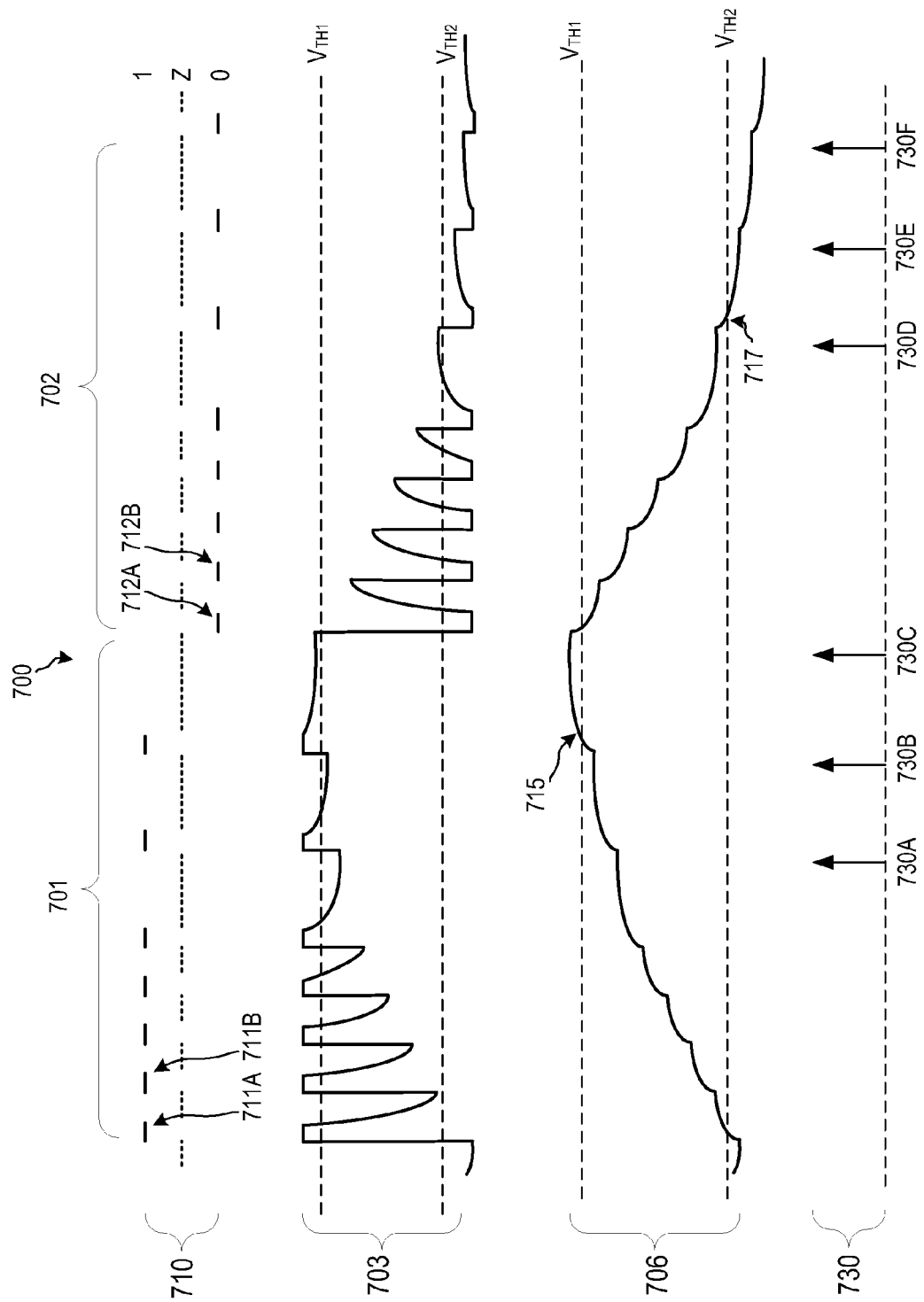

As other examples, an "oscillator" type method can use two different pre-determined voltages to charge measurable capacitance and two threshold voltages (e.g. Vdd/3 and 2Vdd/3) to determine measurable capacitance. Turning now to FIG. 7, an "oscillator" type method is illustrated in voltage traces 710, 703, 706 and 730. In the embodiment shown in FIG. 7, both crossings of the threshold voltages $V_{TH1}$ and $V_{TH2}$ are measured and can be used along with the number of times the charge transfer process was performed to determine the value of measurable capacitance. Specifically, the trace 710 shows an exemplary set of charging voltage pulses 711 and 712 that can be provided to a measurable capacitance using a corresponding I/O. Trace 703 shows the resulting charge on the measurable capacitance while trace 706 shows the result of that charge sharing on the integrating capacitance.

In the illustrated embodiment, the charging pulses 711 in period 701 add charge to the measurable capacitance, while the charging pulses 712 in period 702 remove charge from the measurable capacitance. With its cycles of both "positive" and "negative" charging, this oscillator embodiment does not need a separate reset signal after each measurement cycle as described above. This is because the amplitude and rate of change (amount of voltage change per performance of the charge transfer process) of the voltage waveform that results on the integrating capacitance between the voltage thresholds is roughly independent of the starting voltage on the integrating capacitance (assuming the thresholds and the measured capacitance are roughly constant) and are indicative of the value of the measurable capacitance used in the charge transfer process. A larger value of measurable capacitance means that the voltage thresholds $V_{TH1}$ and $V_{TH2}$ will be crossed with fewer performances of the charge transfer process, and a smaller value of measurable capacitance means that the voltage thresholds $V_{TH1}$ and $V_{TH2}$ will be crossed with more performances of the charge transfer process. Therefore, it is not required that the integrating capacitance be reset or otherwise placed at a known state after a threshold is crossed and before beginning a set of charge transfer processes (although it will certainly work with resets, and it could be done with a single threshold).

Because the repetition measurement can take place between the voltage thresholds for cycles of both "positive" and "negative" charging, additional charge transfer processes can be performed after a threshold voltage is crossed without detrimentally affecting the sensor's performance, even if no reset of the integrating capacitance occurs. Similarly, the sensitivity of sum of the total number of cycles of "positive" and "negative" charging will be significantly reduced for constant current leakage or for capacitively coupled interference of significantly lower frequency (compared to the oscillation). In an alternate embodiment the number of charging cycles in both directions could be constant (although they could be different or adjusted between measurements) and the upper and lower voltage thresholds (e.g. $V_{TH1}$, $V_{TH2}$ in the case of the embodiment of FIG. 7) could be variable. That is a multi-bit quantized measurement of the voltage near either end of the "positive" and "negative" charging cycles could be made rather than counting the cycles similar to that described in the charge and reset method above. The quantized size of the swings could then be digitally filtered, and a variety of methods (other than a simple reset) could be used to center the swings on measurement range to improve dynamic range (including simply more charging cycles for some sensors in one direction or another).

Even though the circuits of the present invention can be driven such that the charge transfer processes end based on when the applicable threshold voltage (e.g. $V_{TH1}$, $V_{TH2}$ in the case of the embodiment of FIG. 7) is crossed, that mode of operation may not be desirable in many embodiments with multiple sensing channels. Instead, it may be preferable to continue performing charge transfer processes after the crossing of the applicable threshold voltage in a multiple sensing channel system where the channels are operated concurrently (e.g. all in parallel). The total number of charge transfer processes performed may then be based on when the last-in-time filter capacitance of the multiple sensing channels crosses its threshold (or even later). The total number of charge transfer processes can also be pre-selected to be a large enough number that (at least in most cases) the last-in-time filter capacitance of the multiple sensing channels would have crossed its threshold.

The number of performances (or repetitions) of the charge transfer process during time period 701 and the number of performances of the other charge transfer process during time period 702 can be determined in any manner. In various embodiments, the I/O coupled to the measurable capacitance incorporates an input having hysteresis, such as Schmitt trigger feature, that provides the two threshold/comparison voltages $V_{TH1}$ and $V_{TH2}$. The I/O can thus be used to read the voltage at times indicated by points 730 of FIG. 7. As the voltage on integrating capacitance is sensed to have passed higher threshold $V_{TH1}$ (e.g. at point 730C) in such embodiments, a set of charge transfer processes can be applied in the opposing direction to reduce the voltage on an integrating capacitance. Similarly, as the voltage on integrating capacitance is sensed to have passed lower threshold $V_{TH2}$ (e.g. at point 730E) another set of charge transfer process can be applied in the opposing direction to increase the voltage on integrating capacitance. As shown by trace 706, the sensing scheme produces a voltage at the integrating capacitor that approaches thresholds from the correct direction such that hysteretic inputs such as Schmitt trigger inputs will function correctly in the system and provide the appropriate thresholds for the periods of charge transfer processes. An example of a circuit appropriate for this sensing method is FIG. 4B, since there is more than one voltage threshold, it would be appropriate to use an additional I/O to change the voltage ratio for each threshold on the conditioning circuit 475.

In still other embodiments, pre-selected numbers of performances of the charge transfer process are combined with the use of thresholds. That is, the charging and/or discharging processes may execute for a pre-determined or pre-established number of cycles, but the charge transfer cycle in which the voltage on the integrating capacitance crosses a threshold voltage is determined. FIG. 7, for example, shows fourteen charge transfer processes and six measurements 730A-F (again, this number of transfers is only for demonstration purposes and smaller than would be typically used), with the time that each measurement 730A-F is taken illustrated by an arrow. In the illustrated example, seven charge transfer processes and three measurements are performed during each charging or discharging cycle even though threshold voltage $V_{TH1}$ is crossed at point 715, just prior to the third sample indicated by point 730C and threshold $V_{TH2}$ is crossed at point 717, just prior to the second sample indicated by point 730E. A third sample is still taken, as indicated by point 730F, and a seventh charge transfer process is still performed even though the second sample indicated that the voltage had already crossed threshold $V_{TH2}$. However, such additional samples may provide an added advantage, particularly when multiple sensing channels are measured using a common integrating capacitance, in that the slope direction is relatively constant across channels, even though the measured capacitance may vary from channel to channel. Such embodiments may also provide other advantages such as in improved rejection of incorrect readings of a threshold voltage having been crossed.

It should also be noted that the measurements 730A-F are shown as taken during later parts of each time period 701, 702 when the possibility that the voltage on the integrating capacitance will have crossed the applicable threshold is greater, and not during the earlier part of each time period when this possibility is low. With such an approach, the timing of charging pulses 711 and 712 can be faster and the pulses more frequent during periods when the voltage on integrating capacitance is not measured. At least the time associated with measuring can be removed for such performances, and the sample rate for the measured capacitance increased. The timing of the samples can also be varied between repetitions or between determinations (or measurements) of one or more of the plurality of measurable capacitances to improve noise immunity (e.g. pseudo random or variations in timing between repetitions broadens the signal bandwidth while reducing sensitivity to narrow band interferers).

FIG. 7 shows this additional optional feature in that the pulses 711 and 712 used to charge and discharge measurable capacitance need not be equally spaced in time, and are more frequent earlier in the periods 701, 702. As shown in FIG. 7, the charging and discharging pulses applied to measurable capacitance are initially applied fairly rapidly to speed the sensing process, while later the pulses are applied more slowly to ensure complete sharing of the charge on the measurable capacitance and sufficient time for accurate measurement. In other embodiments, the measurement period may be faster than the non-measurement period, as appropriate. Charging and discharging pulses 711, 712 (or any other charging pulse) can also vary in timing for other reasons, and they need not be equally spaced in time or be of equal duration.

As discussed above, another capacitance measurement technique that can be used in the embodiments of the invention is referred to generally as "sigma delta" (or delta sigma). In general, the term sigma delta relates to capacitance detection method that incorporates summation (sigma) and difference (delta) of electrical charge to quantify an electrical effect that is exhibited by an electrode or other electrical node. Typically, an integrating capacitance accumulates charge transferred from the measurable capacitance from multiple charge sharing events. Additional electrical charge having an opposing sign to the charge received from the measurable capacitance is also applied in quantized pre-set quantities to maintain the integrated charge near a known level (most generally quantized charges of both signs may be used). That is, a quantized amount of charge is appropriately subtracted or added from the integrating capacitance to maintain the filter output near the desired level. By digitally filtering (e.g. by averaging, summation, higher order finite impulse response, infinite impulse response, or Kaiser filters, etc.) the quantized charge(s) applied to the integrator, the amount of charge transferred by the measurable capacitance can be ascertained. This capacitance value, in turn, can be used to identify the presence or absence of a human finger, stylus or other object in proximity to the sensed node in a proximity sensor device, and/or for any other purpose.

Figure 8:
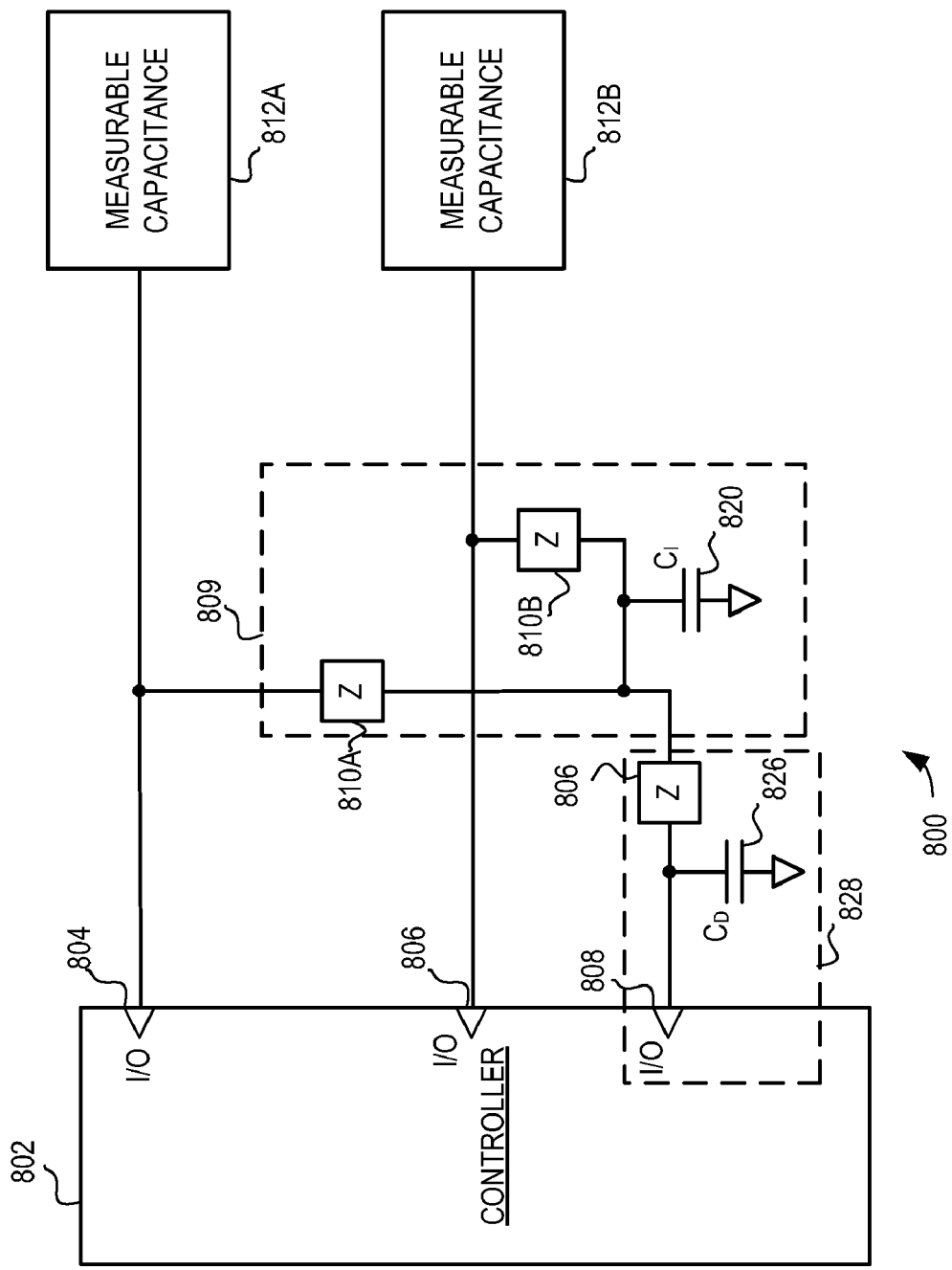
FIG. 8 is a schematic view of a capacitive sensor using sigma delta capacitive detection in accordance with an embodiment of the invention sharing a delta capacitance and an integrating capacitance.

Turning now to FIG. 8, an embodiment of a capacitive sensor 800 is illustrated. In general, the capacitive sensor 800 uses sigma-delta measurement techniques implemented in a controller to measure capacitance, and shares components to reduce device complexity and improve performance. The capacitive sensor 800 includes a passive network 809 coupled to the measurable capacitances 812A-B, the passive network 809 including an integrating capacitance 820 configured to store charge received from the measurable capacitances 812A-B. Additionally, the capacitive sensor 800 includes a charge changing circuit 828 coupled to passive network 809, where the charge changing circuit comprises a delta capacitance 826. Note that simple charge changing circuits typically comprise one or more switches (e.g. I/Os) and one or more passive components (e.g. capacitor, resistor, etc.). Note that timed current sources, switched capacitor charge pumps and a variety of other more complex methods could also be used to generate quantized charge deltas (e.g. an additional I/O and passive impedance along with a differently sized CD could provide more differently quantized amounts of charge changing). A controller 802 includes two I/Os 804 and 806 coupled to the measurable capacitances 812A and 812B respectively. During operation of capacitive sensor 800, a voltage is repeatedly applied to a selected measurable capacitance 812 using a corresponding I/O, and charge is repeatedly shared between the selected measurable capacitance and the passive network 809 to accumulate charge on the integrating capacitance 820. Furthermore, the charge on the integrating capacitance 820 is repeatedly changed by a quantized amount of charge using the delta capacitance 826, with this charge changing responsive to the charge on the integrating capacitance 820 being past a threshold level. The results of the charge threshold detection are a series of quantized measurements of the charge on the integrating capacitance 820, which can be filtered to yield a measure of the measurable capacitance 812.

In the illustrated embodiment, the passive network 809 in general, and the integrating capacitance 820 specifically, are shared between two sensing channels, where each of the sensing channels corresponds to one of the measurable capacitances 812A-B. Furthermore, the charge changing circuit 828 generally including I/O 808 and delta capacitor 826 specifically is likewise shared between the two sensing channels. It should be noted that for the passive network 809 to be considered as being shared by multiple sensing channels it is not required that all elements of the passive network 809 be shared. Instead, it is sufficient that one element (e.g., the integrating capacitance 820) be shared between channels. Nor is it required that the passive network 809 be shared between all channels on the capacitive sensor. Instead, it is sufficient that the passive network 809 be shared between any of the channels on the capacitive sensor. Similarly, an I/O used for measurement (quantization) of the charge on the integrating capacitor 820 may be made by a shared I/O 808, by the unshared I/Os 804 and 806 associated with each of the measurable capacitances 812A-B respectively, or a variety of other combinations.

As stated above, the capacitive sensor 800 includes a passive network 809 and a delta capacitance ($C_D$) 826 to charge and discharge into an integrating capacitance ($C_I$) 820 as appropriate. Also, in this embodiment, passive network 809 is implemented with an integrating capacitance 820 and passive impedances 810A, 810B. The passive impedances (including 806) server to transfer charge applied to the capacitances 812A-B and 826 while isolating the integrating capacitance from short charging pulses on the I/Os 804, 806, and 808. Integrating capacitance 820 is shown implemented with a conventional capacitor configured as an imperfect integrator. The integrating capacitance has a capacitance that is larger, and often significantly larger (e.g. by one or more orders of magnitude), than the value of the delta capacitance 826 and the expected value of measurable capacitances 812A-B. In various embodiments, for example, measurable capacitances 812A-B and delta capacitance 826 may be on the order of picofarads while the integrating capacitance 820 is on the order of nanofarads, although other embodiments may incorporate widely different values for the particular capacitances. The integrating capacitance could comprise multiple capacitances 820A&B and similar to integrating capacitances 310A&B in FIG. 3B provide voltage conditioning to the integrating capacitance.

It should be noted that while in the illustrated embodiment, the passive network 809 includes the integrating capacitance 820 and the passive impedances 810A and 810B that this is just one example implementation. In other embodiments incorporating additional switches, the passive network 809 is simply an integrating capacitance 820, which can be a single capacitor. Alternatively, the passive network 809 may contain any number of resistors, capacitors and/or other passive elements as appropriate, and a number of examples of passive networks are described below Measurable capacitances 812A-B are typically the capacitance created by sensor electrodes, where the capacitance varies according to the proximity of objects to the electrode. For sensor devices that measure input from one or more fingers, styli, and/or other stimuli, measurable capacitance 812 often represents the total effective capacitance from a sensing node to the local ground of the system ("absolute capacitance"). The total effective capacitance for input devices can be quite complex, involving capacitances, resistances, and inductances in series and in parallel as determined by the sensor design and the operating environment. For some sensor constructions where electrodes are constructed of high resistance conductors such as ITO or carbon ink the resistances could be significant. Resistances may be added between distributed measurable capacitances connected to separate integrating capacitances such that the proportion of charge transferred to integrating capacitance is in inverse proportion to that resistance. In other cases, measurable capacitance 812 may represent the total effective capacitance from a driving (transmitting) node to a sensing node (generally referred to as "transcapacitance"). This total effective capacitance can also be quite complex. In either case, a charging voltage referenced to the local system ground can be initially applied to the measurable capacitance 812, as described more fully below, and measurable capacitance 812 is then allowed to share charge with the passive network 809.

In one operating technique a charge transfer process allows charge from measurable capacitance 812 to be transferred to integrating capacitance 820, and for opposing charge from delta capacitance 826 to adjust the level of charge held by integrating capacitance 820. When the voltage at I/O 808 is below a threshold voltage the delta capacitance 826 is charged, and the integrating capacitance 820 coupled to the delta capacitance 826 by passive impedance 806 shares charge with it. A quantized charge from delta capacitance 826 is transferred to integrating capacitance 820, thereby producing a change in voltage at the integrating capacitance 820 measurable at I/O 808 to move it towards a measurement threshold (though it could also be driven past it). After an initial startup period, the voltage will be driven to approximate the comparator voltage by this negative feedback which results in charge being added to or subtracted from the integrating capacitance 820 by the delta capacitance 826 to balance the charge shared from the measurable capacitance. This process may continue with or without charge transfer from measurable capacitances 812A-B It should be noted that in the illustrated embodiment, no direct action is required to share charge between measurable capacitances 812 and the integrating capacitance 820. Instead, only a pause with sufficient time to allow transfer is needed. It should also be noted that although the measurable capacitances 812 may be statically coupled to the integrating capacitance 820, charge sharing between capacitances can be considered to substantially begin when the charging step ends (e.g., when the applying of voltage to the measurable capacitance ends). Furthermore, the charge sharing between capacitances can be considered to substantially end when the voltages at the capacitances are similar enough that negligible charge is being shared. Charge sharing can also substantially end with the next application of a voltage because the low impedance charging voltage being applied dominates. Thus, even in a passive sharing system where the filter capacitance is always coupled to the measurable capacitance, the low impedance of the applied voltage source makes the charge on the measurable capacitance that would be shared negligible until the applied voltage is removed. Clearly, active switches may also be used in place of the passive impedances, as well.

When charge from measurable capacitance 812 is effectively transferred to the passive network 809, the charge on the passive network 809 is appropriately measured and changed if the amount of charge is determined to be past a suitable threshold value. Charge measurement may take place in any manner. In various embodiments, the voltage on passive network 809 representative of that charge is obtained from an input/output (I/O) pin (e.g. 808) of a microcontroller or other device. In a simple embodiment, a CMOS (or TTL) digital input acts as a comparator (1-bit quantizer) with a reference voltage equal to the threshold level of the digital input.

In the embodiment illustrated in FIG. 8, the integrating capacitance 820 is not directly connected to an I/O of the controller. However, the voltage at an I/O 808 can be used as the representation of the charge on integrating capacitance 820, and thus the charge on the integrating capacitance 820 can still be effectively measured at I/O 808 by sharing the quantizer. For example, the voltage at I/O 808 can be compared to a threshold voltage $V_{TH}$. This threshold voltage could be $\sim V_{DD}/2$ fro a CMOS input, or a variety of other levels, and alternately, the voltage could be measured at I/O 804 or 806.

As the charge on the passive network 809 passes an appropriate threshold value, a "delta" charge that opposes the charge shared from the measurable capacitance 812 is applied (e.g. via delta capacitance 826) to change the charge on the passive network 809. In this manner, the charge on passive network 809 can be maintained to what is needed for the associated voltage on passive network 809 to approximately equal the threshold value ($V_{TH}$), if the measurable capacitance 812 is within range. That is, because of negative feedback, the voltage across (and thus the charge on) the integrating capacitance 820 remains approximately constant during operation due to the control loop.

Figure 9A:
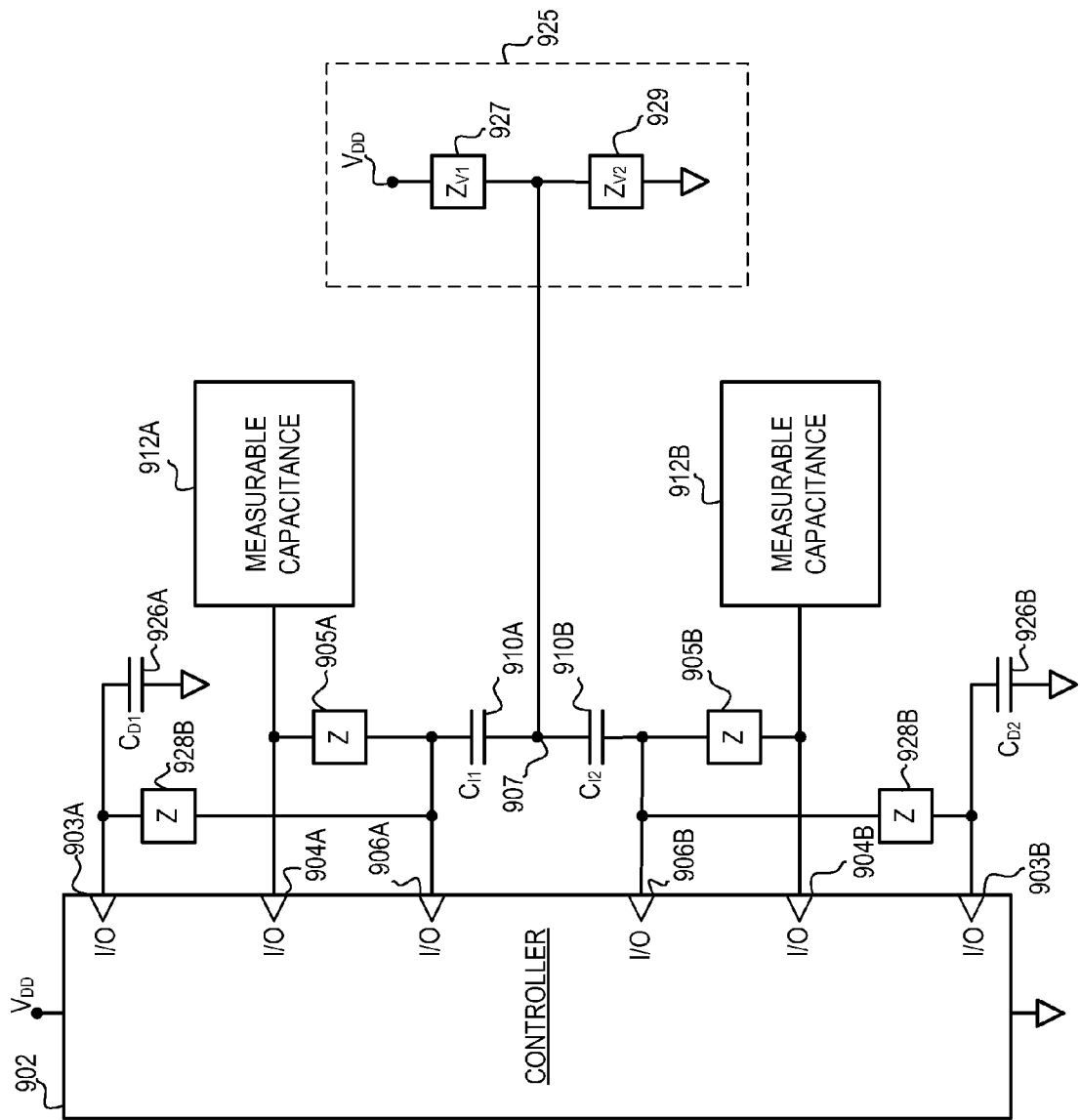
FIGS. 9A-9C are schematic views of capacitive sensors using sigma delta capacitive detection in accordance with an embodiment of the invention sharing voltage conditioning.

The voltage application, charge transfer, charge changing and/or other steps may be individually and/or collectively repeated any number of times to implement a number of useful features. For example, by obtaining multiple quantized values of measurable capacitance 812, the measured values can be readily decimated, filtered, averaged, differenced, and/ or otherwise digitally processed within the control circuitry to reduce the effects of noise, to provide increasingly reliable measurement values, and/or the like. By changing the charge multiple times the size and quantization of the charge changing network can be varied. By varying the timing of the application of voltage to the measurable capacitance the sampling frequency of the sensor can be varied to improve noise performance Turning now FIG. 9A, another embodiment of a capacitive sensor 900 is illustrated. In this embodiment the capacitive sensor 900 shares a voltage conditioning circuit 925 that is adapted to provide a variable reference voltage. For example, a variable reference voltage that varies with a threshold voltage of the controller 902. This embodiment does not, however, share a passive network or an integrating capacitance (although it could by adding additional passive networks to share either integrating capacitance), and instead uses a plurality of integrating capacitances 910.

Like sensor 800, the capacitive sensor 900 uses sigma-delta measurement techniques implemented in a controller to measure capacitance, and shares components to reduce device complexity and improve performance. The capacitive sensor 900 includes two passive networks coupled to the measurable capacitances 912A-B, with each passive network comprising an integrating capacitance 910 configured to store charge received from the measurable capacitances 912A-B, and respective passive impedance 905A-B. Additionally, the capacitive sensor 900 includes charge changing circuits coupled to passive networks, where each charge changing circuit comprises a delta capacitance 926 and another passive impedance 928.

A controller 902 includes two I/Os 904 coupled to the measurable capacitances 912, two I/Os 906 coupled to he integrating capacitances 910, and two I/Os 903 coupled to the delta capacitances 926. During operation of capacitive sensor 900, a voltage is repeatedly applied to a selected measurable capacitance 912 using a corresponding I/O, and charge is repeatedly shared between the selected measurable capacitance 912 and the integrating capacitance 910 to accumulate charge on the integrating capacitance 910. Furthermore, the charge on the integrating capacitance 910 is repeatedly changed by a quantized amount of charge using the delta capacitance 926, with this charge changing responsive to the charge on the integrating capacitance 910 being past a threshold level. The results of the charge threshold detection are a quantized measurement of the charge on the integrating capacitance 910, which can be filtered to yield a measure of the corresponding measurable capacitance 912. It should be noted that the two sensing channels corresponding to measurable capacitances 912A-B respectively, may be operated concurrently, sequentially, or in a variety ways.

In the illustrated embodiment, a voltage conditioning circuit 925 is shared between the two measurable capacitances 912A-B. The voltage conditioning circuit 925 includes a first impedance 927 and a second impedance 929 coupled as an impedance divider (e.g. a voltage divider) between $V_{DD}$ and ground. As such, the voltage conditioning circuit 925 provides a variable reference voltage to node 907. In one specific embodiment, the voltage conditioning circuit 925 provides a voltage that varies with a threshold voltage of the controller 902.

Specifically, the voltage conditioning circuit 925 is coupled to the side of integrating capacitances 910 opposite the measurable capacitances 912, and to either or both power supply rails (coupling to $+V_{DD}$ and ground) associated with the implementation of capacitance sensor 900. With the configuration shown in FIG. 9, fluctuations in the supply rails (also "supply voltage ripple") induce similar fluctuations in the voltage at node 907, and therefore can be used to compensate for fluctuations in thresholds associated with controller 902 induced by the same supply voltage ripple.

For compensation circuit 925 shown in FIG. 9, the impedance divider can be a voltage divider formed from two resistances or two capacitances coupled to $+V_{DD}$ and ground. The impedance divider of circuit 925 has a "common node" coupled to the integrating capacitances 910A-B at node 907. Resistive versions of impedances 927 and 929 can comprise resistors to form a resistive divider network, and capacitive versions of impedances 927 and 929 can comprise capacitors to form a capacitive divider network. By selecting appropriate values for impedances 927 and 929, the integrating capacitances 910 can be biased toward any voltage that lies between the two supply voltages. Moreover, variations in supply voltage will be automatically compensated by the voltage conditioning (compensating) circuit 925. This is because such a voltage divider provides a voltage that reflects the fluctuations in a power supply voltage ratiometrically with appropriate lag relative to the compensated threshold variation.

Of course, this is just one example of the type of voltage conditioning circuit that can be shared between measurable capacitances in a capacitive sensor. It should also be noted that while the voltage conditioning circuit 925 is illustrated as being shared between two measurable capacitances 912A-B, that this concept can be expanded to share the voltage conditioning circuit 925 between more measurable capacitances to further enhance device efficiency.

Figure 9B:
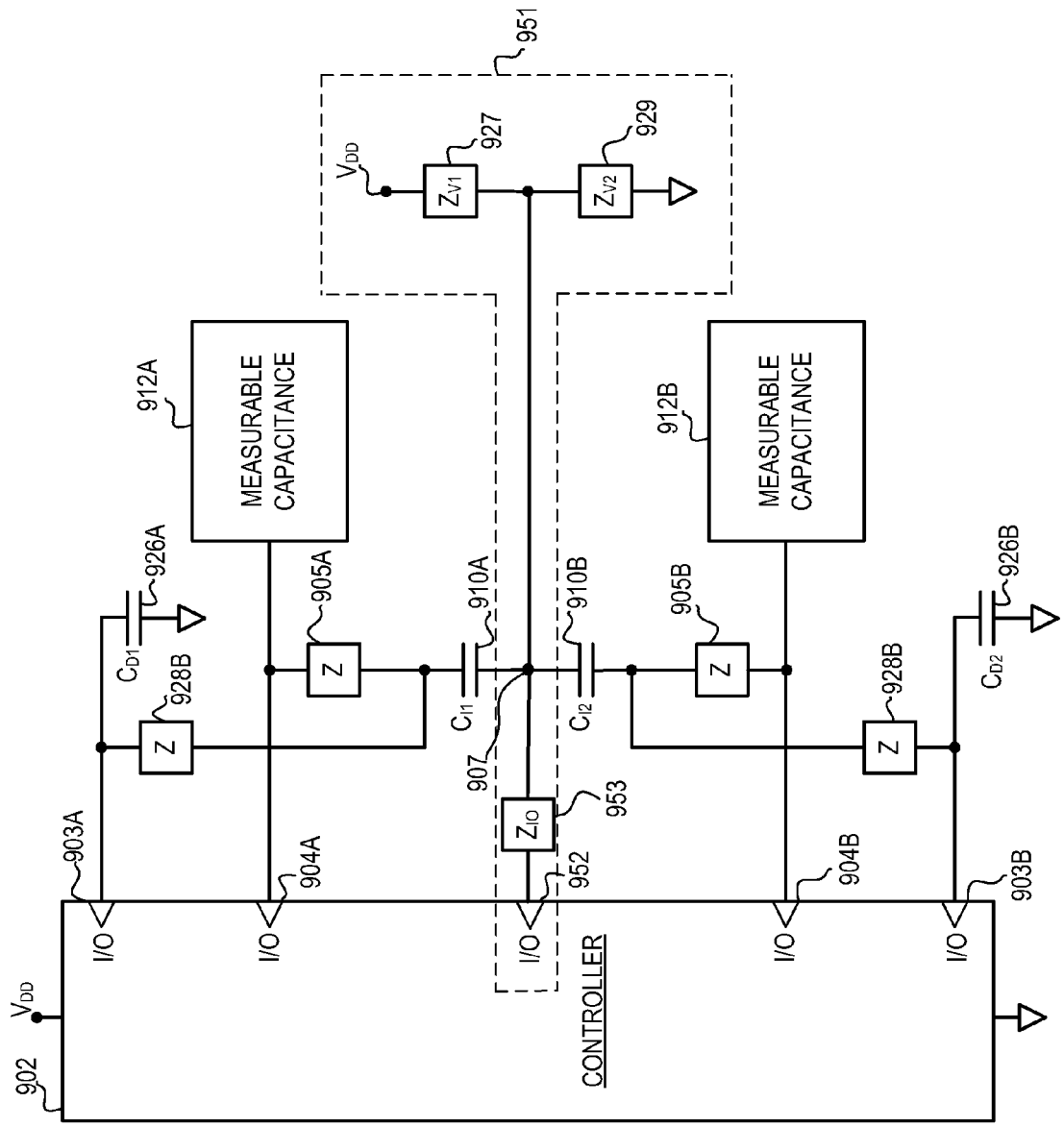

Turning now to FIG. 9B, another embodiment of a capacitive sensor 900 is illustrated. Like the sensor 900, the capacitive sensor 950 includes a voltage conditioning circuit 951 that is shared between the two measurable capacitances 912A-B. The voltage conditioning circuit 951 includes a first impedance 927 and a second impedance 929 coupled as a voltage divider between $V_{DD}$ and ground. The voltage conditioning circuit also includes I/O 952 coupled to node 907 through an I/O impedance 953. Like the voltage conditioning circuit 925 of FIG. 9A, the voltage conditioning circuit 951 provides a variable reference voltage to node 907 that varies with a threshold voltage of the controller 902

Additionally, the I/O 952 and I/O impedance 953 allows the compensated voltage that is applied to node 907 to be dynamically changed responsive to a change in the output of I/O 952. For example, if the first impedance 927, the second impedance 929, and the I/O impedance 953 all have the same value, then the compensated voltage provided to node 907 will be approximately ⅔ $V_{DD}$ when I/O 952 is driven high, and will be approximately ⅓ $V_{DD}$ when I/O 952 is driven low. This can be useful in applications where I/O thresholds may change (e.g. Schmitt inputs with hysteresis) or to move the voltage on the measurement I/O away from a threshold during part of the measurement cycle.

Furthermore, the I/O 952 can serve as a reference for the other I/Os. Specifically, because the changes in the threshold voltage of the measuring I/Os 904A and 904B are tracked by changes in the threshold voltage of I/O 952, the use of I/O 952 can be used to control the voltage on node 907 and thus compensate for changes in other threshold voltages. This means that variations in the threshold voltage of I/Os 904A and 904B will not effect the measurement of the capacitance so long as they track I/O 952 sufficiently closely.

Figure 9C:
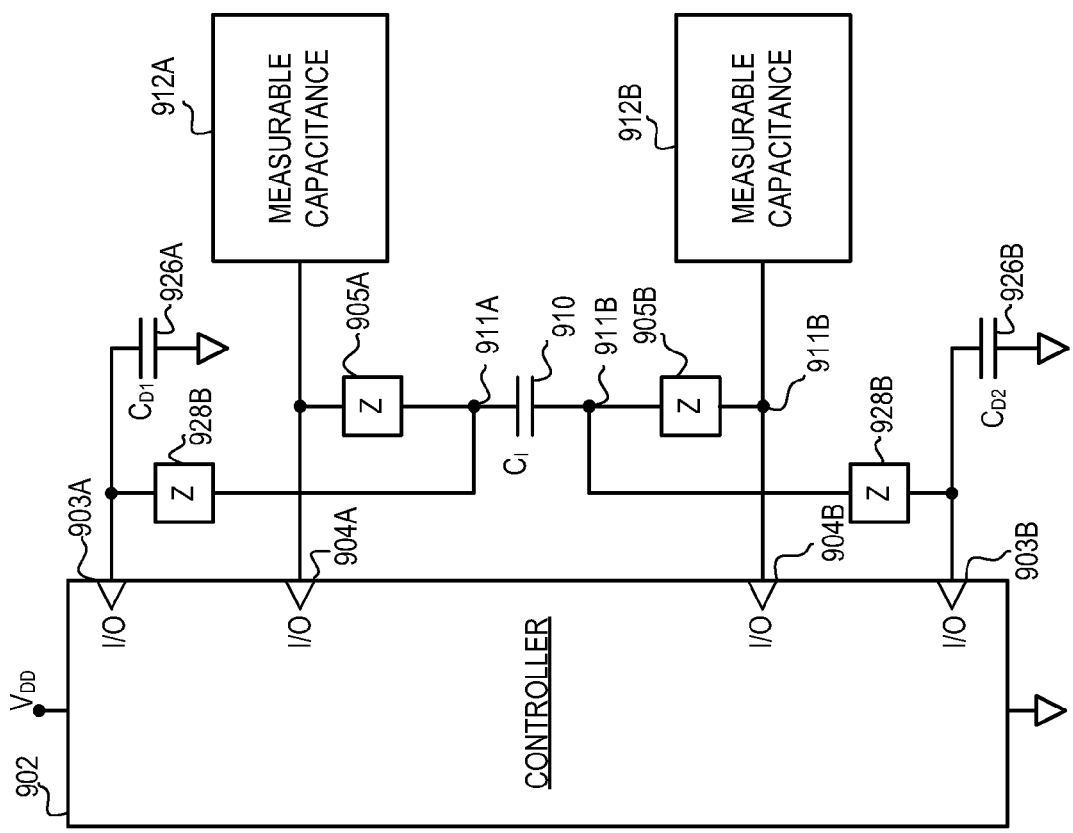

Turning now to FIG. 9C, another embodiment of a capacitive sensor 975 is illustrated. In this embodiment, instead of including a separate voltage conditioning circuit (e.g., circuit 925 of FIG. 9A and circuit 951 of FIG. 9B) shared voltage conditioning for one measurable capacitance 912A-B is provided by the passive impedances and I/Os corresponding to the other measurable capacitance 912A-B. Specifically, by driving I/O 903A to $V_{DD}$ and driving I/O 904A low the node 911A is driven to ½ $V_{DD}$. Likewise, by driving I/O 903B to $V_{DD}$ and driving I/O 904B low the node 911B is driven to ½ $V_{DD}$. It should be noted that in this embodiment the integrating capacitance 910 is shared between both measurable capacitances 912A-B. Thus, the measurable capacitances 912A-B are configured to be measured alternately with the passive impedances and I/Os of one side (e.g. corresponding to measurable capacitance 912B) providing the voltage conditioning circuit for the other (e.g. corresponding to measurable capacitance 912A). Thus, the different elements of a sensor can be shared with other sensors even if the elements server different purposes at different times.

Figure 10A:
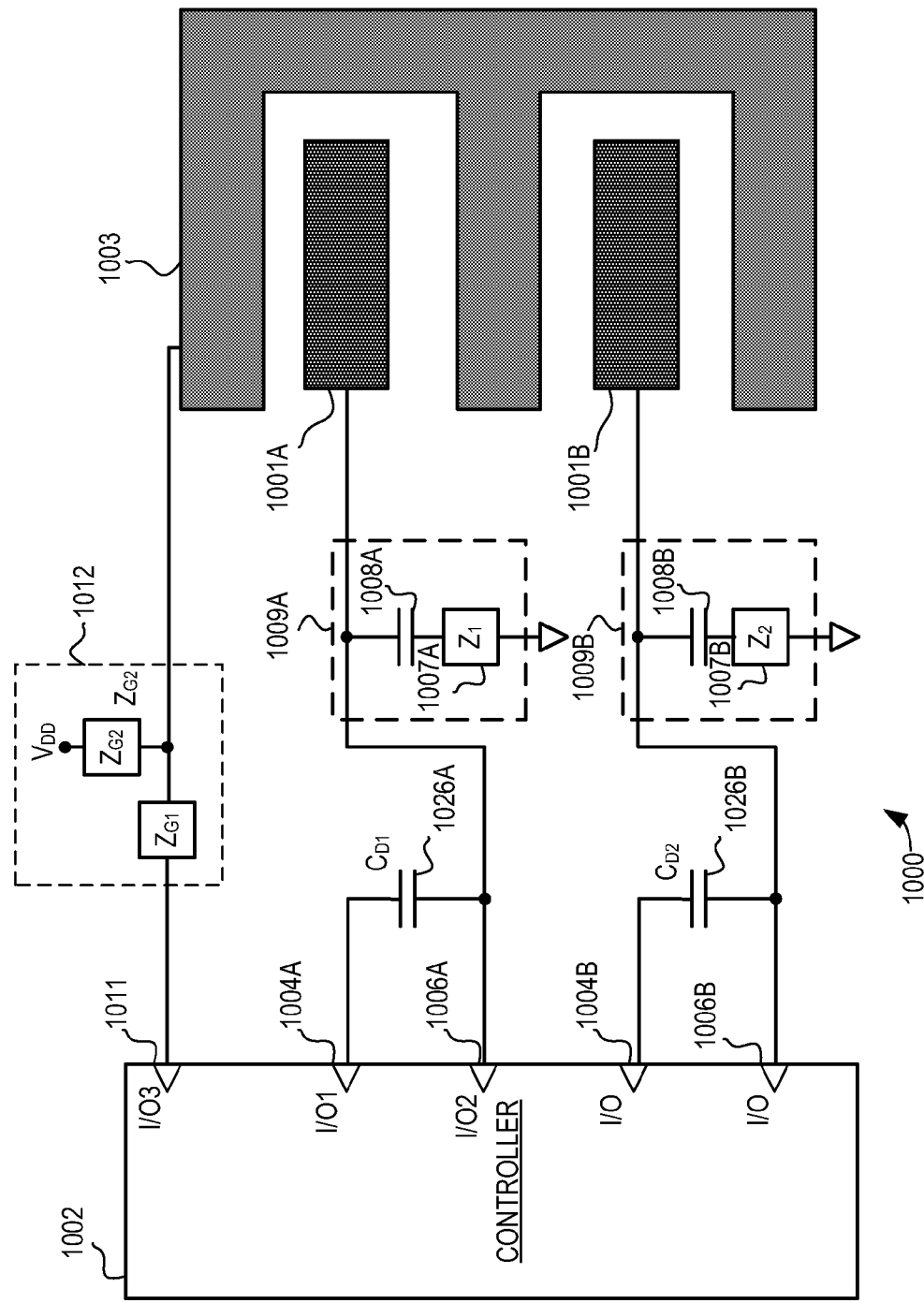
FIGS. 10A-10C are schematic views of capacitive sensors using sigma delta capacitive detection in accordance with an embodiment of the invention sharing a guarding electrode.

Again, the embodiment illustrated in FIG. 9 is just one example of how shared components can be used in a capacitance sensor. Turning now to FIG. 10A, another embodiment capacitive sensor 1000 is illustrated. In this embodiment the capacitive sensor 1000 shares a guarding electrode 1003 that is providing a guard signal during at least a portion of the time in which voltage is applied to sensing electrodes 1001 and during at least a portion of the time in which the electrodes share charge with an integrating capacitance in a passive network. This embodiment does not, however, share an integrating capacitance, and instead uses a plurality of integrating capacitances 1008.

Like the embodiment illustrated in FIGS. 8-9, the capacitive sensor 1000 is adapted to use sigma-delta measurement techniques implemented in a controller to measure capacitance, and shares components to reduce device complexity and improve performance. The capacitive sensor 1000 is coupled to two electrodes 1001A-B that provide measurable capacitances that vary with the proximity of objects to the electrodes 1001A-B. Additionally, the capacitive sensor 1001 includes two passive networks 1009, with each passive network 1009 including a passive impedance 1007 and an integrating capacitance 1008 configured to store charge received from the electrodes 1001. Furthermore, the capacitive sensor includes two delta capacitances 1026 adapted to selectively change charge on the passive networks 1009.

The controller 1002 includes two I/Os 1006A-B coupled to the electrodes 1001A-B and to the passive networks 1009A-B, and two I/Os 1004A-B coupled to the delta capacitances 1026. During operation of capacitive sensor 1000, a voltage is repeatedly applied to an electrode 1001 using a corresponding I/O 1006, and charge is repeatedly shared between the selected electrode 1001 and the passive network 1009 to accumulate charge on the integrating capacitance 1008. The voltage on the integrating capacitance can be measured by a threshold of I/O 1006 as representative of the accumulated charge on 1008 through passive impedance 1007 (although I/O 1004 might also be similarly used). Furthermore, the charge on the integrating capacitance 1008 is repeatedly changed by a quantized amount of charge using the charge changing circuit comprising delta capacitance 1026 and I/O 1004, with this charge changing responsive to the charge on the integrating capacitance 1008 being past a threshold level. The results of the charge threshold detection are a quantized measurement of the charge on the integrating capacitance 1008, which can be filtered to yield a measure of the corresponding measurable capacitance created by the electrode 1001.

This embodiment also includes a guarding electrode 1003 that serves to shield the sensor electrodes 1001 from unintended electrical coupling. In the embodiment shown in FIG. 10, individual sensing electrodes 1001A-B are used to capacitively detect the presence of an object and thus provide their respective measurable capacitances. During operation, a guarding signal is provided on the guarding electrode 1003 using I/O 1011. The guarding signal helps to shield the sensor electrodes 1001 from unintended coupling with the environment and helps to reduce the net charge transferred from the guarding electrode 1003 onto integrating capacitances 1008 during the course of the charge transfer processes. During a portion of the applying of the pre-determined voltage, the guard signal can apply a voltage to the guarding electrode 1003 approximately equal to the voltage applied to the pre-determined voltage. Then, before the charge sharing between the active sensing electrode (e.g., 1001A-B) with its associated integrating capacitance (e.g. 1008A-B) ends, the voltage of the guard signal may be changed to be approximately equal to the voltage on the associated integrating capacitance (e.g. 1008A-B). A constant voltage swing may be chosen to approximate the voltage on the associated integrating capacitance 1008 since the sigma delta feedback loop will keep it near a threshold voltage ($V_{TH}$). The absolute values of the voltages of the guard signal are less important than the voltage swing (i.e. change in voltage) of the guard signal. For example, an offset between the guarding electrode voltage and the sensing electrode voltage would not affect the usefulness of the guard, since for charge transfer through a capacitance, the voltage swing (i.e., change in voltage) is important and the absolute voltage values are not.

These guarding voltages of the guard signal may be generated in any manner, such as by tying the guarding electrode 1003 to a guarding voltage generator circuit of any sort. In the exemplary embodiment shown in FIG. 10A, an impedance divider circuit 1012 suitably produces at least two different values of voltages depending upon the signal applied by I/O 1011 of controller 1002 and the types and values chosen for the components comprising impedance divider circuit 1012. Other implementations of the guarding voltage generator might also comprise active components, and FIG. 10A shows only one simple implementation.

Specifically, an impedance divider composed of a resistive voltage divider can be used. With such a voltage divider, if the signal from I/O 1011 is +$V_{DD}$ or if the I/O 1011 is held at high impedance, the guarding voltage is +$V_{DD}$. Alternatively, if the signal from I/O 1011 is ground, the guarding voltage is a predetermined fraction of $V_{DD}$ such as (+$V_{DD}$)/2. As one example, the guarding voltage of the guard signal is changed between the application of the charging pulses that apply the pre-determined voltage and the subsequent sharing period. Alternate embodiments could implement impedance divider circuits with one or more switches, resistances, inductances, or capacitances for ease of design, ease of production, more effective guard signals, and the like.

Figure 10B:
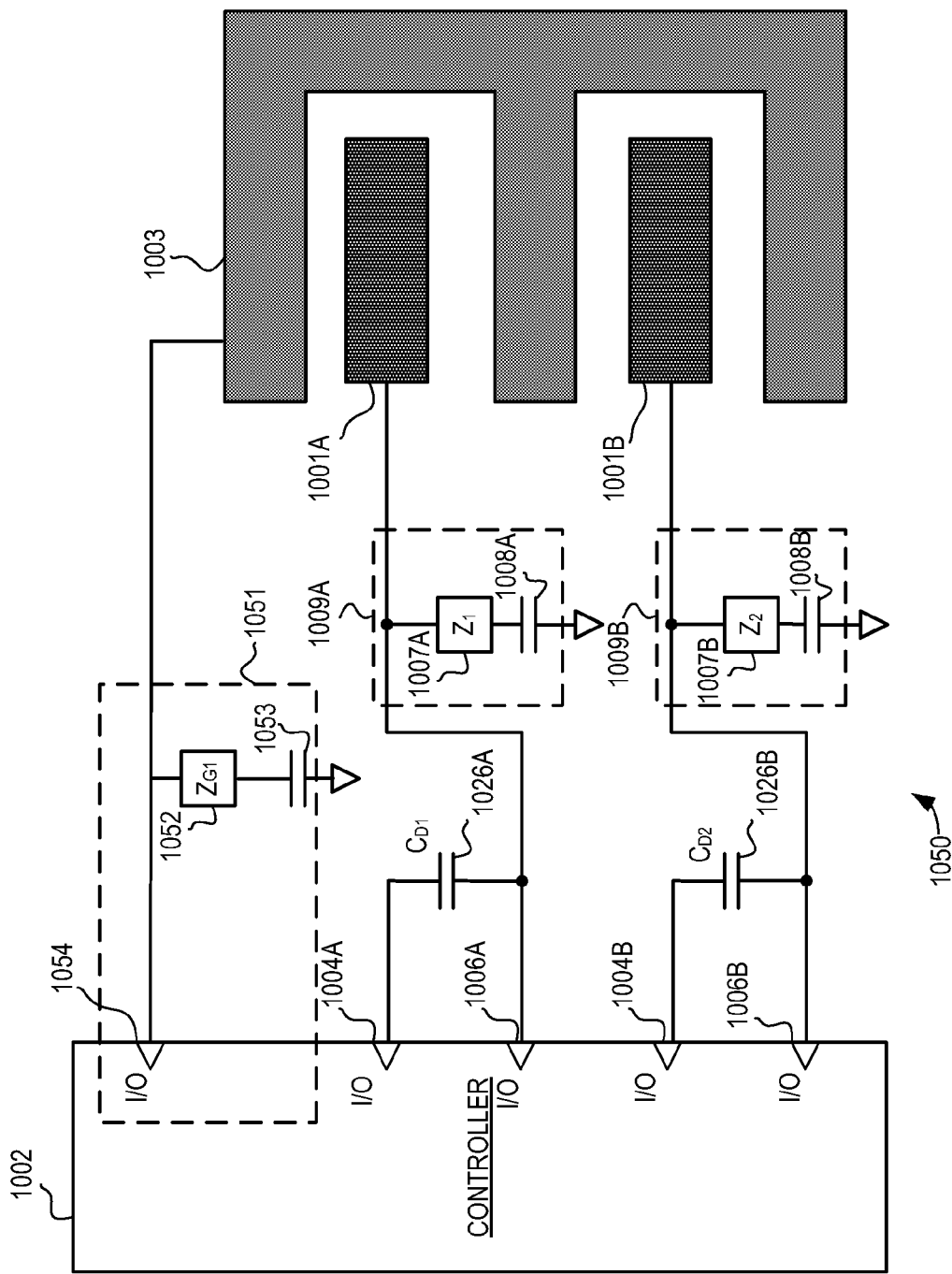

Turning now to FIG. 10B, an alternate embodiment of a capacitive sensor 1050 is illustrated. In this alternate embodiment the guarding voltage generator 1051 is comprised of a passive impedance 1052, a capacitor 1053, and an I/O 1054. The voltage on the guard can be controlled to ground, $V_{DD}$, or to the voltage on the capacitance 1053, which can be controlled and measured to be near a threshold of I/O 1054. Where the series impedance of 1052 and 1053 is low compared to the guarded coupled impedances (comprised of measurable capacitances, isolating impedances, etc), and where a threshold of I/O 1054 tracks other I/O thresholds this should also provide a guard voltage that tracks the threshold voltage of measurement I/Os 1006A and 1006B. Specifically, using I/O 1054 a voltage of $V_{DD}$ is provided. Then, the I/O 1054 is turned to input, allowing the voltage to relax to a voltage that is near the reference voltage of the I/O 1054. Then, short discharging pulses can be provided to remove charge, resulting in a voltage on the guarding electrode 1003 that closely equals the reference voltage of the measurement I/Os 1006A and 1006B. Digital-to-analog converters, pulse-width modulators, buffers, current sources, other active components, and the like can also be used to generate the guard signal. The various charge transfer sensing techniques described herein, coupled with the ease of multi-channel integration, provide for highly efficient application of guard signals.

Figure 10C:
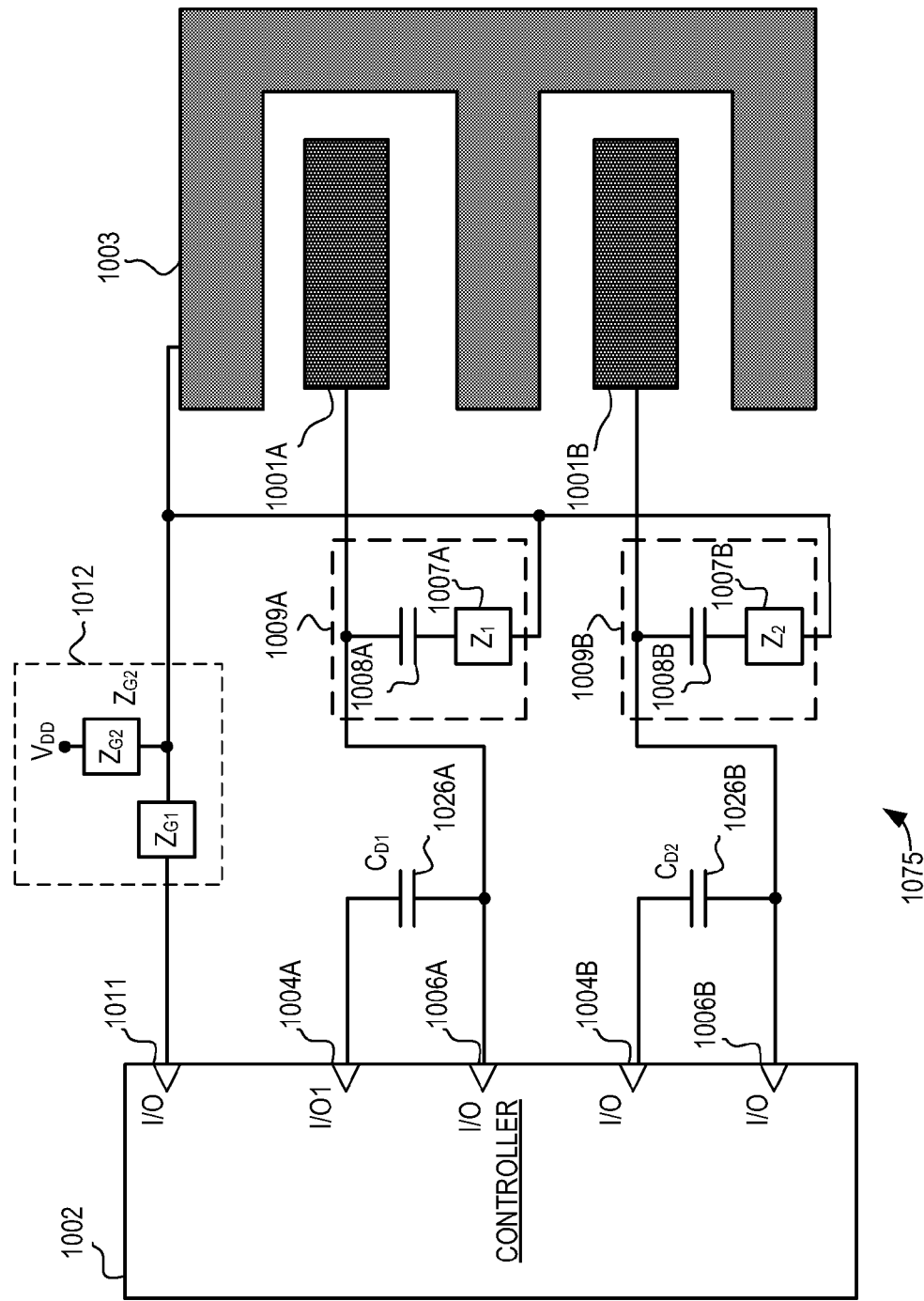

Turning now to FIG. 10C, an alternate embodiment of a capacitive sensor 1075 is illustrated. In this alternate embodiment the guarding voltage generator 1012 is also coupled to the passive networks 1009. Specifically, the guarding voltage generator 1012 is coupled to the integrating capacitances 1008A and 1008B. In this embodiment, the voltage generated by the voltage generator 1012 is used both for guarding and to provide a conditioned voltage to the integrating capacitances.

It should be noted that while the embodiments illustrated in FIGS. 8-10 each illustrate a different type of component sharing, that in other embodiments the different types of component sharing can be combined. As examples, in some embodiments both the passive network and the voltage conditioning circuit may be shared, while in other embodiments all three types of components may be shared. Furthermore, the various type of sharing can be implemented to share components over different combinations of sensing channels. For example, the passive network and integrating capacitances can be implemented to be shared between four channels, while a voltage conditioning circuit is implemented to be shared over twenty channels, and while the guarding electrode is implemented to be shared over all electrodes. Thus, different levels of sharing can be implemented for the different components in the same sensing device. Again, these are just some example of the types of ways in which component sharing can be provided.

Figure 12:
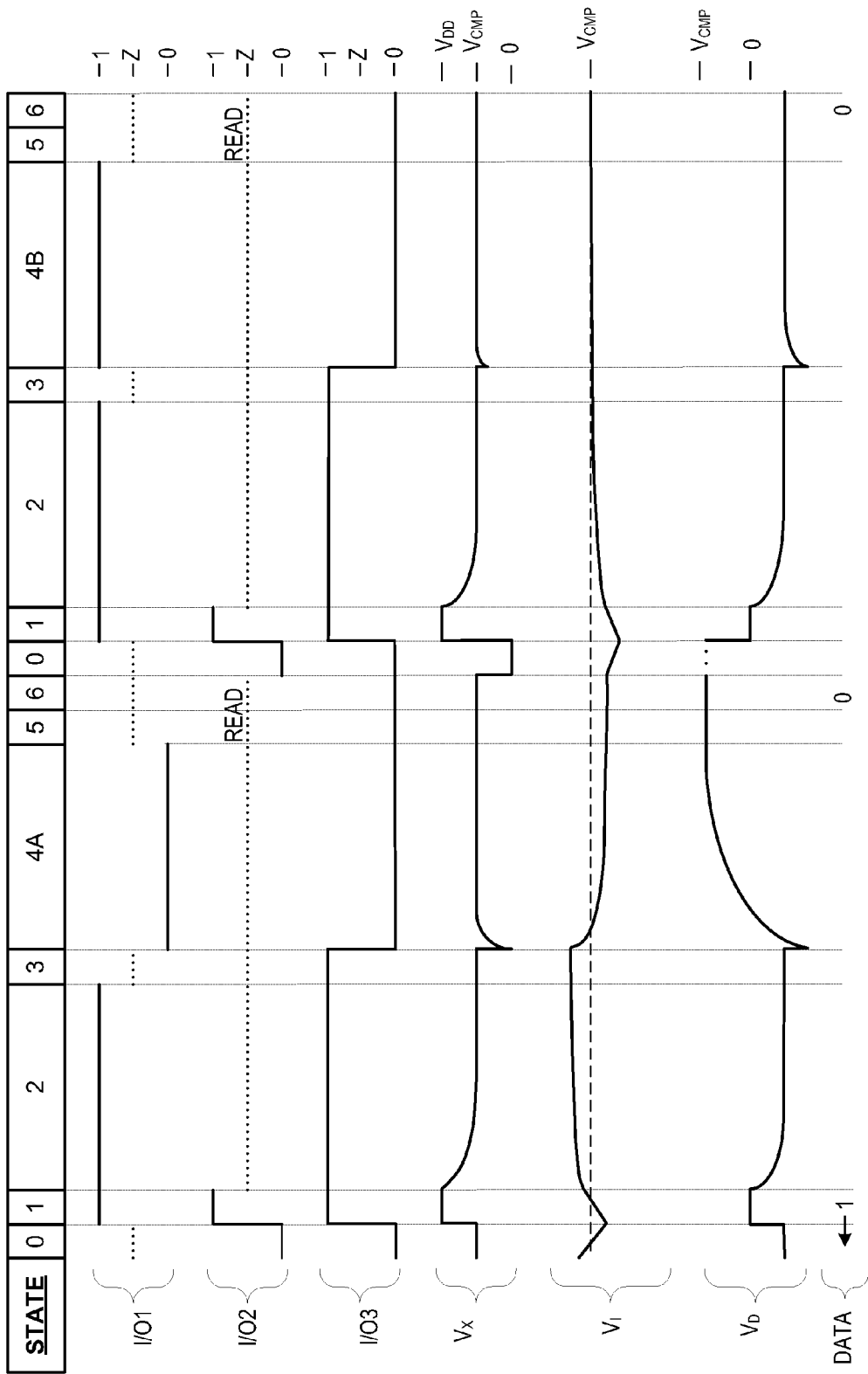
FIG. 12 is a timing diagram illustrating operation of a sigma delta capacitive sensor in accordance with an embodiment of the invention.

One technique for operating a sigma delta capacitive sensor is illustrated in FIGS. 11 and 12. Specifically, FIG. 11 illustrates a state diagram and FIG. 12 illustrates corresponding a timing diagram, including voltage traces for the measurable capacitance $V_X$, the integrating capacitance $V_I$, and the delta capacitance $V_D$, for a sensor like that shown in FIG. 10A. It should be noted that the illustrated examples are for one channel (e.g., for one measurable capacitance) and that the process would typically be repeated for each additional channel. In state 1, the measurable capacitance is charged and the delta capacitance is cleared by driving the corresponding controller I/Os (e.g. I/O 1&2) to a known (high) logic state. In state 2, charge is subsequently trapped on the measurable capacitance by bringing the I/O (e.g. I/O 2) coupled to the measurable capacitance to a high impedance state, and sufficient delay time is subsequently allowed for charge to share (e.g. charge or discharge) from the measurable capacitance to integrating capacitance through any isolating impedances. In states 4A and 4B, after charge is shared from measurable capacitance, "delta" charge from delta capacitance is applied or not applied (or in other embodiments applied in different polarities) based upon the voltage measured on the integrating capacitance by charge changing circuit (e.g. comprising $C_D$ 1026 and I/O1 1004A). In the example shown, the voltage level used in determining whether "delta" charge is applied was obtained from a prior iteration of the sigma-delta process (e.g. previous state 6). In other embodiments, voltage may be measured (such as during state 3) just prior to application and sharing of "delta charge," or at other points in the detection process. In state 5, the changed charge is then trapped on the integrating capacitance by again setting the I/O's (e.g. I/O 1) to a high impedance state. Then, in state 6, the charge on the integrating capacitance can be measured by comparing the voltage at the I/O to a reference voltage (e.g. a CMOS threshold of I/O 2). When the data has been quantized it may be stored, and the data may be summed, filtered, decimated or otherwise processed as appropriate to determine a value of the measurable capacitance.

Figure 13:
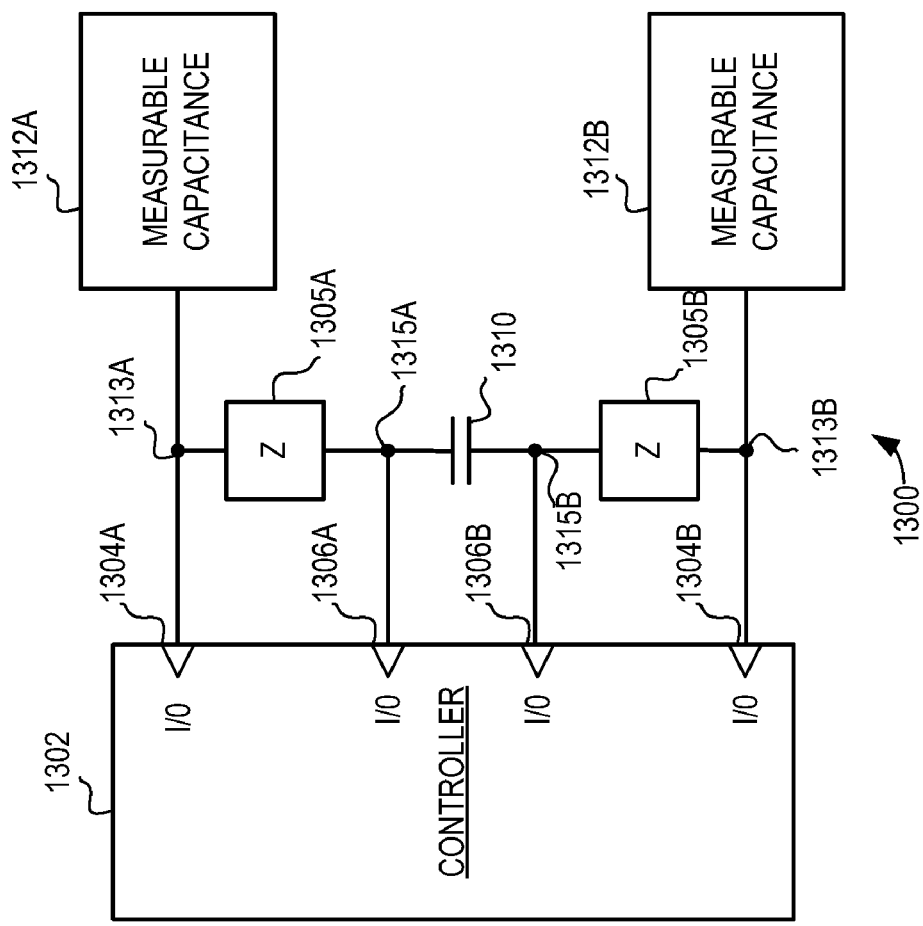
FIG. 13 a schematic view of a capacitive sensor using charge transfer in accordance with an embodiment of the invention sharing an integrating capacitance.

Thus, FIGS. 3-12 provide various embodiments of capacitive sensors that share components to improve device efficiency. However, these are just a few examples of the type of capacitive sensors that can be implemented with component sharing. For example, turning now to FIG. 13, another embodiment of a capacitive sensor 1300 is illustrated. In the illustrated embodiment, a passive network comprising an integrating capacitance 1310 is shared between two sensing channels, where each of the sensing channels corresponds to one of the measurable capacitances 1312A-B. In this embodiment the two measurable capacitances 1312A-B are measured alternately using the shared integrating capacitor 1310. Specifically, one side of the integrating capacitor 1310 is driven to a low impedance (e.g. by I/O 1306A) while the other measurable capacitance on the other side (e.g., measurable capacitance 1312B) is measured using I/Os 1306B and 1304B. Then the other side of the integrating capacitor 1310 is driven to a low impedance (e.g. by I/O 1306B) while the other measurable capacitance on the other side (e.g., measurable capacitance 1312A) is measured using I/Os 1306A and 1304A.

Figure 14:
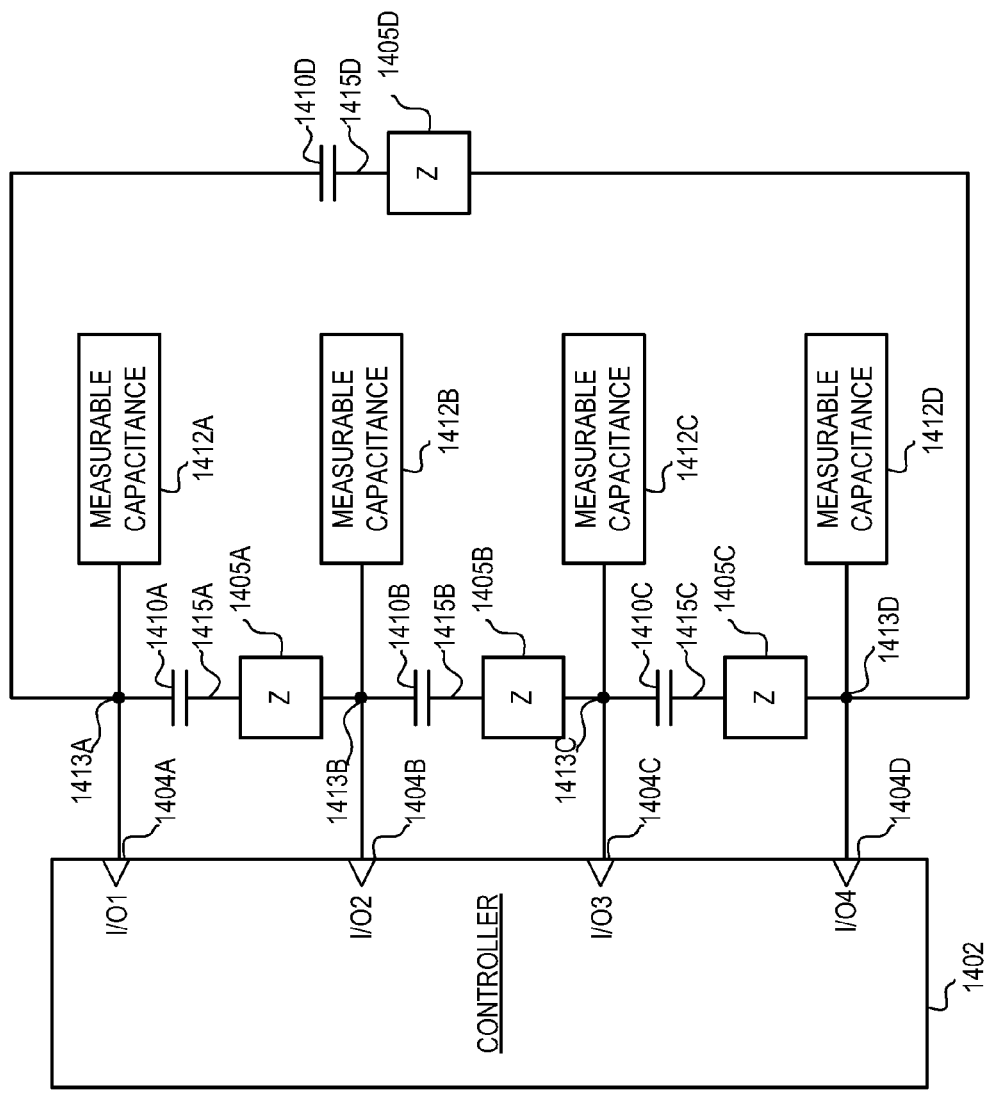
FIG. 14 is a schematic view of a capacitive sensor using charge transfer in accordance with an embodiment of the invention sharing integrating capacitances.

Turning now to FIG. 14, another embodiment of a capacitive sensor 1400 is illustrated. In the illustrated embodiment, four integrating capacitances 1410A-D are shared between four sensing channels, where each of the sensing channels corresponds to one of the measurable capacitances 1412A-D. Specifically, each measurable capacitance 1412A-D is measured using two of the integrating capacitances 1410A-D. For example, measurable capacitance 1412B is measured using the two integrating capacitances 1410A and 1410B, and measurable capacitance 1412C is measured using the two integrating capacitances 1410B and 1410C. To measure measurable capacitances 1412B and 1412D, the I/O 1404A can be driven to $V_{DD}$, and the I/O 1404C can be driven to ground. Charge from the measurable capacitance 1412B is shared with integrating capacitors 1420A and 1410B, and the charge on those capacitors is measured using I/O 1404B. Likewise, charge from the measurable capacitance 1412D is shared with integrating capacitors 1410C and 1410D and the charge on those capacitors is measured using I/O 1404D.

Then, to measure measurable capacitances 1412A and 1412C, the I/O 1404D can be driven to $V_{DD}$, and the I/O 1404B can be driven to ground. Charge from the measurable capacitance 1412A is shared with integrating capacitors 1410A and 1410D, and the charge on those capacitors is measured using I/O 1404A. Likewise, charge from the measurable capacitance 1412C is shared with integrating capacitors 1410B and 1410C and the charge on those capacitors is measured using I/O 1404C.

Furthermore, this arrangement provides shared voltage conditioning. Specifically, since adjacent channels are driven to $V_{DD}$ and ground respectively, and since the integrating capacitances 1410 and impedances 1405 are substantially equal, the measuring I/Os are naturally driven to a reference voltage of ½ $V_{DD}$. As the threshold voltage of the measuring I/Os are ratiometric to $V_{DD}$, changes in threshold voltage are compensated for by changes in the reference voltage ½ $V_{DD}$ provided to the measuring node.

For example, when measuring measurable capacitance 1412B, the I/O 1404A is driven to $V_{DD}$ and the I/O 1404C is driven to ground. This causes a conditioned voltage varying with ½ $V_{DD}$ to be driven onto node 1413B much like the integrating capacitance 310A and 310B in FIG. 3. Thus, measurements of voltage taken at I/O 1404B will be with reference to ½V$_{DD}$. Since the threshold (e.g. CMOS) voltage of I/O 1404B is also proportional to ½ V$_{DD}$ in some implementations, changes in the threshold voltage can be compensated for by the reference voltage such that measurements of charge on the integrating capacitors are consistent.

Figure 15:
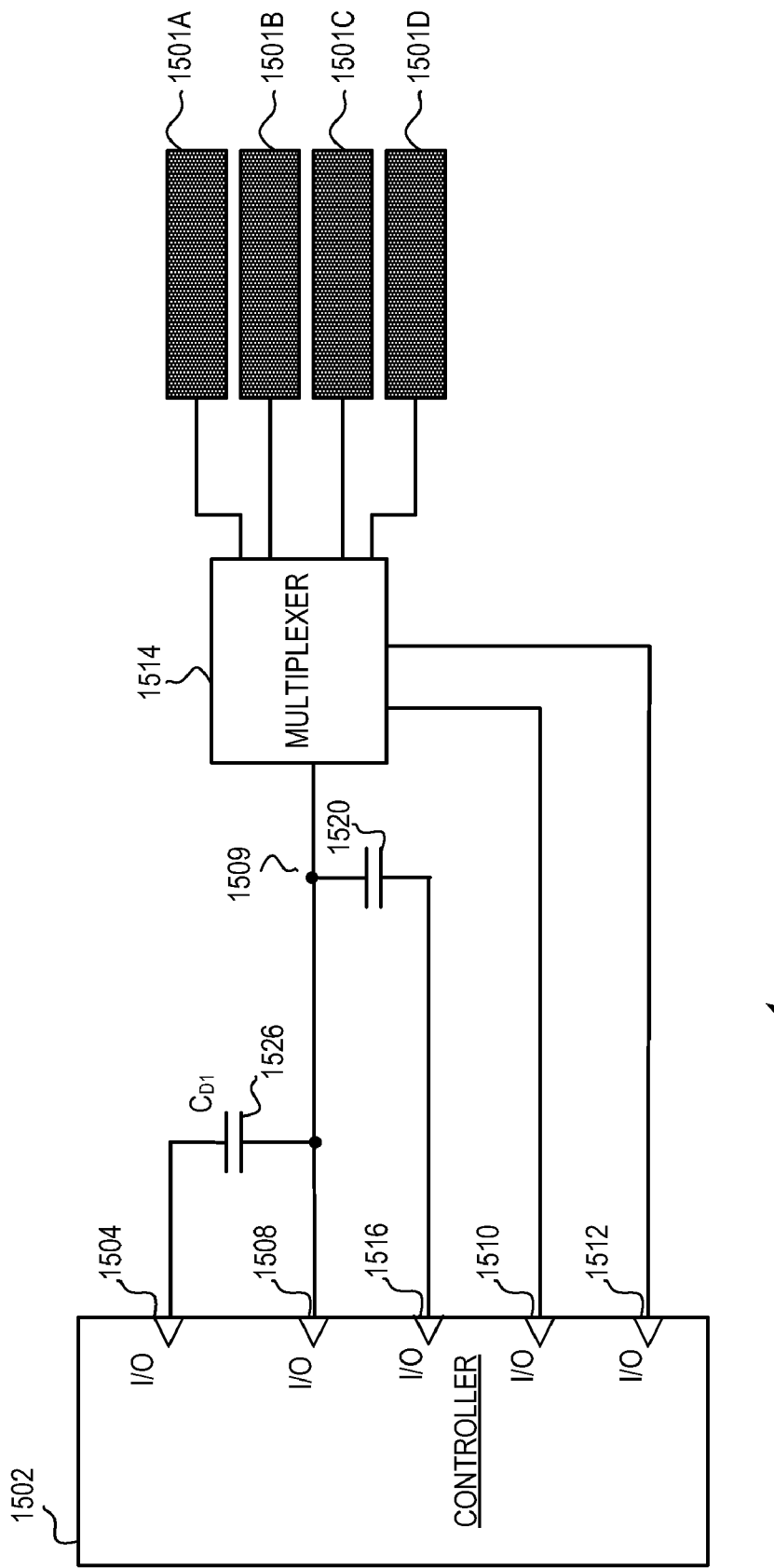
FIG. 15 is a schematic view of a capacitive sensor using sigma delta capacitive detection and sharing multiplexer in accordance with an embodiment of the invention.

Turning now to FIG. 15, another embodiment of a capacitive sensor 1500 is illustrated. In capacitive sensor 1500 a multiplexer 1514 is shared, and allows an integrating capacitor 1520 and charge changing circuit comprising capacitor 1526 and I/O 1504 to be shared by multiple measurable capacitances 1501A-D for sigma delta measurement. The multiplexer 1514 is controlled by I/Os 1510 and 1512 to controllably select one of the measurable capacitances 1501A-D. Typically, each of the measurable capacitances 1501A-D would be independently measured in sequence, although they might also be measured differentially or a coded sequence could also be used to make independent measurements. The measurable capacitances 1501A-D not being measured can be coupled to a supply voltage while the other is measured. Measurable capacitances 1501A-D might also be sampled in some changing order or different measurable capacitances 1501A-D might be sampled at different times within a filter window to perform analog filtering by sum, or difference. Note that some multiplexers may require more control circuitry (not shown), and that a variety of states and connections (such as all shorted, all open, and others) may also be used. In this embodiment, I/O 1516 is used in a low impedance state during sharing, and can also be used for measuring the voltage on the integrating capacitor 1520.

Another variation of the embodiments of the invention is the use of dithering to reduce susceptibility to noise. Some sigma-delta based capacitive sensors can be susceptible to repeating noise spikes, commonly referred to as "tones", caused when low frequency signals are applied to controller inputs. These tones can result from the repeating patterns caused by voltage referenced modulation. In some cases these tones can extend beyond noise floor of the sigma-delta modulator that includes the controller I/Os, potentially leading to output errors.

Figure 16:
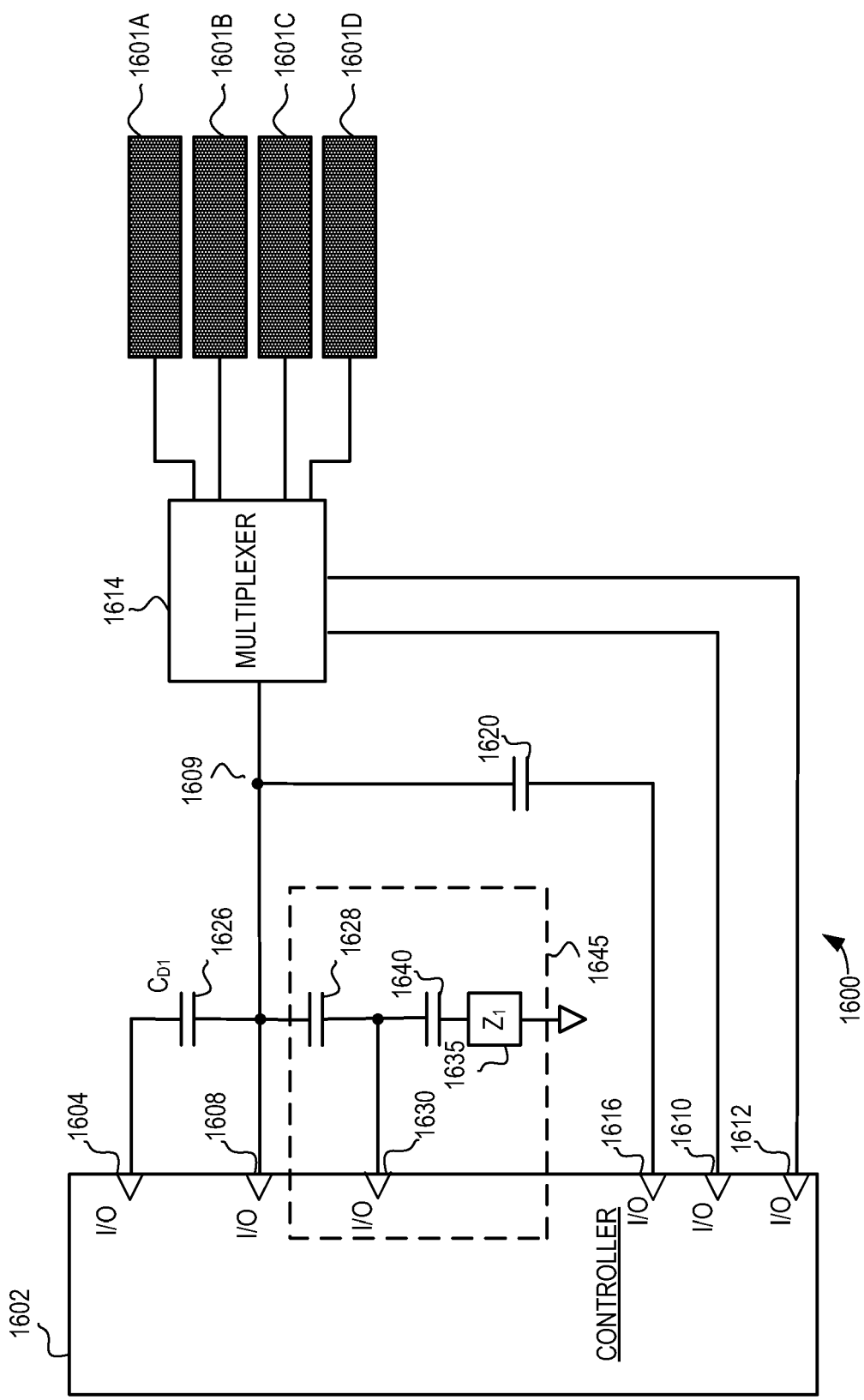
FIG. 16 is a schematic view of a capacitive sensor using sigma delta capacitive detection and sharing a multiplexer and a dithering circuit in accordance with an embodiment of the invention.

One way to reduce the effects of tones is to add dither noise to the reference voltage of susceptible comparator outputs. For example, a single noise source can be applied to and used to reduce tones in multiple comparators. Turning now to FIG. 16, another embodiment of a capacitive sensor 1600 is illustrated. In this variation sensing system of 1600 is modified adding a dithering circuit 1645.

The dithering circuit 1645 includes dithering I/O 1630, capacitors 1628 and 1640, and impedance 1635. The dithering circuit 1645 is used to reduce the effects of low frequency noise called "tones" on the filtered output. Specifically, the dithering circuit 1645 is used to provide a variable offset to the charge on the integrating capacitor 1620. The variable offset changes the charge, effectively moving the reference voltage up and down. The dithering circuit 1645 is preferably operated such that no net amount of charge is added to the integrating capacitor 1620 over a measurement cycle for a selected measurable capacitance. This can be accomplished with a variety of different waveforms, including ramps, pseudo random noise, and the like. During operation, the voltage on the dithering circuit capacitance 1628 may be measured and changed by dithering I/O 1630. In one embodiment, the dithering circuit capacitance 1640 in this embodiment is larger than the delta capacitance 1626, and delta capacitance 1626 is comparable to dithering circuit capacitance 1628. By controllably providing voltage through the dithering I/O 1630 the desired voltage offset waveform is generated and applied to the integrating capacitor 1620 through capacitor 1628. Also, in this embodiment, I/O 1616 is used in a low impedance state during sharing, and can also be for measuring the voltage on the integrating capacitor 1620.

In other embodiments of a dithering circuit 1645 the reference voltage of the integrating capacitance 1620 (e.g., ground, or the output of an I/O 1616 coupled to the integrating capacitance 1620) can be changed during a digital filter window for the measurement of a measurable capacitance 1601A-D. In yet other embodiments the threshold voltage of the I/O (e.g. 1608, 1616) could vary over the digital filter window. Each of these methods and others (including those using DACs, current sources, and other active circuits) allow for "dithering" of the offset from the integrating capacitor to reduce the peak noise in the circuit due to "tones" in the filtered output of the sigma delta capacitance modulator.

Figure 17:
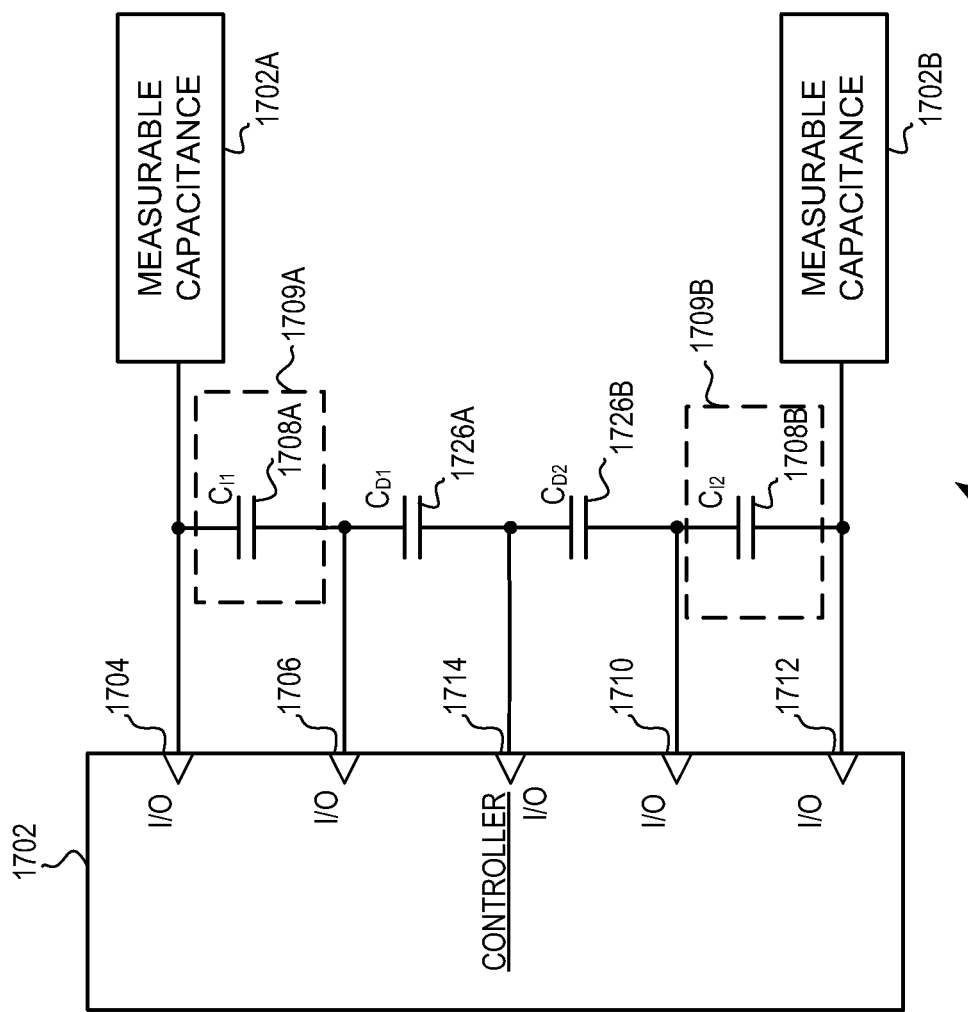
FIG. 17 is a schematic view of a capacitive sensor using sigma delta capacitive detection in accordance with an embodiment of the invention sharing an IO for charge changing.

Turning now to FIG. 17, another embodiment of a capacitive sensor 1700 is illustrated. FIG. 17 shows a switched capacitor implementation of a sigma delta measurement system sharing an I/O within the charge changing circuitry. Specifically, the capacitive sensor 1700 shares the I/O 1714 between two sensing channels two sensing channels (represented by measurable capacitances 1702A-B). The shared I/O 1714 is used to apply voltages to the delta capacitances 1726A-B. In general, this embodiment changes phases to determine whether or not a particular integrating capacitance (e.g., 1708A or 1708B) in the passive network (e.g., 1709A or 1709B) is sensitive to a transition on the corresponding delta capacitance (1726A and 1726B). Specifically, each integrating capacitance can selectively share charge or block charge transfer from the measurable capacitance or the delta capacitance depending upon which side of the integrating capacitance is driven at a low impedance. Thus, the voltage on each delta capacitance (e.g. 1726A-B) can be allowed to transition without affecting the accumulated charge on the respective integrating capacitance (e.g. 1708A-B), and the I/O 1714 can be shared with multiple sensors reducing pin count.

Figure 18B:
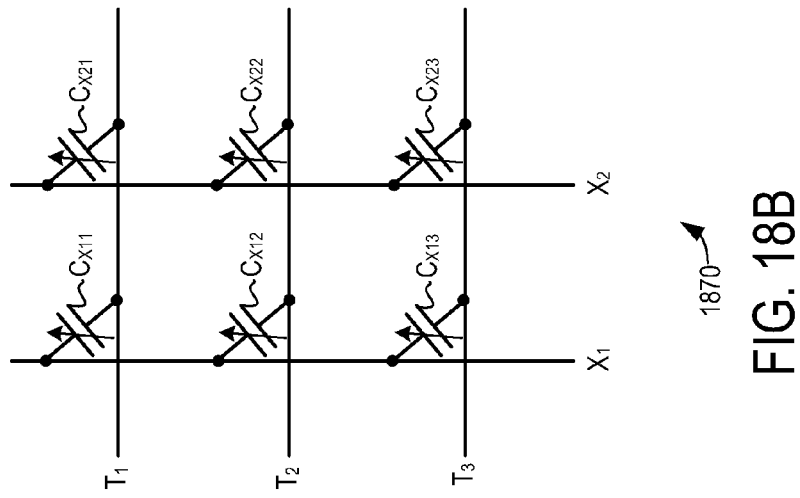
FIGS. 18A-B are schematic views of a capacitive sensor using sigma delta capacitive detection for transcapacitive measurement in accordance with an embodiment of the invention.
Figure 18A:
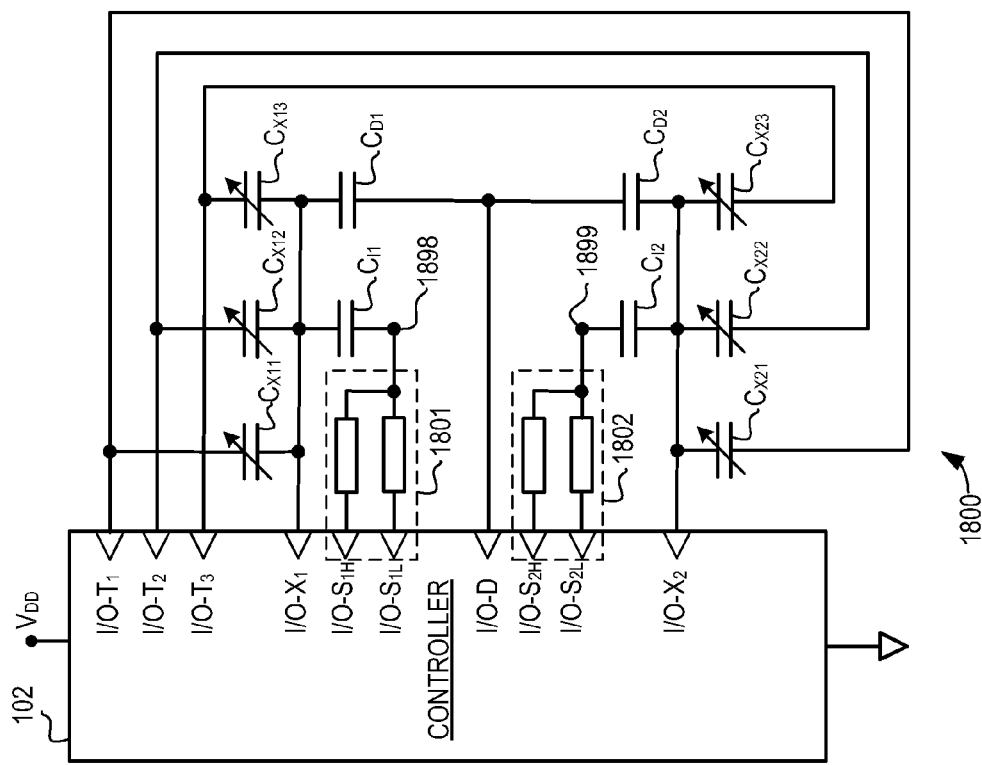

Turning now to FIG. 18, another embodiment of a capacitive sensor is illustrated. Specifically, FIG. 18A illustrates a capacitive sensor 1800 that utilizes sigma-delta measurement techniques implemented in a controller to measure capacitance, and shares components to reduce device complexity and improve performance. Specifically, the capacitive sensor 1800 includes six measurable capacitances ($C_{X11}$, $C_{X12}$, $C_{X13}$, $C_{X21}$, $C_{X22}$, $C_{X23}$) configured as transcapacitances between three shared transmitting I/O's (I/O-T$_1$, I/O-T$_2$, I/O-T$_3$) and two shared receiving I/O's (I/O-X$_1$, I/O-X$_2$) and their respective electrodes. The capacitive sensor 1800 uses two shared integrating capacitors ($C_{I1}$, $C_{I2}$) and two shared delta capacitors ($C_{D1}$, $C_{D2}$). The capacitive sensor 1800 uses two shared biasing circuits 1801 and 1802, each comprising an impedance divider coupled to biasing I/Os (S$_{1H}$, S$_{1L}$, S$_{2H}$, and S$_{2L}$), where the biasing circuits 1801 and 1802 are configured to apply a biasing voltage to nodes 1898 and 1899 respectively. As will be explained in greater detail below, the biasing voltages are used to reduce voltage swings and thus reduce the effects of parasitic capacitances. Finally, the capacitive sensor 1800 shares a delta I/O (I/O-D) among all six measurable capacitances. Thus, the capacitance sensor 1800 shares a variety of I/O's and capacitors among six channels of measurable capacitances.

As stated above, the six measurable capacitances ($C_{X11}$, $C_{X12}$, $C_{X13}$, $C_{X21}$, $C_{X22}$, $C_{X23}$) are configured as transcapacitances between three shared transmitting I/O's (I/O-T$_1$, I/O-T$_2$, I/O-T$_3$) and two shared receiving I/O's (I/O-X$_1$, I/O-X$_2$). FIG. 18B illustrates a physical representation 1870 of how the measurable capacitances would be implemented between the transmitting I/Os and the receiving I/Os. Note that the number of measurable transcapacitances is larger than the combined number of transmitting I/Os and the receiving I/Os. Thus, this technique can reduce the number of I/O's required to measure a given number of capacitances. This advantage grows as larger numbers of transmitting I/Os and receiving I/Os are used. However, this technique can require additional measurement cycles to measure all of the measurable capacitances.

During operation of capacitive sensor 1800, a voltage is repeatedly applied to a selected measurable capacitance using a corresponding I/O, and charge is repeatedly shared between the selected measurable capacitance and its corresponding integrating capacitance to accumulate charge on the integrating capacitance. Furthermore, the charge on the corresponding integrating capacitance is repeatedly changed by a quantized amount of charge using its corresponding delta capacitance, with this charge changing responsive to the charge on the integrating capacitance being past a threshold level. The results of the charge threshold detection are a series of quantized measurements of the charge on the integrating capacitance, which can be filtered to yield a measure of the selected measurable capacitance.

FIG. 18C includes a state diagram 1875 that illustrates a exemplary state sequence for capacitive sensor 1800. Referring to FIGS. 18A, 18B, and 18C, the state sequence 1875 provides measurements of capacitances $C_{X11}$ and $C_{X21}$ using transmitting I/O $T_1$ and receiving I/Os $X_1$ and $X_2$. Typically, the state sequence 1875 would be repeated multiple times for an accurate measurement of capacitances $C_{X11}$ and $C_{X21}$, and then a similar procedure would be repeated using transmitting I/O $T_2$ to measure capacitances $C_{X12}$ and $C_{X22}$, and then similarly repeated using transmitting I/O $T_3$ to measure capacitances $C_{X13}$ and $C_{X23}$. In other embodiments the capacitances coupled to multiple transmitting I/Os could be measured concurrently using differential measurements or coded modulation/demodulation of the transmitters.

The first state 1 comprises an intermediate high impedance state. In this state, the biasing I/Os $S_{1H}$, $S_{1L}$, $S_{2H}$, and $S_{2L}$, and the receiving I/Os $X_1$ and $X_2$ are all held in a high impedance state, with the delta I/O driven high and the transmitting I/Os $T_1$, $T_2$, and $T_3$ driven low. This results in an intermediate state that decouples the various capacitors to temporarily trap charge in those capacitors, and assures that there are no overlapping signals that could otherwise inadvertently set an unwanted charge on a capacitor.

In the second state 2, the voltage on the integrating capacitors $C_{I1}$ and $C_{I2}$ are set to a generated bias voltage $V_G$ implemented to substantially equal the threshold voltage $V_{TH}$ of the measuring I/Os. Specifically, I/Os $S_{1H}$ and $S_{2H}$ provide logic high voltages (e.g. $V_{DD}$), I/Os $S_{1L}$ and $S_{2L}$ provide logic low voltages (e.g. GND), and resistances in biasing circuits 1801 and 1802 provide a voltage divider that generates a voltage $V_G$ at nodes 1898 and 1899. In one example embodiment, the resistances are substantially equal, and the generated voltage is thus approximately ½ $V_{DD}$. This is comparable to a CMOS input threshold voltage, where the input threshold voltage is the voltage that distinguishes a low from a high input. It should be noted that there are many methods for applying the generated voltage using passive components and switches (e.g. I/Os or DACs) and this is only one example. For example, in some embodiments the controller could inherently include the ability to generate an appropriate voltage $V_G$ near $V_{TH}$.

It should also be noted that ½ $V_{DD}$ is just one example generated voltage, and in other embodiments it may be desirable to use other values. For example, in the case where the I/O's utilize a Schmidt trigger input a voltage of ⅓ $V_{DD}$ might approximate the input threshold of an I/O which was just set to a logic high.

As will be explained in greater detail below, driving nodes 1898 and 1899 with generated voltages $V_G$ near the threshold voltage $V_{TH}$ reduces the voltage swing on I/Os $X_1$ and $X_2$ in states 2 and 3. This results in less sharing of parasitic capacitance because the sigma-delta feedback loop controls the charge on the integrating capacitances $C_{I1}$ and $C_{I2}$ to keep the voltage on nodes 1898 and 1899 near the threshold voltage when the receiving I/Os $X_1$ and $X_2$ are driven (in steps 7, 8 and 9). Keeping the voltages at 1898 and 1899 constant makes parasitic capacitance to fixed voltages (e.g. GND) largely irrelevant since charge moving through the parasitic capacitance is minimized In the third state 3, charge is shared through the measurable capacitances $C_{X11}$ and $C_{X21}$ and their respective integrating capacitances $C_{I1}$ and $C_{I2}$. This is accomplished as the transmitting I/O $T_1$ transitions from a logic low voltage to a logic high voltage. This adds charge to the integrating capacitances $C_{I1}$ and $C_{I2}$ through $C_{X11}$ and $C_{X21}$ while nodes 1898 and 1899 are driven to a low impedance.

In the fourth and fifth states, a controlled amount of delta charge is similarly transferred to the integrating capacitances $C_{I1}$ and $C_{I2}$ through delta capacitances $C_{D1}$ and $C_{D2}$. The amount of charge transferred depends on previous measurements (outputs of the quantizer) of the voltage on the integrating capacitances measured at nodes 1898 and 1899. If charge is to be shared (either from the measurable capacitance or for charge changing from the delta capacitance) onto the integrating capacitances nodes 1898 and 1899 are driven to a low impedance (e.g. by driving I/O-S1H and I/O-S2H high while I/O-S1L and I/O-S2L are driven low to provide a voltage near a threshold for the quantizer). If no charge is to be driven (e.g. when no charge changing is desired), then one or more of the nodes 1898 and 1899 are allowed to float. Specifically, state 4 is an intermediate state where the biasing I/Os ($S_{1H}$, $S_{1L}$, $S_{2H}$, and $S_{2L}$) are driven as functions of previously measured voltages on the integrating capacitances. Then, during the transition of the delta I/O in state 5, charge is changed (e.g. removed, or not removed) from the integrating capacitance depending on the previously set states of the associated biasing I/Os (which are in turn dependent on the previous quantizations of charge on the associated integrating capacitances). In order to use the same delta I/O, the sharing of charge through the delta capacitors is allowed or not allowed by driving the nodes 1898 and 1899 during the transition of voltage on the delta I/O-D.

As one example, the functions are selected such that if the voltage quantized on one or more of the integrating capacitances (e.g., at node 1898 or 1899) was higher than the threshold voltage $V_{TH}$ for the previous repetition of the measurement cycle (i.e., the charge on the integrating capacitance is low), then based on that output the biasing I/Os float their respective nodes 1898 and 1899, and no charge is removed on the transition of the delta I/O. If instead, the voltage quantized (measured relative to a threshold) on an integrating capacitance (e.g., at node 1898 or 1899) was lower than the threshold voltage $V_{TH}$ (i.e., the charge on the integrating capacitance is high), the biasing I/Os provide a low impedance to their respective node 1898 or 1899 based on this output. This allows charge to be removed from the integrating capacitor through its respective delta capacitor during the transition of the delta I/O. An example of such a set of functions is given in equation 1:

$$F_{1H}(V_{CI1})=V_{DD} \text{ and } F_{1L}(V_{CI1})=0 \text{ when } V_{CI1}<V_{TH}$$

$$F_{1H}(V_{CI1})=Z \text{ and } F_{1L}(V_{CI1})=Z \text{ when } V_{CI1}>V_{TH}$$

$$F_{2H}(V_{CI2})=V_{DD} \text{ and } F_{2L}(V_{CI2})=0 \text{ when } V_{CI2}<V_{TH}$$

$$F_{2H}(V_{CI2})=Z \text{ and } F_{2L}(V_{CI2})=Z \text{ when } V_{CI2}>V_{TH} \quad \text{Equation 1}$$

Thus, states 4 and 5 selectively remove charge from integrating capacitances $C_{I1}$ and $C_{I2}$ using their respective delta capacitances $C_{D1}$ and $C_{D2}$ based on functions of the previous voltage measurement(s) (e.g. quantized outputs) at the integrating capacitances.

The sixth state 6 comprises another intermediate high impedance state that assures that there are no overlapping signals that could otherwise inadvertently set an unwanted charge on a capacitor. The seventh state 7 sets the receiving I/O's $X_1$ and $X_2$ to a logic high voltage to prevent charge sharing to the integrating capacitors. The eighth state 8 sets the charges on the measurable capacitances and the delta capacitances ($C_{D1}$ and $C_{D2}$) in preparation for transitions on a following repetition of the charge transfer process. Specifically, a logic high voltage is put on I/O D while a logic high voltage is also put on I/Os $X_1$ and $X_2$, discharging delta capacitances $C_{D1}$ and $C_{D2}$. At the same time a logic low voltage is placed on transmitting I/O $T_1$, recharging the measurable capacitance. By putting a low impedance voltage on receiving I/Os $X_1$ and $X_2$, and high impedance on the biasing I/Os $S_{1H}$, $S_{1L}$, $S_{2H}$, and $S_{2L}$, charge will not be transferred onto the integrating capacitances during this step through either the delta capacitor or the measurable capacitances. This assures that the value of the integrating capacitance remains an accurate representation of the transferred (shared) charge accumulated during previous steps, and that it can be measured without being disturbed by noise from sensing electrode.

The next state 9 measures the voltage at the integrating capacitances $W_{CI1}$ and $V_{CI2}$. With the biasing I/Os at a high impedance state, the voltage (due to the integrated charge) on the integrating capacitances (e.g., the voltage at node 1898 and 1899) can be measured at any of their respective biasing I/Os. This quantized measurement can comprise a comparison of the voltage at the integrating capacitance with the threshold voltage $V_{TH}$ of the biasing I/O to provide a quantized output (or result). The resulting quantized measurement of the voltage on integrating capacitances (i.e. whether they are higher than threshold voltage $V_{TH}$) may then be used in functions $F(V_{CI1})$ and $F(V_{CI2})$ in the next cycle to determine how the charge on integrating capacitance might be changed by the associated delta capacitances.

Thus, the repeated execution of states 1-9 will result in sigma-delta closed loop control of charge on the integrating capacitance, and a filtered measurement of the quantized results can be used to measure the transcapacitances $C_{X11}$ and $C_{X21}$. Then, the process can be repeated multiple times for an accurate measurement of capacitances $C_{X12}$ and $C_{X22}$ using transmitting I/O $T_2$ as transmitting I/O T1 was used in the illustrated states 1-9. Then the processes can be similarly repeated using transmitting I/O $T_3$ to measure capacitances $C_{X13}$ and $C_{X23}$. The resulting measured transcapacitances can further be used to sense the proximity of an object relative to the sensor.

The use of the capacitive sensor 1800 to measure transcapacitance rather than absolute or ground referenced capacitance can provide significant advantages. Specifically, it can reduce the negative effects of background or parasitic capacitance on the measured capacitance (even without using a controlled guard waveform) and thus are particularly usefully in applications where there is a higher proportion of parasitic trace capacitance, such as fingerprint ridge sensing and capacitive touch sensing.

For example, when driving a generated voltage $V_G$ on nodes 1898 and 1899 roughly equivalent to an input threshold voltage of biasing I/O's, the amount of voltage swing on the sensed electrode can be held to a relatively low level by sigma-delta feedback control. This can substantially reduce sensitivity to parasitic capacitance. That is, since the voltages on integrating capacitances remain relatively close to the threshold voltage during steady-state operation, the voltage swing is kept relatively low, thus reducing the effects of parasitic capacitance on the measurement of the measurable capacitance. Furthermore, this is done in a manner that improves efficiency by sharing integrating and delta capacitors, as well as the various I/Os.

Other variations of capacitive sensor 1800 embodiment can be implemented. For example, in some embodiments the transmitting I/Os can be implemented to transmit with different voltages concurrently to facilitate differential measurements. In other embodiments the controller can be configured to selectively sample and integrate on the integrating capacitors, thus not sampling and integrating on every cycle. Furthermore, in the illustrated embodiment, charge is only moved through each delta capacitor $C_{D1}$ and $C_{D2}$ in one direction, but in other embodiments it could be implemented to apply an opposing charge through the delta capacitors.

Thus, the embodiments of the invention provide methods, systems and devices for detecting a measurable capacitance using charge transfer techniques that can be implemented with many standard microcontrollers, and can share components to reduce device complexity and improve performance.

Various other modifications and enhancements may be performed on the structures and techniques set forth herein without departing from their basic teachings. Accordingly, there are provided numerous systems, devices and processes for detecting and/or quantifying a measurable capacitance. While at least one exemplary embodiment has been presented in the foregoing detailed description, it should be appreciated that a vast number of variations exist. The various steps of the techniques described herein, for example, may be practiced in any temporal order, and are not limited to the order presented and/or claimed herein. It should also be appreciated that the exemplary embodiments described herein are only examples, and are not intended to limit the scope, applicability, or configuration of the invention in any way. Various changes can therefore be made in the function and arrangement of elements without departing from the scope of the invention as set forth in the appended claims and the legal equivalents thereof.

What is claimed is:

1. A system for measuring each of a plurality of measurable capacitances, the system comprising:
  a passive network, the passive network comprising at least one integrating capacitance and an isolating impedance statically coupled to the plurality of measurable capacitances, the at least one integrating capacitance configured to accumulate charge received from the plurality of measurable capacitances through the isolating impedance; and
  a controller, the controller including a plurality of digital outputs, each of the plurality of digital outputs coupled to a measurable capacitance in the plurality of measurable capacitances, the controller configured to measure each of the plurality of measurable capacitances by performing, for each selected measurable capacitance in the plurality of measurable capacitances, a charge transfer process for a number of times equal to at least two and a measuring process for a second number of times equal to at least one, wherein the charge transfer process comprises applying a pre-determined voltage to the selected measurable capacitance in the plurality of measurable capacitance with at least one of the plurality of digital outputs and then allowing the selected measurable capacitance to share charge with the passive network such that charge from multiple charge transfer processes accumulates on the at least one integrating capacitance of the passive network, and wherein the measuring process comprises quantizing a representation of a charge on the passive network to measure the selected measurable capacitance.

2. The system of claim 1 wherein the at least one integrating capacitance includes two integrating capacitances, and wherein the two integrating capacitances are coupled to a power supply voltage and provide a conditioned voltage.

3. The system of claim 1 further comprising a charge changing circuit coupled to the at least one integrating capacitance in the passive network.

4. The system of claim 1 wherein each of the plurality of measurable capacitances comprises a capacitance measured between a sensor electrode and a proximate external object.

5. The system of claim 1 wherein each of the plurality of measurable capacitances comprises a transcapacitance measured between sensor electrodes.

6. The system of claim 1 wherein the controller is further configured to reset the charge on the at least one integrating capacitance before the performing of the first charge transfer process.

7. A system for measuring each of a plurality of measurable capacitances, the system comprising:
  at least one passive network, each passive network in the at least one passive network including at least one integrating capacitance and at least one isolating impedance, each of the at least one integrating capacitance and the at least one isolating impedance statically coupled to at least one of the plurality of measurable capacitances, the at least one integrating capacitance configured to accumulate charge received from the at least one of the plurality of measurable capacitances through the at least one isolating impedance;
  a controller, the controller including a plurality of digital outputs, each of the plurality of digital outputs coupled to a measurable capacitance in the plurality of measurable capacitances, the controller configured to measure each of the plurality of measurable capacitances by performing, for each selected measurable capacitance in the plurality of measurable capacitances, a charge transfer process for a number of times equal to at least two and a measuring process for a second number of times equal to at least one, wherein the charge transfer process comprises applying a pre-determined voltage to the selected measurable capacitance in the plurality of measurable capacitances with at least one of the plurality of digital outputs and then allowing the selected measurable capacitance to share charge with the at least one passive network such that charge from multiple charge transfer processes accumulates on the at least one integrating capacitance of the at least one passive network; and wherein the measuring process comprises quantizing relative to a threshold voltage a representation of a charge on the at least one passive network to measure the selected measurable capacitance;
  a voltage conditioning circuit coupled to the at least one passive network, the voltage conditioning circuit adapted to provide a variable reference voltage that varies with the threshold voltage.

8. The system of claim 7 wherein the threshold voltage is a threshold voltage of a digital input of the controller.

9. The system of claim 7 further comprising a charge changing circuit coupled to the at least one integrating capacitance in a passive network of the at least one passive network.

10. The system of claim 7 wherein each of the plurality of measurable capacitances comprises a capacitance measured between a sensor electrode and a proximate external object.

11. The system of claim 7 wherein each of the plurality of measurable capacitances comprises a transcapacitance measured between sensor electrodes.

12. The system of claim 7 wherein the voltage conditioning circuit includes a voltage divider having a first divider impedance and a second divider impedance, the first divider impedance and the second divider impedance coupled at a divider node, and wherein the voltage conditioning circuit is configured to couple a power supply voltage to the at least one passive network through the voltage divider node.

13. The system of claim 12 wherein the first divider impedance comprises a first divider capacitance and wherein the second divider impedance comprises a second divider capacitance.

14. The system of claim 13 further comprising a resistance coupled to the power supply voltage and the divider node in parallel with the first divider capacitance.

15. The system of claim 12 wherein the first divider impedance comprises a first divider resistance and wherein the second divider impedance comprises a second divider resistance.

16. A system for measuring each of a plurality of measurable capacitances, the system comprising:
  at least one passive network, each passive network in the at least one passive network including at least one integrating capacitance and at least one isolating impedance, each of the at least one integrating capacitance and the at least one isolating impedance statically coupled to at least one of the plurality of measurable capacitances, the at least one integrating capacitance configured to accumulate charge received from the at least one of the plurality of measurable capacitances through the at least one isolating impedance;
  a guarding electrode, the guarding electrode proximate each of the plurality of measurable capacitances; and
  a controller, the controller including a plurality of digital outputs, each of the plurality of digital outputs coupled to a measurable capacitance in the plurality of measurable capacitances, the controller configured to measure each selected measurable capacitance in the measurable capacitances by performing, for each of the measurable capacitances, a charge transfer process for a number of times equal to at least two and a measuring process for a second number of times equal to at least one, wherein the charge transfer process comprises applying a pre-determined voltage to the selected measurable capacitance in the plurality of measurable capacitances with at least one of the plurality of digital outputs and then allowing the selected measurable capacitance to share charge with the at least one passive network such that charge from multiple charge transfer processes accumulates on the at least one integrating capacitance of the at least one passive network; and wherein the measuring process comprises quantizing a representation of a charge on the at least one integrating capacitance of the at least one passive network, the controller further configured to provide a guard signal to the guarding electrode using an output to guard the plurality of measurable capacitances during at least a portion of time in which the predetermined voltage is applied to the selected measurable capacitance and during at least a portion of the time in which the selected measurable capacitance shares charge with the at least one passive network.

17. The system of claim 16 further comprising a charge changing circuit coupled to the at least one integrating capacitance in a passive network of the at least one passive network.

18. The system of claim 16 wherein each of the plurality of measurable capacitances comprises a capacitance measured between a sensor electrode and a proximate external object.

19. The system of claim 16 wherein each of the plurality of measurable capacitances comprises a transcapacitance measured between sensor electrodes.

20. The system of claim 16 wherein the guarding electrode is coupled to the output through a guarding network, and wherein the guarding network comprises a voltage divider.

21. The system of claim 16 wherein the controller is further configured to apply the guard signal by switching the output between a first reference voltage and a second reference voltage.

22. The system of claim 16 wherein the controller is further configured to apply the guard signal by switching the output between a first reference voltage and an open circuit condition.

23. The system of claim 16 wherein the guarding electrode is coupled to the output through a guarding network, and wherein the guarding network comprises a voltage divider.

24. The system of claim 16 further comprising a guarding network coupling the guarding electrode and the output, wherein the guarding network comprises a first guard capacitance and a second guard capacitance substantially greater than the first guard capacitance, wherein the controller is further configured to apply the guard signal by switching the output between a first reference voltage and an open circuit condition and accumulating charge on the second guard capacitance.

25. The system of claim 16 wherein the output to guard the plurality of measurable capacitances comprises an output of the controller.

* * * * *